United States Patent [19]

Kitahara et al.

[11] Patent Number: 5,760,333
[45] Date of Patent: Jun. 2, 1998

[54] HEAT-GENERATING ELEMENT COOLING DEVICE

[75] Inventors: Takashi Kitahara; Tadayoshi Shimanuki, both of Ishikawa, Japan

[73] Assignee: PFU Limited, Ishikawa, Japan

[21] Appl. No.: 685,637

[22] Filed: Jul. 24, 1996

Related U.S. Application Data

[62] Division of Ser. No. 211,241, Mar. 29, 1994, Pat. No. 5,583,316.

[30] Foreign Application Priority Data

Aug. 6, 1992 [JP] Japan ................... 4-55411
Dec. 24, 1992 [JP] Japan ................... 4-80739
Feb. 19, 1993 [JP] Japan ................... 5-30059
Feb. 19, 1993 [JP] Japan ................... 5-30060

[51] Int. Cl.$^6$ ................... H05K 7/20
[52] U.S. Cl. ................... 174/16.3; 174/252; 165/80.3; 361/703; 361/709; 361/719
[58] Field of Search ................... 174/16.3, 252; 361/703, 709, 719, 720; 165/80.3, 185

[56] References Cited

U.S. PATENT DOCUMENTS 4,996,585  2/1991  Gruber et al. ................... 357/74
5,019,880  5/1991  Higgins, III ................... 361/383
5,077,601  12/1991  Hatada et al. ................... 174/15.1

FOREIGN PATENT DOCUMENTS

WO89/00751  1/1989  WIPO.

OTHER PUBLICATIONS

Research Disclosure, No. 330, Oct., 1991, Emsworth, GB, p. 813, "An Enhancement of Heat Sink Using Air Collector and Duct".

IBM Technical Disclosure Bulletin, vol. 21, No. 11, Apr., 1979, New York, pp. 4485–4486, U.P. Hwang et al, "Air-Cooling Modular Package".

*Primary Examiner*—Bot L. Ledynh
*Assistant Examiner*—Marc D. Machtinger
*Attorney, Agent, or Firm*—Nikaido, Marmelstein, Murray & Oram LLP

[57] ABSTRACT

A cooling device mounting a fan unit above a heat sink mounted on a heat-generating element or buried therein, which produces an effective air flow and achieves a uniform cooling action by having the heat sink shown in various shapes. Further, a cooling fan disposed away from the heat sink or to the side of the same is used for effective cooling through an air conduit passage formed by pipes or a cover.

2 Claims, 70 Drawing Sheets

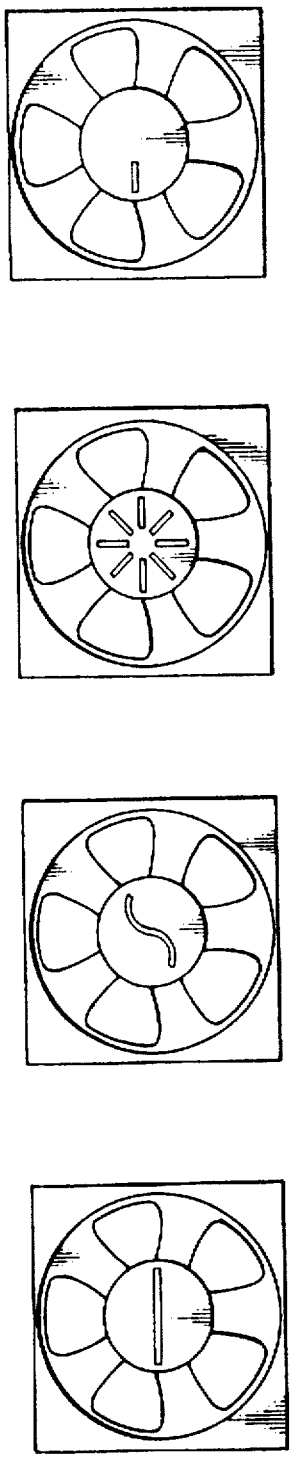
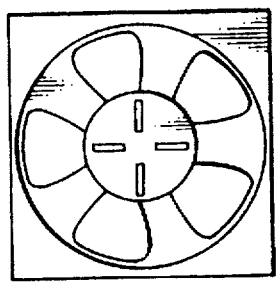
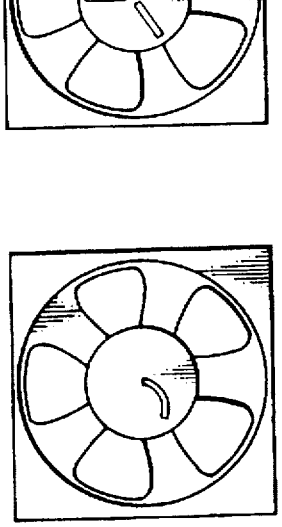

Fig. 33A
Fig. 33
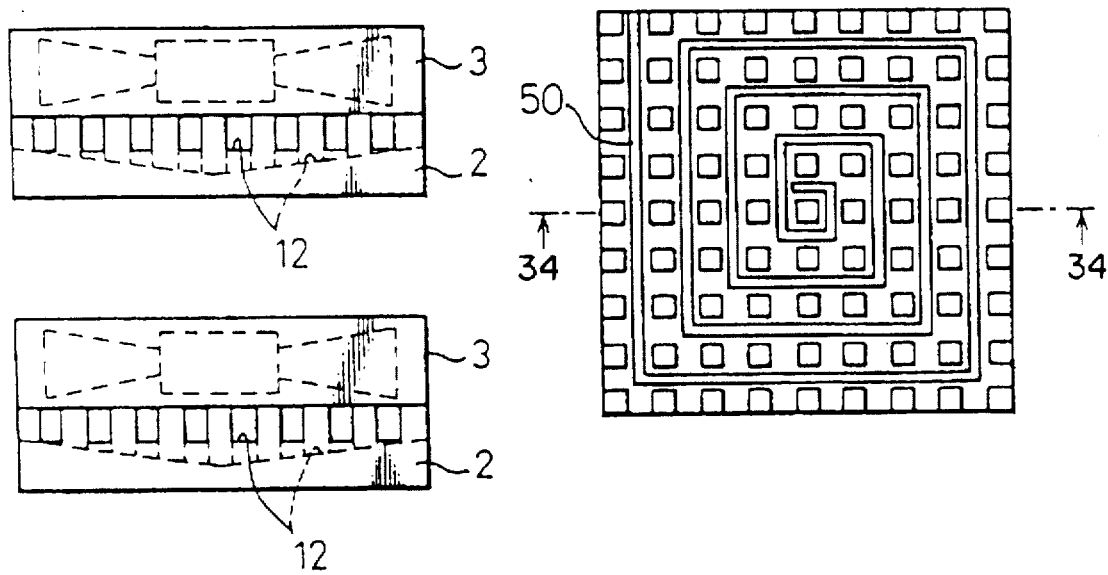
Fig. 33B
Fig. 34
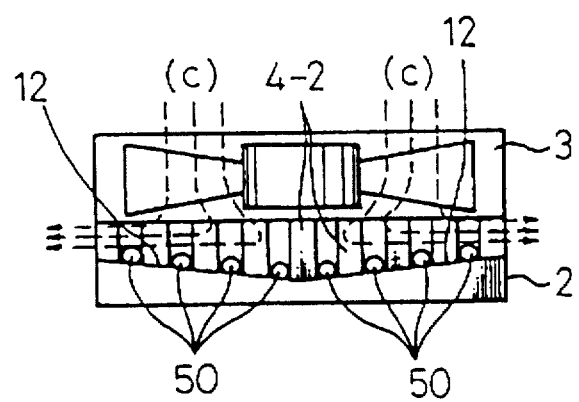

Fig. 35A
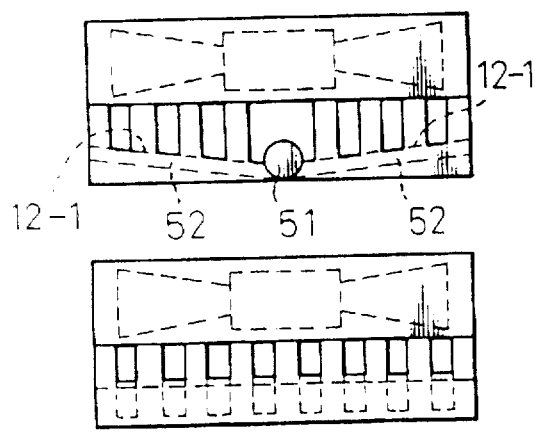
Fig. 35B
Fig. 35
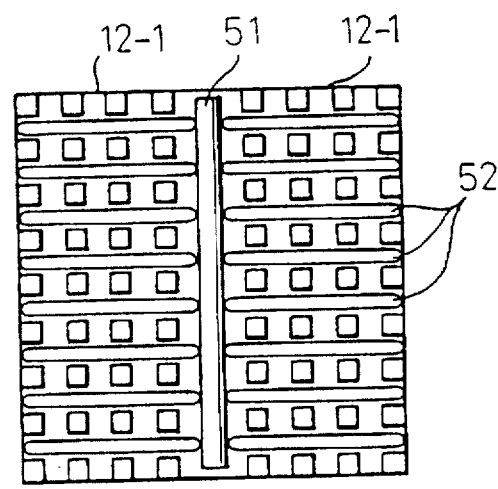

Fig. 51 PRIOR ART
Fig. 51A PRIOR ART
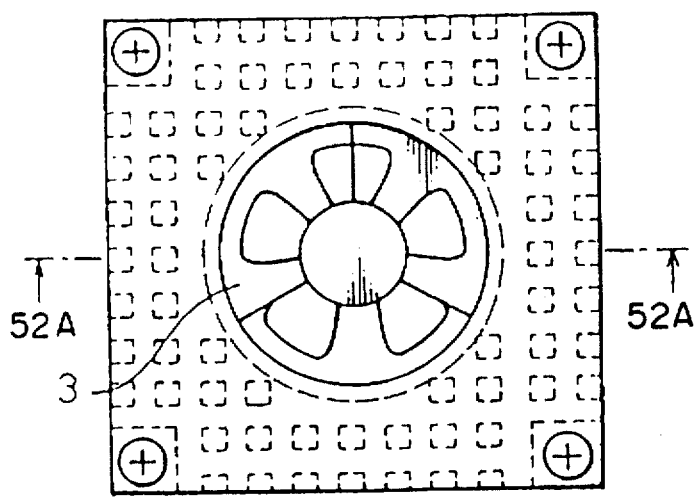
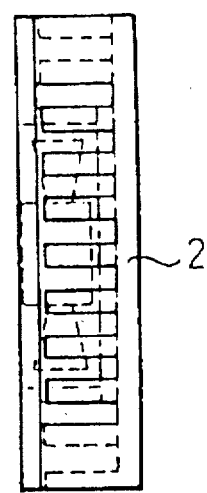
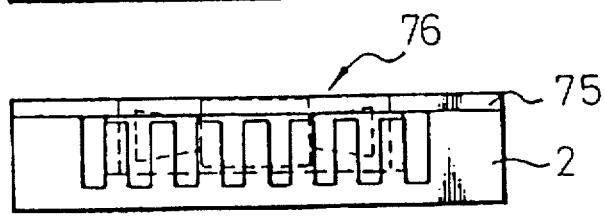
Fig. 51B PRIOR ART

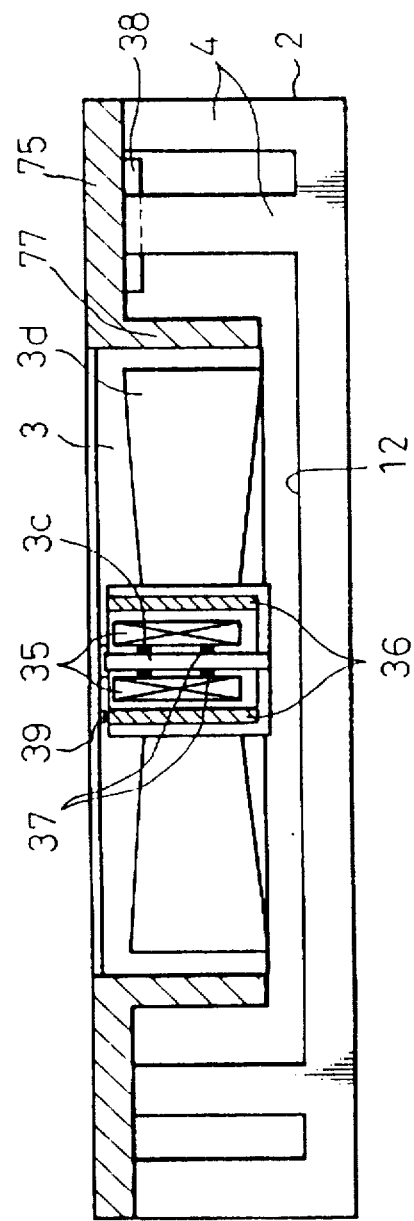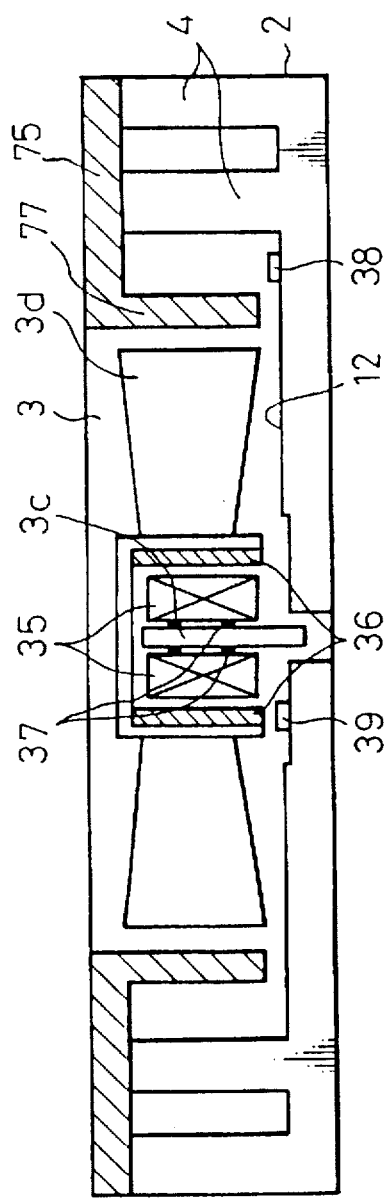

Fig. 55
Fig. 55A
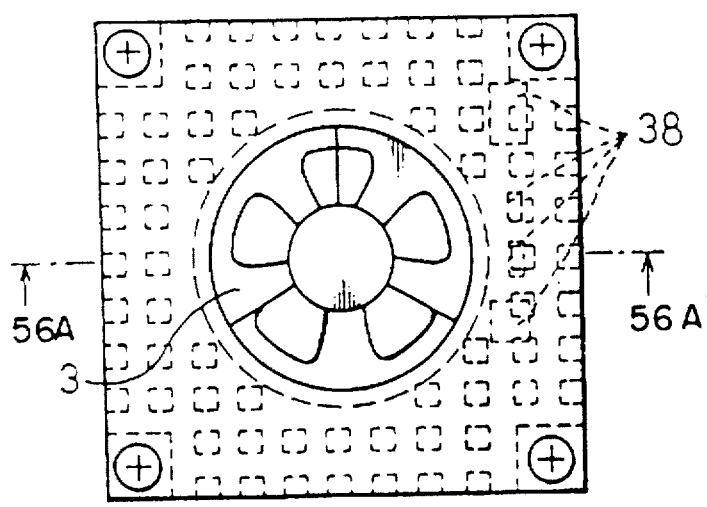
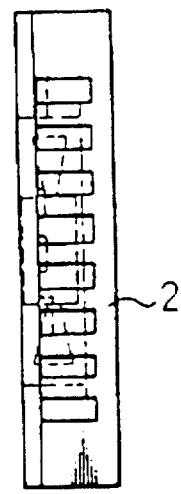
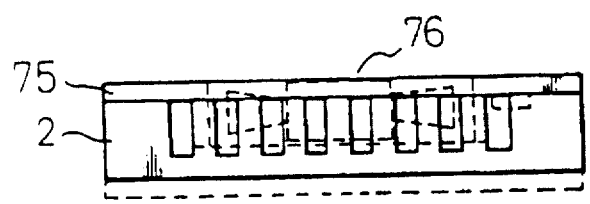
Fig. 55B

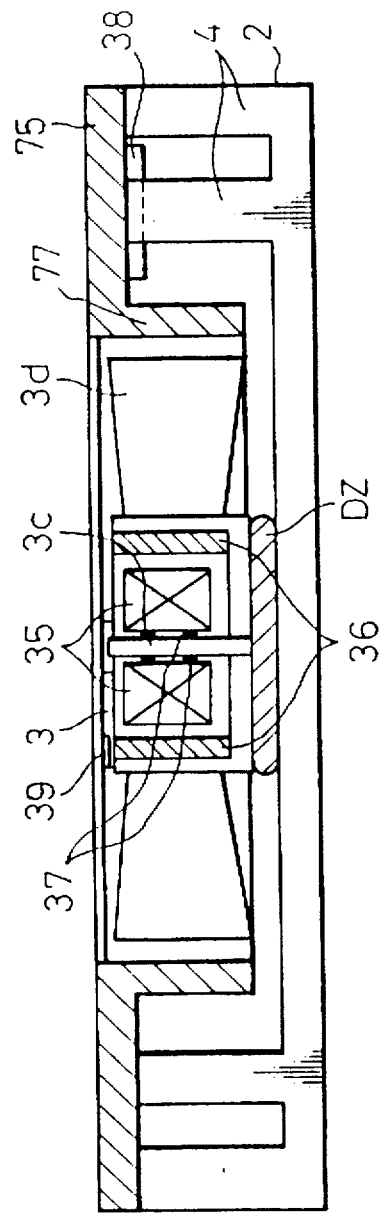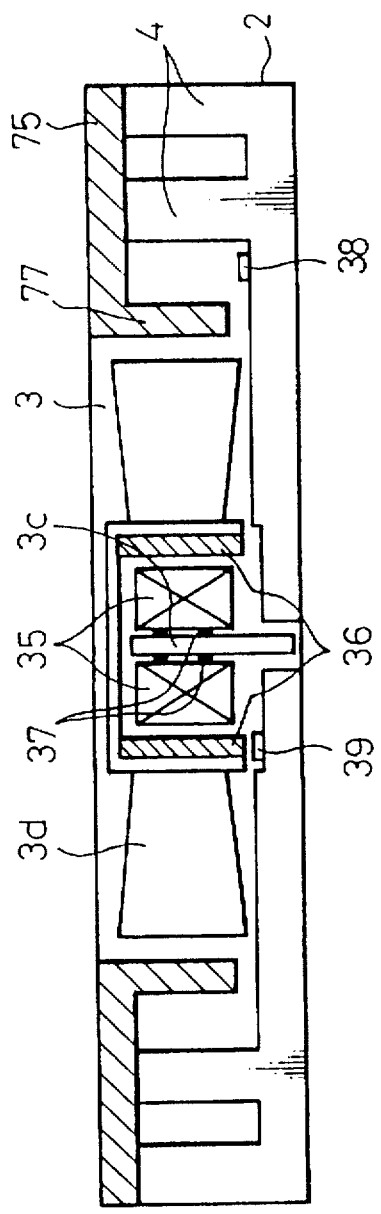

Fig. 57(A) PRIOR ART
Fig. 57(B) PRIOR ART
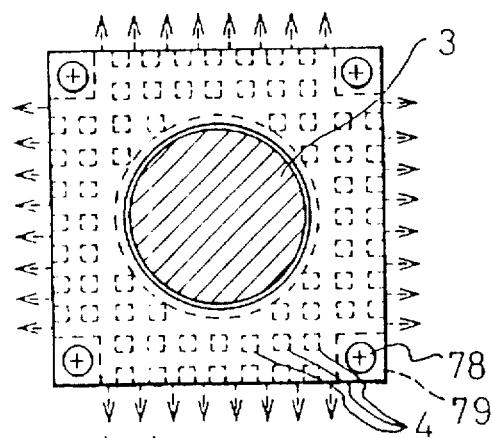
Fig. 57(A)-1 PRIOR ART
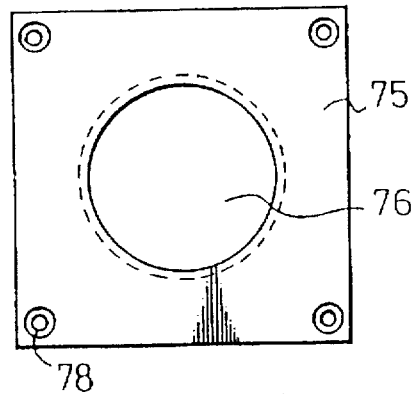
Fig. 57(B)-1 PRIOR ART
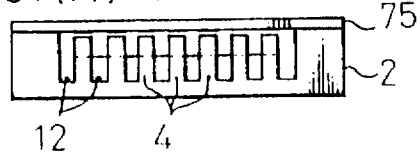
Fig. 58(A) PRIOR ART
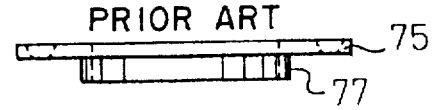
Fig. 58(B) PRIOR ART
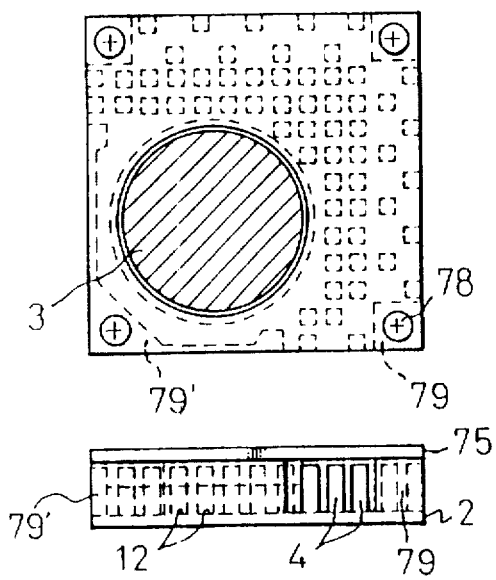
Fig. 58(A)-1 PRIOR ART
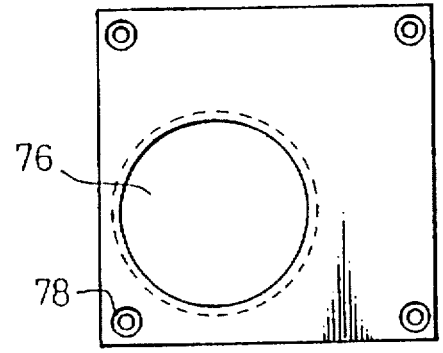
Fig. 58(B)-1 PRIOR ART

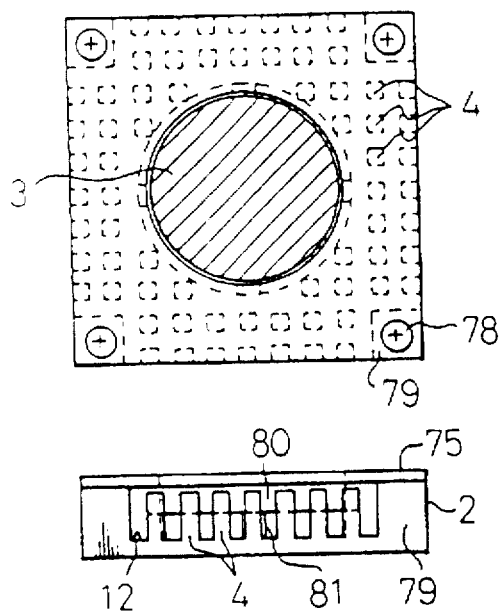
Fig. 59(A)
Fig. 59(A)-1
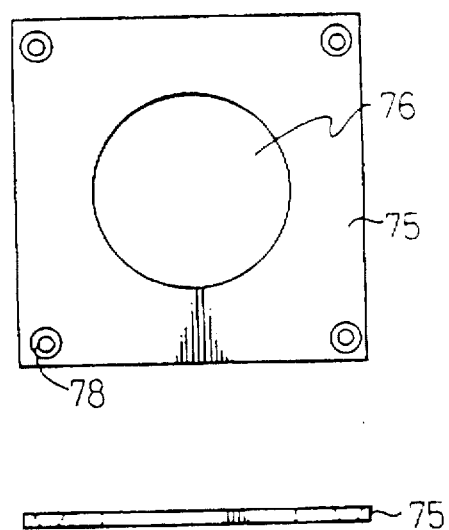
Fig. 59(B)
Fig. 59(B)-1
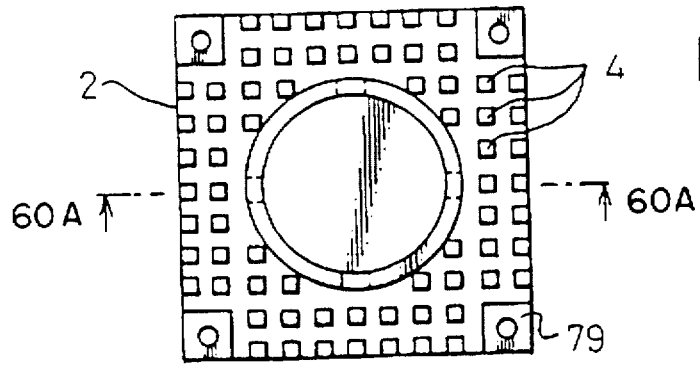
Fig. 60
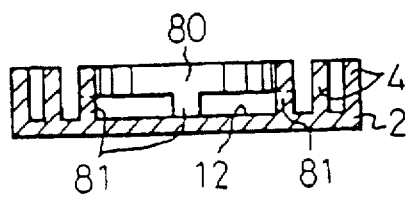
Fig. 60A Fig. 67
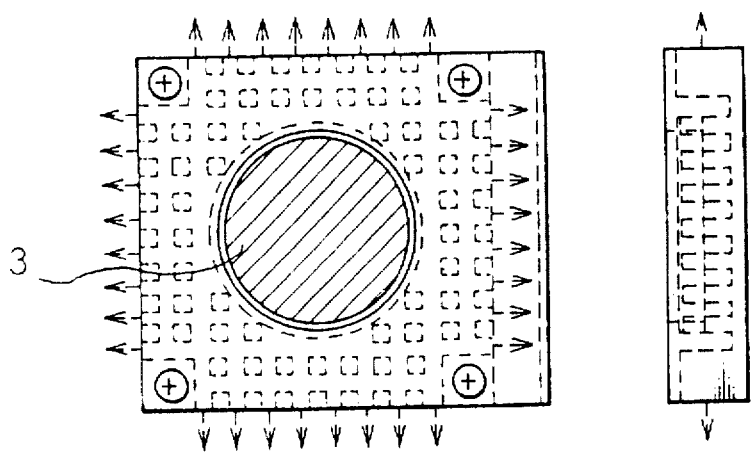
Fig. 67A
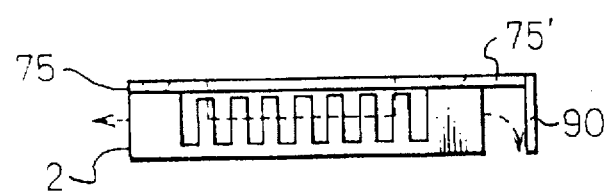
Fig. 67B

HEAT-GENERATING ELEMENT COOLING DEVICE

This is a division of application Ser. No. 08/211,241, filed Mar. 29, 1994, U.S. Pat. No. 5,583,316.

TECHNICAL FIELD

The present invention relates to a cooling device for cooling a heat-generating element or a heat-generating unit, that is, a heat sink system, more particularly relates to a heat-generating element cooling device for cooling a heat-generating element or heat-generating unit such as a high density integrated circuit package.

BACKGROUND ART

Relative small sized, but multi-functional and high performance electronic equipment such as personal computers (PCs), work stations, and other desktop type or desk-side type computers make use of high density integrated circuit packages. These become local sources of heat. Usually, heat-radiating fins are provided individually or in common for such high density integrated circuit packages. Use is made of natural cooling by natural ventilation or forced cooling by common cooling fins for the equipment as a whole so as to cool the same along with other elements and units.

Some recent high integration LSI packages give off several watts of heat. Further, along with the rise of the clock frequency used, the amount of heat generated increases. In particular, it is sometimes not possible to obtain sufficient cooling with the above type of usual heat sink in the case of an LSI package generating from 5 to 6 or more watts of heat. As the cooling fans for forced cooling, use is made of, for example, 60 to 80 mm square sized fans for the above-mentioned desktop type personal computers or 120 mm square sized fans for desk-side type computers, operated at a considerably high speed of, for example, 3000 to 5000 rpm. Use of ones with more powerful cooling capacities is not possible in view of the size of the equipment, costs, and noise.

That is, if the fans are made larger in size, the size of the equipment increases accompanying this, the costs increase, and the noise increases as well, but the cooling capacity does not increase commensurate with the same. Further, even if a number of fans are used arranged in series or in parallel, the size of the equipment and the costs increase in accordance with this, but the resultant amount of cooling air does not similarly multiply. Further, operating the fan at a higher speed is difficult in view of the noise. Also, even if a large sized fan is operated at a low speed, the merits in terms of cooling effect and noise commensurate with the demerits of the equipment size and costs cannot be obtained. For these reasons, as a result, it is not possible to supply sufficient cooling air for the heat sink of a high heat generating LSI package for example as mentioned above.

For example, a conventional example of the case of cooling a printed circuit board mounted in high density mounting electronic equipment is shown in FIG. 1. In this conventional example, cooling fans 17 are arranged in a shelf 15 of the electronic equipment for cooling the printed circuit boards 16, 16 ... housed in the shelf 15. When heat-generating elements 1 are mounted on the printed circuit boards 16, 16 ..., it is necessary to increase the efficiency of cooling the heat-generating elements 1 by affixing known heat sinks provided with a plurality of heat-radiating fins to the heat-generating elements 1.

Note that in FIG. 1, 19 shows connectors for mounting the printed circuit boards 16 to a back panel, while 20 shows an air duct.

The main object of a heat sink is to increase the heat conducting area. If trying to obtain a high heat radiating effect, the height of the heat-radiating fins must be made greater or the interval between the heat-radiating fins must be made narrower, but in an actual board, this would lead to a reduction in the mounting density and an increase in the fluid resistance and thus would cause the problem, it has been pointed out, of not being able to obtain the required performance.

Further, even with cooling by a cooling fan 17, it is not possible to cool just a specific heat-generating element 1 on a spot basis. When a certain air speed or more is already obtained, there is the problem that the demerit of the greater noise becomes greater than the improvement of the cooling efficiency due to the increased air speed.

In the known heat sink, when trying to improve the cooling capacity, it is necessary to increase the surface area of the heat-radiating fins. When narrowing the interval between heat-radiating fins to try to increase the surface area, however, the pressure loss increases and the heat radiating effect is not effectively improved.

A conventional cooling device for cooling a heat-generating element is shown in FIG. 2. In this conventional device, a heat sink 2 formed of a material with a good heat conductivity, such as aluminum, is affixed as a heat radiator on the heat-generating element 1. The heat sink 2 is provided on top with a plurality of comb-tooth-like heat-radiating fins 4, 4 .... The heat emitted from the heat-generating element 1 is conducted to the heat sink 2, then absorbed by the cooling air.

That is, in a heat sink provided with such comb-tooth-like heat-radiating fins, referring to FIG. 3, if the interval between the heat-radiating fins 4 is made narrower, the air speed V2 becomes smaller than the air speed V1. Further, comparing the pressure loss of the heat-radiating fins 4 and the surrounding pressure loss, the surrounding pressure loss becomes far smaller so the majority of the cooling air ends up flowing in the surrounding area.

Accordingly, if the amount of heat emitted by the heat-generating element 1 increases, it becomes necessary to raise the air speed near the heat-generating element 1 to raise the heat radiating effect and therefore use of a more powerful fan becomes necessary.

On the other hand, to make the fan more powerful, in general the size of the fan is increased or else the rotational speed is raised. There is the problem, however, that the result is an increase in the mounting space of the fan or an increase in the noise.

To raise the heat radiating effect, it is also possible to increase the surface area of the heat-radiating fins 4, but in this case there is the problem that this causes an increase in the mounting space.

To resolve this, since the heat-generating elements or units emitting particularly high heat in a piece of equipment are usually limited to a handful of locations, it has been considered to provide these heat-generating elements or units with heat sinks assembled with for example individual small-sized cooling fans of about 25 to 40 mm square size so as to send the individually required amounts of cooling air to the heat sinks of these heat-generating elements or units and perform local forced cooling.

FIG. 4 gives front views, including partial cross-sections, illustrating schematically the kinds, that is, type, of mounting structures with such a cooling fan and heat sink assembled together. Here, examples are shown of application to a cooling device of an LSI package. In the figure, 1 is a package, that is, a heat-generating element, 2 is a heat sink formed by a material with a good heat conductivity, and 3 is a cooling fan unit. Consideration may be given to a direct vertical mounting type where the fan unit 3 is mounted above the heat sink, as shown in FIG. 4(A), and a buried mounting type where the fan unit 3 is buried in the heat sink 2, as shown in FIG. 4(B).

However, sufficient study has yet to be made of the shape, structure, etc. for meeting size requirements and achieving high cooling efficiencies for the realization of a heat sink provided with an individual cooling fan for a heat-generating element or unit, particularly with equipment being made smaller in size and with higher mounting densities. In particular, sufficient study has not been made of a thin cooling structure able to meet the requirements of recent high density mounting equipment.

FIG. 5 gives a side view (A) and plan view (B) showing only the heat radiator portion in a cooling device of the mounting structure shown in FIG. 4(A). This heat radiator is comprised of a heat sink 2 formed of a material with a good heat conductivity and with a plurality of heat-radiating fins 4, 4 . . . projecting out at the top surface and a cooling fan unit 3 provided above the heat sink 2.

In such a conventional heat radiator comprised of a heat sink and cooling fan formed integrally together, the cooling fan unit 3 is constructed to be driven by a centrally disposed motor 3c to turn its fan blades 3. The motor 3c does not necessarily have to have a high cooling air generating capacity, since the area of projection of the cooling air on the blowing surface is large. To exhibit the desired cooling effect, it is necessary to raise the rotational speed etc. of the motor 3c. This has the problem of causing the generation of noise etc.

Further, the cooling fan unit 3, as mentioned above, has a motor 3 disposed at its center, so there was the problem that the amount of cooling air becomes smaller at the center of the heat sink 2 where the amount of heat generated is the greatest and so the cooling efficiency is not by any means high.

FIG. 6 gives a side view (A) and a plan view (B) for explaining the cooling action in the heat radiator of the above-mentioned construction. This heat radiator is comprised of a heat sink 2 which has a plurality of pin-shaped heat-radiating fins 4, 4 . . . projecting out from its top surface and which is adhered or affixed to the heat-generating element 1 and a cooling fan unit 3 which has a fan 3b accommodated in a casing 3a and which is mounted above the heat sink 2. It is designed so that the fan 3b of the cooling fan unit 3 is operated to cool the heat sink 2 to which the heat emitted from the heat-generating element 1 is conducted.

In the above-mentioned conventional example, however, the distance between the bottom end of the fan 3b and the top surface of the heat sink 2 was substantially zero, so there was the problem that the area directly under the fan motor unit, that is, the center portion of the heat sink 2, became a dead zone, inviting a reduction of the cooling efficiency and resulting in a larger pressure loss and thus the reduction of the capacity of the fan 3b.

Further, for example, in the case of the so-called push system where the exhaust air of the fan 3b is blown against the heat sink 2, the flow of air diffuses while swiveling as shown by the arrow marks in FIG. 6(B), so there is the problem that mutual interference is caused, dead points occur, and therefore the effective amount of air contributing to the actual cooling is reduced.

Also, to resolve these problems and improve the cooling efficiency, it is possible to use a high speed fan for the cooling unit 3, but in this case there is the problem that the noise ends up becoming greater.

DISCLOSURE OF THE INVENTION

The present invention was made so as to resolve the above problems and has as its object the provision of a heat-generating element cooling device which can effectively cool a specific heat-generating element.

Further, the present invention has as its object the provision of a heat-generating element cooling device which supplies cooling air from the center portion and therefore enables the pressure loss circuit to be arranged not in parallel, but in series and enables the distance over which the cooling air passes to be more than halved and the pressure loss to be decreased.

Next, the present invention has as its object the provision of an integral fan type heat-generating element cooling device, that is, a heat sink system provided integrally with a fan for cooling the heat-generating element or heat-generating unit which improves the cooling efficiency and has a shape and structure enabling high density mounting.

Still further, the present invention has as its object the provision of an integral fan type heat-generating element cooling device which enables effective cooling of a heat-generating element without inhibiting the mounting efficiency.

A more specific object of the present invention is to provide a heat-generating element cooling device having a fan construction enabling uniform heat radiation.

Another more specific object of the present invention is to provide a heat-generating element cooling device having a heat sink structure which enables uniform heat radiation.

Still another more specific object of the present invention is to provide a heat-generating element cooling device having a fan construction which enables the size to be made thin.

Still another more specific object of the present invention is to provide a heat-generating element cooling device having an aligned construction of the heat sink and fan which enables the size to be made thin.

To achieve the above-mentioned objects, the heat-generating element cooling device according to the present invention has a heat radiator attached to a heat-generating element and a blowing device for blowing cooling air to the heat radiator, the heat radiator being comprised of a heat sink formed of a material with a good heat conductivity and provided with a plurality of heat-radiating fins and a hollow pipe portion arranged at the center portion of the heat sink, wherein cooling air is forcibly introduced from the blowing device to the pipe portion, then is ejected from small blowing holes formed in the pipe portion.

In this construction, the cooling air blown out from the blowing device may be distributed to a plurality of heat radiators through an air conduit passage and that air conduit passage may be connected to a plurality of air conduit pipes through a coupling portion. In this way, by suitably selecting and connecting the air conduit pipes, it becomes possible to cancel out the differences in disposition of the heat-generating elements on the printed circuit board and becomes possible to apply the device to various types of printed circuit boards.

Further, the air conduit passage may be connected to a blowing device through a coupling portion provided on a front board of the printed circuit boards to enable connection to a plurality of printed circuit boards.

Further, the cooling air from the cooling device is guided from the pipe portion on the center line of the heat-generating element. The pipe portion has small blowing holes in the bottom wall. The cooling air therefore concentratedly cools the area near the center line of the heat sink, which is the high temperature area, to improve the overall cooling efficiency. Further, the cooling air is guided to symmetrical positions with respect to the center line of the heat-generating element by the pipe portion, so concentratedly cools the area near the center line of the heat sink, which is where the high temperature area is located, and thereby improves the overall cooling efficiency.

Still further, the cooling air is guided to the center of the heat sink by a guide portion and concentratedly cools the center portion where the high temperature area is so as to improve the overall cooling efficiency. Also, the small blowing holes are formed in the center of the bottom wall of the guide portion, so the cooling air is ejected to the center portion of the heat sink without mutual interference.

Also, to achieve the above-mentioned objects, the heat-generating element cooling device according to the present invention has a heat sink with a plurality of heat-radiating fins projecting from its top surface and a cooling fan unit attached to the heat sink, the surface of the heat sink having provided on it a partition plate which passes through the center and radially sections off the surface portion of the heat sink. Here, the cooling fan unit may be disposed a suitable distance from the top surface of the heat sink and the clearance between the heat sink and the cooling fan unit may be covered by an enclosing wall.

In this construction, the partition plate prevents mutual interference in the cooling air from the cooling fan unit, promotes the quick flow out from the heat sink, and prevents the reduction of the cooling efficiency due to the interference of the cooling air. Further, an air gap is formed between the cooling fan unit and the heat sink, so the cooling air blown out from the cooling fan unit travels over not only the peripheral edge portions, but substantially evenly over the center portion of the heat sink as well and therefore enables a high overall cooling efficiency to be exhibited.

Further, to attain the above-mentioned objects, the heat-generating element cooling device according to the present invention is constructed so that the heat-radiating fins of the heat sink become smaller in sectional area the further toward the front end, by which it becomes easier for the cooling air blown out from the cooling fan to reach the base surface of the heat-radiating fins of the heat sink. As a result, the effective amount of air is increased in the case of use of a cooling fan with the same amount of blowing.

The heat-radiating fins occupy every other intersection of a matrix-like grid and are arranged in a staggered manner. By intermittently providing the heat-radiating fins, the pressure loss of the cooling air is reduced and the effective amount of air is increased and, further, the cooling air can more easily strike all of the heat-radiating fins. In this way, according to the present invention, the reduction of the pressure loss of the cooling air is held to the minimum and the heat radiating surface can be increased as well.

Also, to achieve the above-mentioned objects, according to the heat-generating element cooling device of the present invention, provision is made of an integral fan type heat-generating element cooling device of the direct vertical mounting type provided with a heat sink disposed on the top surface of the heat-generating element and having a plurality of heat-radiating fins and a cooling fan unit arranged above the heat sink and having a motor portion operating at its center, wherein at least one auxiliary blade is provided at the bottom surface of the motor portion of the fan unit.

Since the integral fan type heat-generating element cooling device according to the present invention is comprised in this way, in a direct vertical mounting type where the fan unit is mounted above the heat sink, it is possible to use the auxiliary blades provided below the motor portion of the fan unit to agitate the air below the fan unit and therefore eliminate any dead zones occurring just beneath the fan unit.

Further, to achieve the above-mentioned objects, the heat-generating element cooling device according to the present invention has a heat sink provided with a plurality of pin-shaped heat-radiating fins and a cooling fan unit affixed above the heat sink, the base surface of the heat-radiating fins of the heat sink having at least partially an inclined surface formed so as to become lower the further toward the center.

As a result, the height of projection of the adjoining heat-radiating fins from the heat-radiating fin base surface is higher in the one positioned inward on the heat sink and therefore a difference is caused in the pressure loss between the two. Due to this difference in the pressure loss, the cooling air blown from the cooling fan unit collects at the center portion of the heat sink, so the center portion of the heat sink, where the heat emission is high, is efficiently cooled. In addition, the thickness of the heat sink is less at the center portion, so the heat radiation is promoted. Further, the thickness becomes greater the further toward the outer circumference, so the heat conductivity is improved and the conductive cooling effect is improved.

In the same way, provision is made of an integral fan type heat-generating element cooling device of the direct vertical mounting type where the heat sink is formed at least partially with a base surface inclined so as to include an inclination which descends toward the center portion, wherein a heat pipe is laid so as to extend along the inclined base surface from the peripheral portions to the center portion. According to this, by laying the heat pipe on the base surface of the heat sink inclined toward the center portion, the heat emitted at the center portion of the heat-generating element is conducted to the outer peripheral portions to increase the amount of heat radiation and further raise the cooling efficiency.

Further, to achieve the above-mentioned objects, the heat-generating element cooling device according to the present invention has a cover member arranged a suitable distance away from the top surface of a heat-generating element mounted on a printed circuit board and of substantially the same area as the heat-generating element and one or more fan units, the fan units being used to blow cooling air in the clearance between the cover member and surface of the heat-generating element so as to cool the heat-generating element.

Further, the heat-generating element cooling device according to the present invention has a heat sink affixed to the top surface of the heat-generating element and provided with a plurality of heat-radiating fins on its top surface and fan units affixed above the heat sink, the fan units being provided at symmetrical positions with respect to the center of the heat sink and the individual fan units being driven so that the directions of blowing face the center of the heat-generating element.

Further, it may be constructed to have a heat sink affixed on the printed circuit board adjoining the heat-generating element and provided with a plurality of heat-radiating fins at the top surface and a fan unit affixed above the heat sink, the heat sink and the heat-generating element being connected through a heat pipe.

According to this construction, a cover member is disposed above the heat-generating element and cooling air is blown from the fan unit toward the clearance. The cooling air is ejected toward the top surface of the heat-generating element to cool the heat-generating element, while the cooling air reflected back by the heat-generating element is again reflected back from the cover member to reach the heat-generating element, thereby contributing to the cooling of the heat-generating element.

Further, the fan unit is attached detachably to the cover member, so can be replaced if defective or if breaking down.

Also, the fan unit is attached at a position with the fan rotational shaft offset from the center of the heat-generating element. As a result, the cooling air from the fan is directly blown against the center portion of the heat-generating element, that is, the high heat emitting region of the heat-generating element, and the cooling efficiency is improved.

Further, the cover member is formed by a material with a good heat conductivity and a spring member with a good heat conductivity is interposed between the cover member and the surface of the heat-generating element. As a result, part of the heat from the heat-generating element is conducted to the cover member through the spring member, so the cooling efficiency is improved.

Further, the cover member is formed with a plurality of ridges projecting out to the clearance side. These ridges give a throttling effect to the cooling air passing inside the clearance and raise the air speed. Also, they direct the cooling air to the surface portion of the heat-generating element so as to improve the cooling efficiency.

A plurality of fan units affixed above the heat sink are provided at symmetrical positions with respect to the center of the heat sink. Further, the individual fan units are driven so that their blowing directions face the center of the heat-generating element. As a result, the cooling air from the individual fan units passes through the center of the heat-generating element, that is, the high heat emitting portion, and the cooling efficiency is improved.

Further, according to another construction, the heat sink is mounted adjoining the heat-generating element and with a fan unit mounted to the top surface. The heat sink and the heat-generating element are connected by a heat pipe and the heat emitted by the heat-generating element is conducted to the heat sink through the heat pipe.

Also, to achieve the above-mentioned objects, the heat-generating element cooling device according to the present invention provides a buried mounting type heat-generating element cooling device provided with a heat sink disposed on the top surface of a heat-generating element and having a plurality of heat-radiating fins disposed at least except at a center portion of the same, a cover having an air intake and exhaust opening facing the center portion of the heat sink and attached so as to cover the top surface of the heat sink, and a cooling fan unit inside the air intake and exhaust opening of the cover and buried in the center portion of the heat sink, wherein the circuit components for driving the fan unit are attached to the inner surface of the cover or the inner surface of the heat sink.

Further, in this construction, since the circuit components for control of the rotation of the fan unit are attached at the inside surface of the heat sink or the cover, not provided above or below the motor, the cooling device can be made thinner by that amount of space or the fan motor can be made longer laterally and the diameter made smaller so as to reduce the overall size of the cooling device.

Also, to achieve the above-mentioned objects, the heat-generating element cooling device according to the present invention is comprised of a heat sink disposed on the top surface of a heat-generating element mounted on a printed circuit board and having a base surface, a cooling air throttling mechanism supported by the base surface, and a plurality of heat-radiating fins disposed on the base surface around the throttle mechanism, a plate-shaped cover covering the top surface of the heat sink and having an air intake and exhaust opening formed at a position facing the throttling mechanism, and a cooling fan unit positioned beneath the air intake and exhaust opening of the cover and mounted so as to be accommodated in the throttling mechanism.

Further, provision is further made of a male screw member of a material with a good heat conductivity affixed near the center portion of the top surface of the heat-generating element and, in the heat sink, the fan mounting portion is formed at a position offset from the center portion and a female screw portion engaging with the male screw member is formed near the center portion.

In an integral fan type heat-generating element cooling device of the buried mounting type according to such a construction, it is possible to use the throttling mechanism formed in the heat sink for heat radiation. Further, by joining the heat sink with the buried fan unit and the heat-generating element by a screw, by making the male screw affixed to the heat-generating element one with a large heat conductivity, and by making the female screw provided in the heat sink one which contacts the cooling air, it is possible to make a highly reliable joining construction and also contribute to the improvement of the cooling efficiency.

Further, to achieve the above-mentioned objects, the heat-generating element cooling device according to the present invention provides an integral fan type heat-generating element cooling device of the buried mounting type provided with a heat sink disposed at the top surface of a heat-generating element and having a plurality of heat-radiating fins disposed on the base surface except at least at a fan mounting portion, a cover having an air intake and exhaust opening at a position facing the fan mounting portion and attached so as to cover the top surface of the heat sink, and a cooling fan unit attached so as to be buried in the fan mounting portion positioned beneath the air intake and exhaust opening of the cover, wherein the side of the cover has formed an extension portion extending directly above and outward of the heat-generating element and a shielding plate connected to the edge of the extension portion and extending downward.

In this construction, the shielding plate provided at the extension portion of the cover is used to eliminate interference of the exhaust air between parallel disposed cooling devices and the exhaust air is introduced to the bottom surface of the heat-generating element so as to improve the cooling efficiency.

Further, to achieve the above-mentioned objects, according to the heat-generating element cooling device according to the present invention, there is provided an integral fan type heat-generating element cooling device of the side mounting type, wherein provision is made of a heat sink disposed on the top surface of the heat-generating element mounted on a board and having a plurality of heat-radiating fins, a cover affixed so as to cover the top surface of the heat sink and having an extension portion extending to the side of the heat sink, and a fan unit mounted beneath the extension portion of the cover, the operation of the fan unit causing the cooling air to be concentratedly and effectively led to the heat sink between the cover and the heat-generating element.

Still further, in the side mounting type where the fan unit is disposed at the side of the assembly of the heat-generating element and the heat sink, by making the construction a closed one where the cooling air can be effectively led to the heat sink and further by disposing a member for effectively guiding the cooling air inside to the heat emitting portion, it is possible to form the cooling device thin and further to raise the cooling efficiency.

BRIEF DESCRIPTION OF THE DRAWINGS

FIGS. 30(A) to 30(C) are bottom views illustrating various shapes of auxiliary blades.

FIGS. 33, 33(A) and 33(B) are a top view, front view, and side view of the construction of an 12th embodiment of the heat-generating element cooling device according to the present invention.

FIG. 34 is a front cross-sectional view along the section A—A of FIG. 33.

FIGS. 35, 35(A) and 35(B) are a top view, front view, and side view of a modification of the embodiment of FIG. 33.

FIGS. 51, 51(A) and 51(B) are a top view, front view, and side view of the construction of a heat-generating element cooling device of the type of FIG. 4(B).

FIGS. 54(A) and 54(B) are partial enlarged cross-sectional views of the center portion in the section along the section A—A in FIG. 53.

FIGS. 55, 55(A) and 55(B) are a top view, front view, and side view of the construction of a modification of the embodiment of FIG. 53.

FIGS. 56(A) and 56(B) are partial enlarged cross-sectional views of the center portion in the section along the section A—A in FIG. 55.

FIGS. 57(A), 57(A)-1, 57(B) and 57(B)-1 are a top view and front view of the construction of a first example overall (A) and cover (B) of a conventional integral fan type heat-generating element cooling device of the type of FIG. 4(B).

FIGS. 58(A), 58(A)-1, 58(B) and 58(B)-1 are a top view and front view of the construction of a second example overall (A) and cover (B) of a conventional integral fan type heat-generating element cooling device of the type of FIG. 4(B).

FIGS. 59(A), 59(A)-1, 59(B) and 59(B)-1 are a top view and front view of the construction of the 19th embodiment overall (A) and cover (B) of the heat-generating element cooling device according to the present invention.

FIGS. 60 and 60(A) are a top view and front view of the construction of just the heat sink in the embodiment of FIG. 59.

FIGS. 67, 67(A) and 67(B) are a top view, front view, and side view of the construction of a 21st embodiment of a heat-generating element cooling device according to the present invention.

BEST MODE FOR CARRYING OUT THE INVENTION

Below, the preferred embodiments of the cooling device according to the present invention will be explained in detail based on the attached drawings.

Figure 7A:
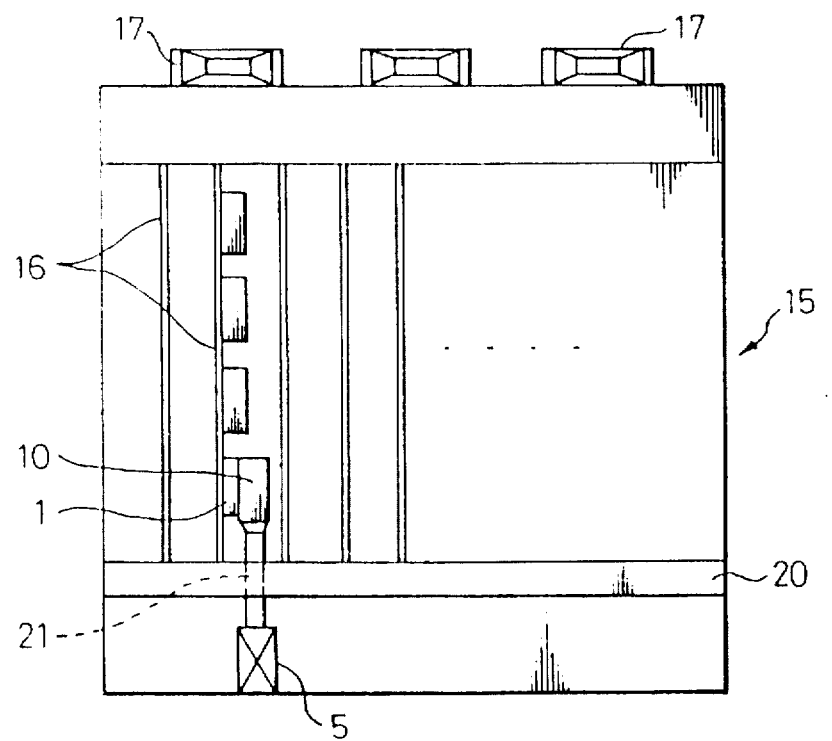
FIGS. 7(A) and 7(B) are views of the construction of a piece of electronic equipment to which a first embodiment of the heat-generating element cooling device according to the present invention is applied, wherein 7(A) is an overall view and 7(B) is an enlarged view of important portions.
Figure 7B:
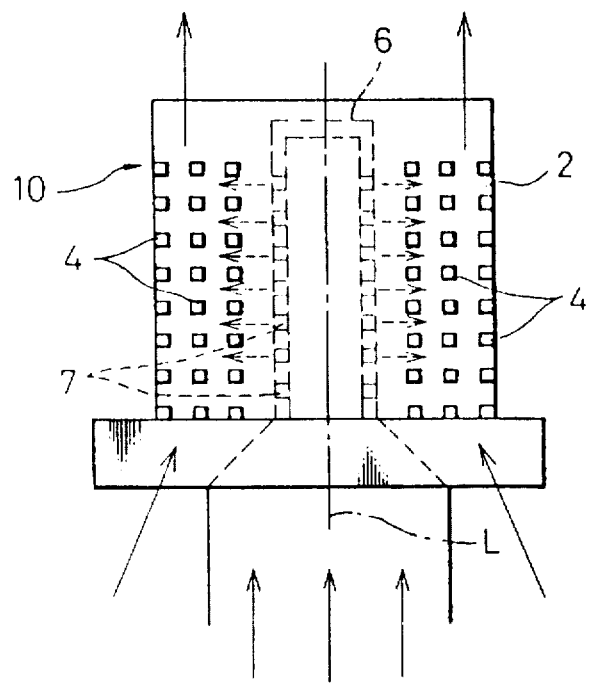

First, the construction of FIG. 7 shows the construction of a piece of electronic equipment to which the first embodiment of the heat-generating element cooling device according to the present invention is applied, in particular, the construction of the shelf 15 of the same. (A) is an overall view and (B) is an enlarged view of important portions of the same. In a piece of equipment of this construction, in the shelf 15, a plurality of printed circuit boards 16, 16 . . . are plugged in to a rear back panel for connection.

On the printed circuit boards 16, 16 . . . are mounted various types of electronic devices including heat-generating elements 1. To introduce cooling air for cooling these elements into the shelf 15, the shelf 15 has cooling fans 17. Note that in FIG. 7, 20 shows an air duct provided for uniformly cooling the inside of the shelf 15. The flow of the cooling air inside the shelf 15, that is, the air flow, is shown by the arrow marks in FIG. 7.

Further, to cool a heat-generating element 1 on a spot basis, a blowing device 5 is mounted at the bottom of the shelf 15. The cooling air from this blowing device 5 is sent through a bellows-type duct 21 to a heat radiator 10, which serves as the main part of the heat-generating element cooling device of the present embodiment.

Figure 8:
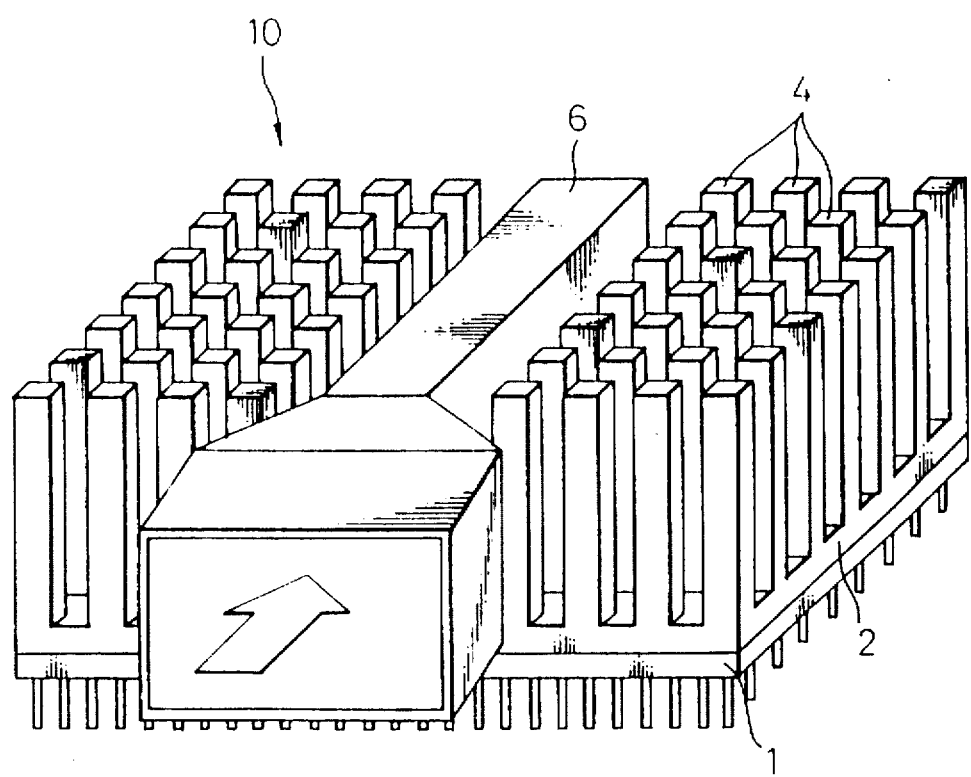
FIG. 8 is a perspective view of the construction of a heat radiator in the first embodiment of the heat-generating element cooling device according to the present invention.
Figure 9:
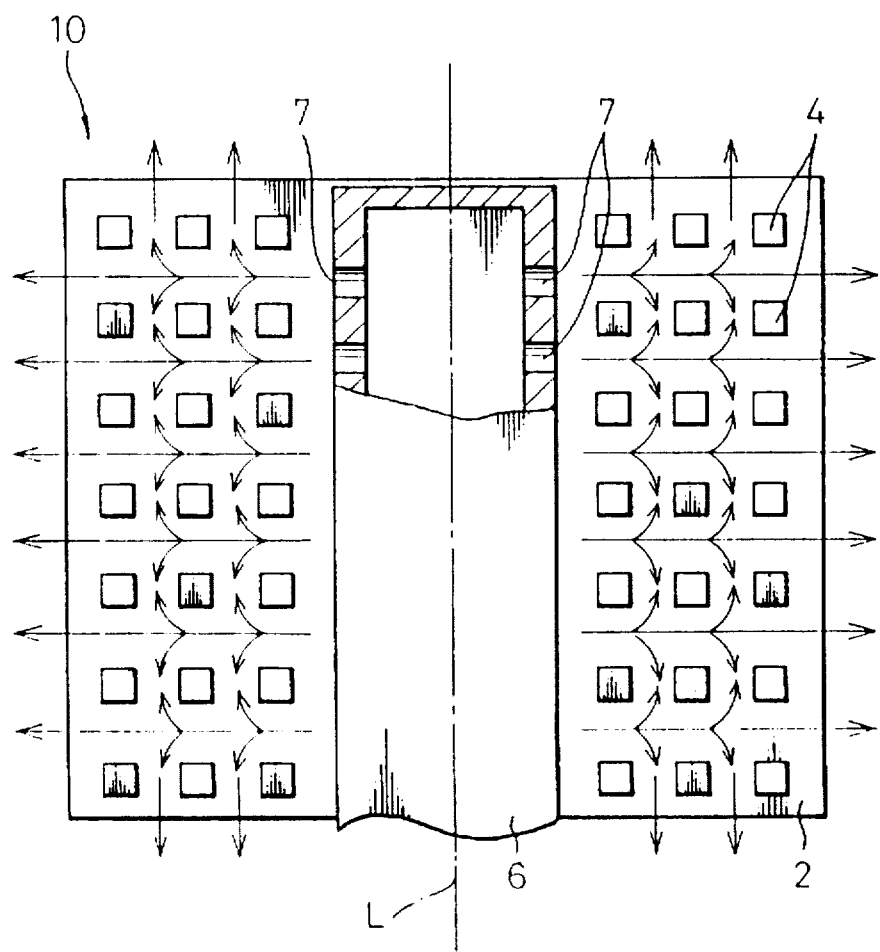
FIG. 9 is a plan view of FIG. 8.

Details of the heat radiator 10 in the heat-generating element cooling device of the present embodiment are shown in FIG. 8 and FIG. 9. The heat radiator 10 according to this embodiment is comprised of a heat sink 2 formed by a material with a good heat conductivity, for example, aluminum, and a pipe portion 6 disposed at the center portion of the heat sink 2. The entire top surface of the heat sink 2 except for the center portion has a plurality of pin-shaped heat-radiating fins 4, 4 . . . projected out from it.

The pipe portion 6 is formed having a hollow rectangular cross-section and is sealed at its end portion. Further, the side walls of the pipe portion 6 have a plurality of small blowing holes 7, 7 . . . formed in them corresponding to the intervals of the heat-radiating fins 4.

On the other hand, as shown in FIG. 7, the blowing device 5 is preferably one provided with a high static pressure characteristic, such as a sirocco fan, a blower, or a compressor. In the illustrated embodiment, use is made of a sirocco fan. The exhaust port of the blowing device 5 has connected to it the bellows-type duct 21 communicating with the air duct. Cooling air is blown to the pipe portion 6 of the heat radiator 10 through this bellows-type duct 21.

Accordingly, in this embodiment, the cooling air blown through the serpentine duct 21 to the pipe portion 6, as shown by the arrow marks in FIG. 9, is ejected from the small blowing holes 7 to the sides of the pipe portion 6 and cools the heat-radiating fins 5 disposed at the sides of the pipe portion 6.

Figure 10A:
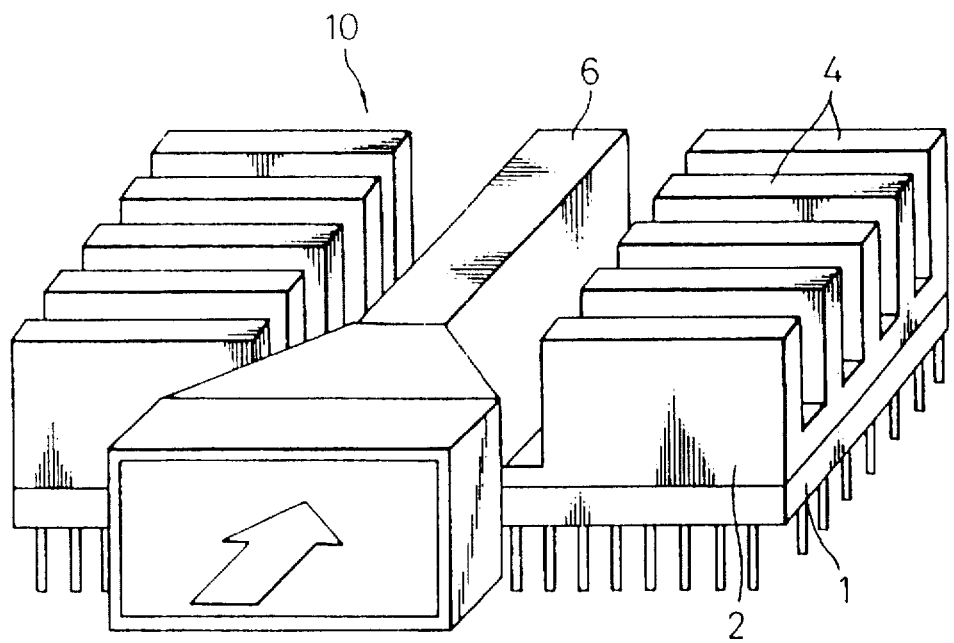
FIGS. 10(A) and 10(B) are views of a modification of FIG. 8, wherein 10(A) is a perspective view and 10(B) is a plan view.
Figure 10B:
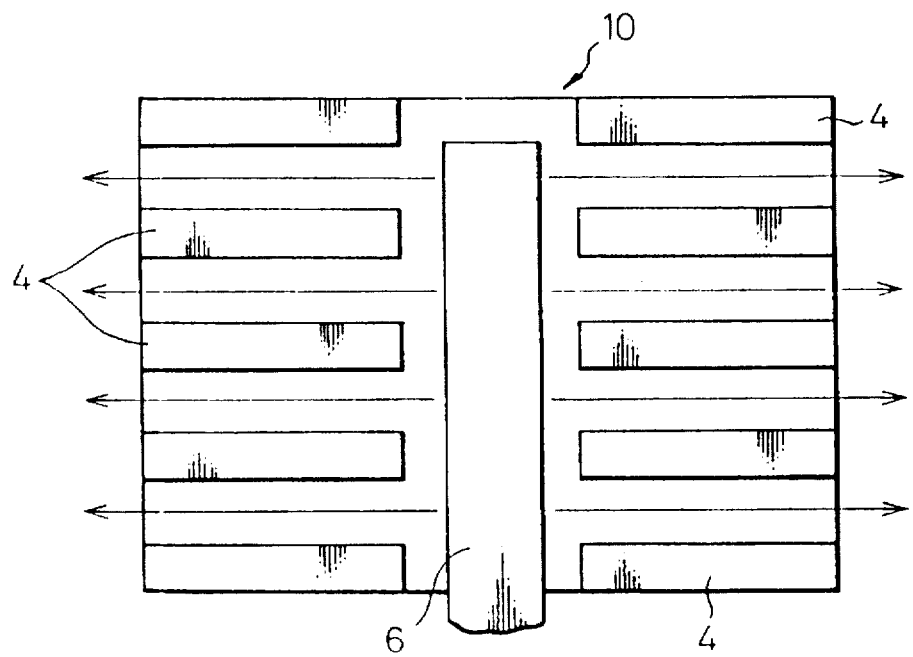

Note that the heat sink 2 of the heat radiator 10 according to the present embodiment is provided with pin-shaped heat-radiating fins 4, but in place of this it is also possible to form a plurality of wall-shaped heat-radiating fins 4 as shown in FIG. 10. In this case, the heat-radiating fins 4 are arranged along the opening direction of the small blowing holes 7 of the pipe portion 6 (see FIG. 10(B)).

Further, in these embodiments, the pipe portion 6 of the heat radiator 10 may be formed integrally with the heat sink 2, but it is also possible to form the pipe portion 6 separately and to attach it detachably to the heat sink 2. In this case, the pipe portion 6 may be constituted so as to be mounted engaged with the heat sink 2.

Figure 11:
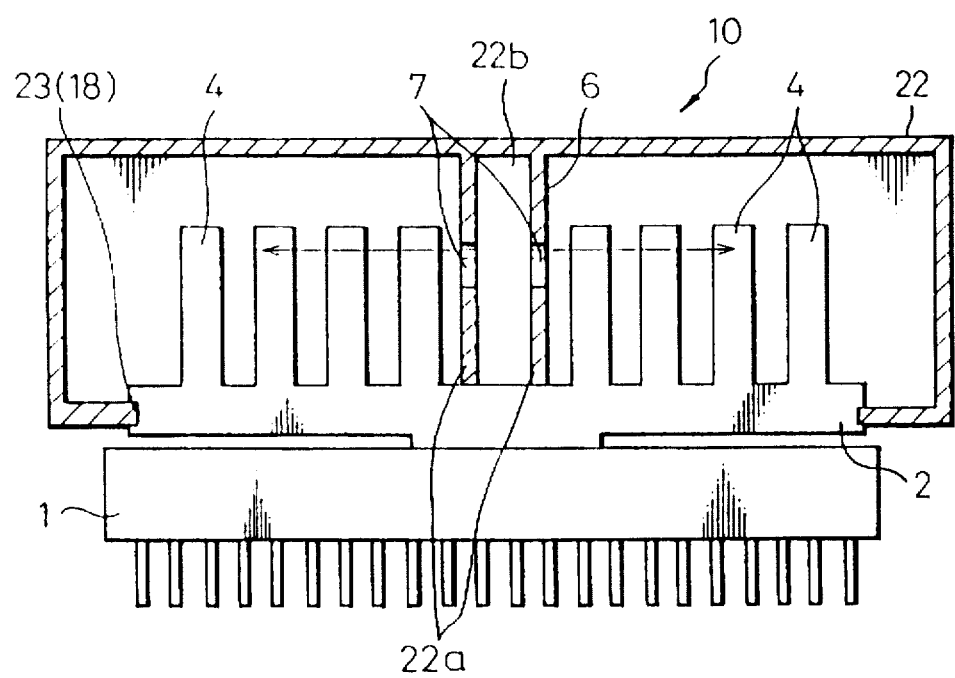
FIG. 11 is a cross-sectional view of the construction of a heat radiator in a second embodiment of a heat-generating element cooling device according to the present invention.

FIG. 11 shows the heat radiator 10 of a second embodiment of a heat-generating element cooling device according to the present invention. In the heat radiator 10 according to this embodiment, the heat sink 2 has mounted to it a cover member 22. A pipe portion 6 is formed between a pair of suspended walls 22a, 22a, which are suspended from the center portion of the cover member 22 and which have a plurality of small blowing holes 7, 7 . . . pierced through them, and the heat sink 2.

The depth direction of the pipe portion 6 formed between the suspended walls 22a and the heat sink 2 is closed by a closing wall 22b formed at the cover member 22 or constituting part of the same. Further, the cover member 22 according to this embodiment is provided with engaging walls 23 at the side wall portions which for example are engaged with engagement grooves 18 made in the heat sink 2.

Figure 12:
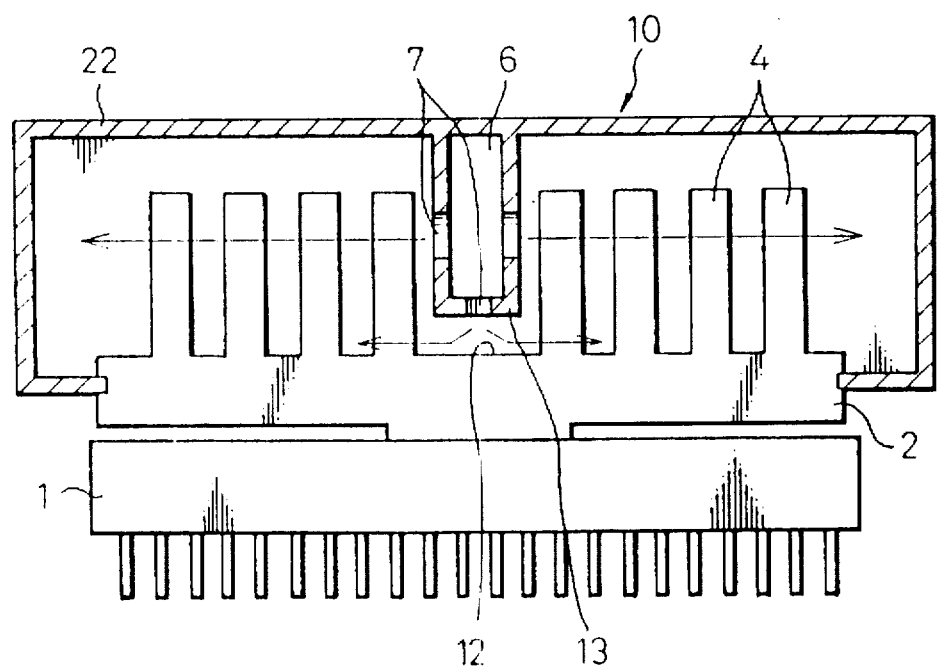
FIG. 12 is a cross-sectional view of a modification of FIG. 11.

FIG. 12 shows a modification of FIG. 11. The pipe portion 6 in this modification is disposed at a suitable height from the base surface 12 of the heat-radiating fins 4. A plurality of small blowing holes 7, 7 . . . are made through the bottom wall 13 and the side walls of the pipe portion 6.

Accordingly, in this embodiment, the cooling air is ejected from the center toward the sides and is ejected also to the top of the center line L (see FIG. 9) of the heat sink 2 so the center portion of the heat-generating element 1, i.e., the high temperature area, is effectively cooled.

Figure 13:
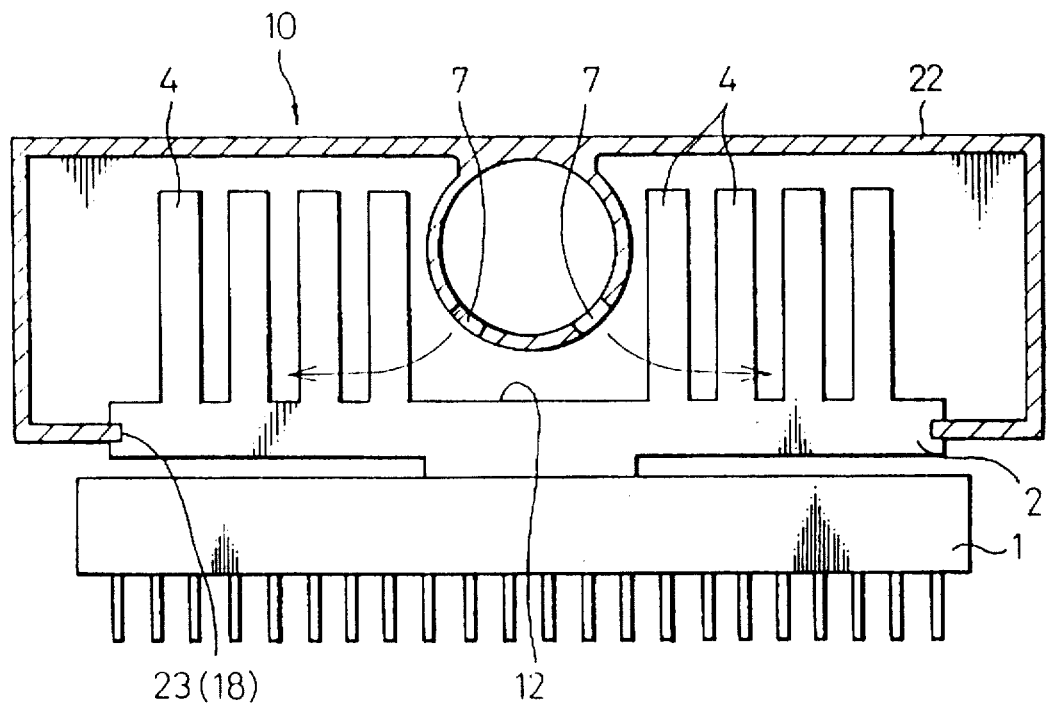
FIG. 13 is a cross-sectional view of another modification of FIG. 11.

FIG. 13 shows another modification of FIG. 11. The pipe portion 6 in this modification has a circular section. Small blowing holes 7 are made in the bottom side of the pipe portion 6.

Accordingly, in the heat radiator according to this embodiment, as shown by the arrow marks in the figure, the cooling air is ejected from the pipe portion 6 at a downward slant and so like with the above modification, the center portion of the heat-generating element 1, i.e., the high temperature area, is effectively cooled.

Figure 14A:
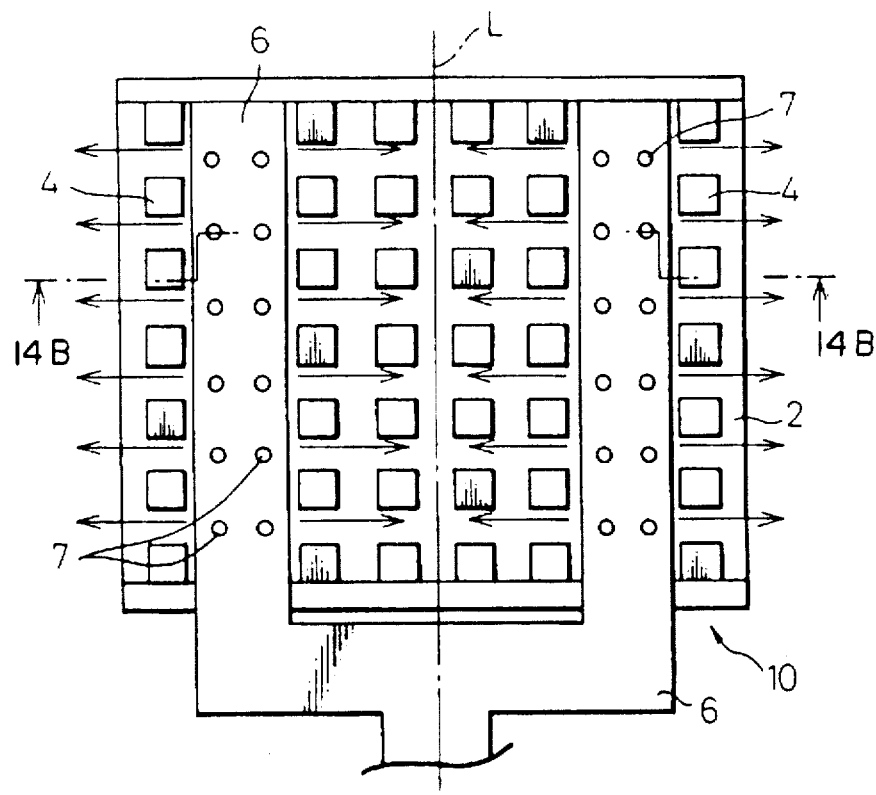
FIGS. 14(A) and 14(B) are views of the construction of a heat radiator in a third embodiment of the heat-generating element cooling device according to the present invention, wherein 14(A) is a plan view and 14(B) is a sectional view along the line B—B.
Figure 14B:
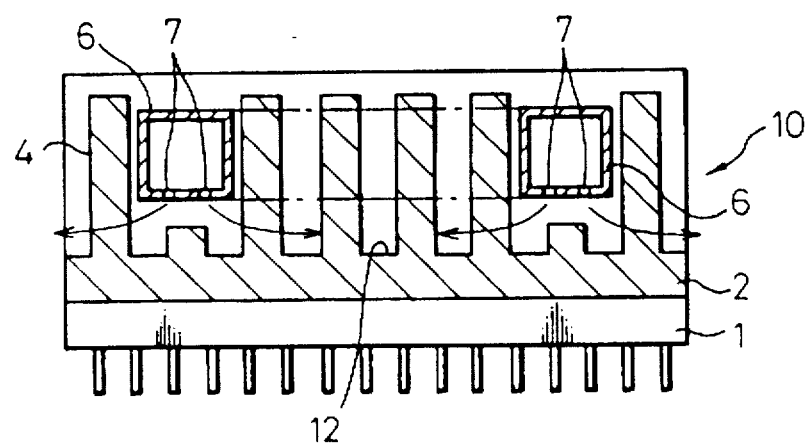

FIG. 14 shows the heat radiator 10 in a third embodiment of the heat-generating element cooling device according to the present invention, wherein (A) is a plan view and (B) is a sectional view along the line B—B. In the embodiment, two pipe portions 6 are provided at symmetrical positions with respect to the center line L of the heat sink 2. Small blowing holes 7 are made in the bottom walls 13 of these pipe portions 6. Therefore, in this embodiment, the cooling air is ejected from the two pipe portions 6 toward the center line L of the heat sink 2, and the center portion, that is, the high temperature area, is effectively cooled.

Figure 15:
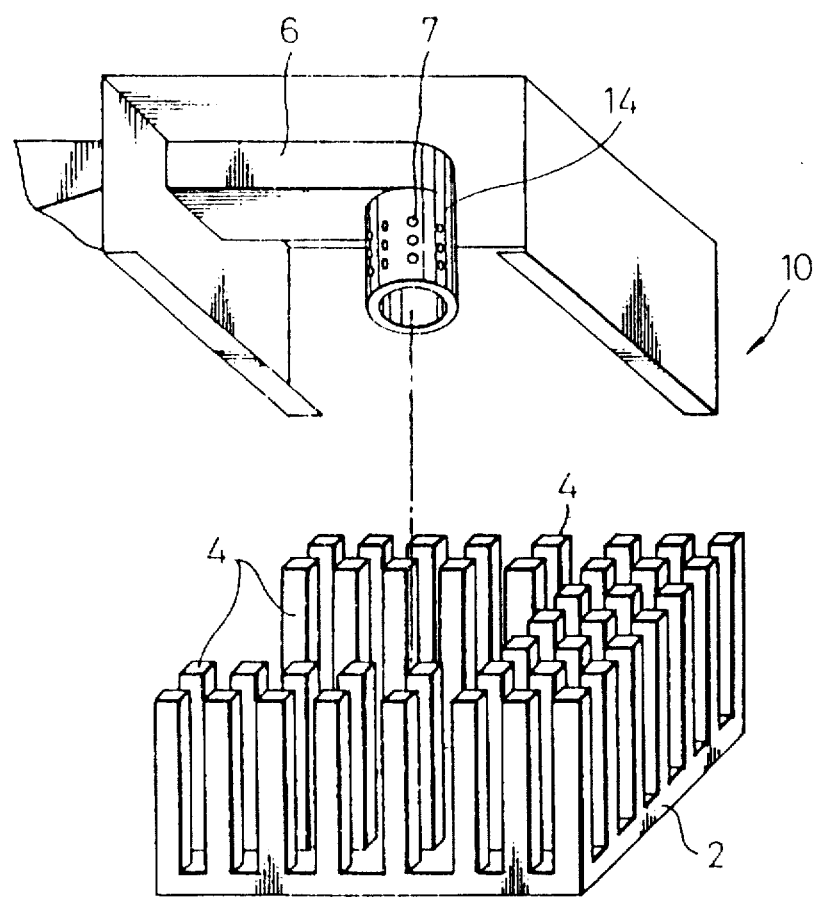
FIG. 15 is a perspective view of the construction of a heat radiator in a fourth embodiment of the heat-generating element cooling device according to the present invention.
Figure 16:
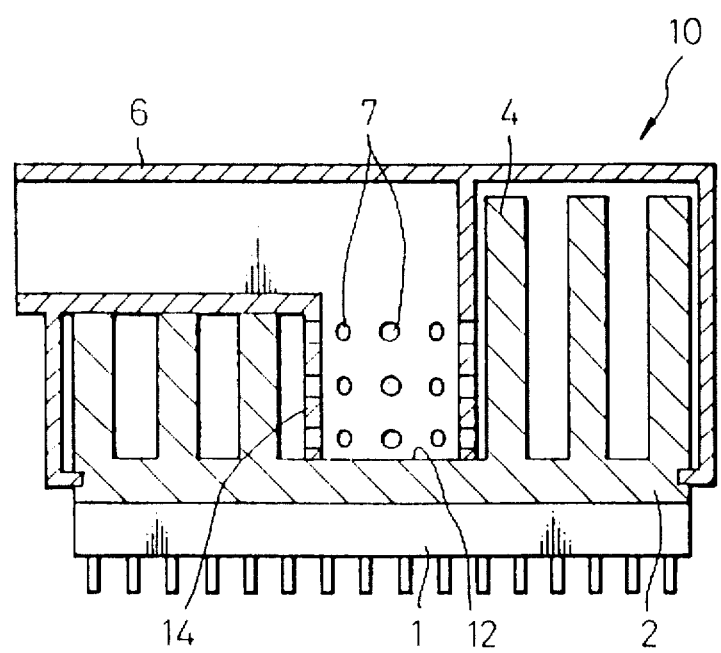
FIG. 16 is a cross-sectional view of FIG. 15.
Figure 17:
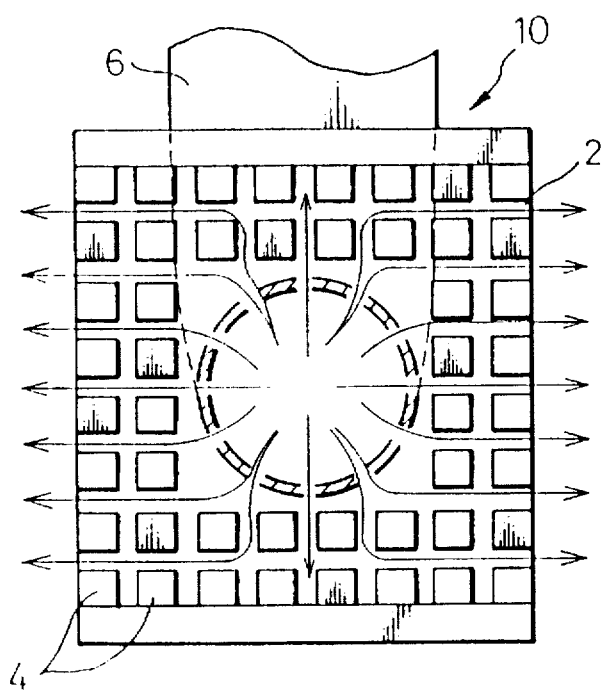
FIG. 17 is a plan view of FIG. 16.

FIG. 15 is a perspective view of the heat radiator 10 in a fourth embodiment of the heat-generating element cooling device according to the present invention. FIG. 16 is a cross-sectional view of the same, and FIG. 17 is a plan view thereof. The pipe portion 6 in this embodiment has a guide portion 14 which bends toward the center portion of the heat sink 2. The front end of this guide portion 14 is opened. In the state attached to the heat sink 2, it abuts against the base surface 12 of the heat-radiating fins of the heat sink 2 and therefore is closed (see FIG. 16). Therefore, in this embodiment, the cooling air is guided to the center portion of the heat sink 2 to cool the center portion of the heat sink 2 and also is ejected from the small blowing holes 7 made in the side walls of the guide portion 14 toward the sides to cool the surrounding heat-radiating fins 4,4 . . . (see FIG. 17).

Figure 18:
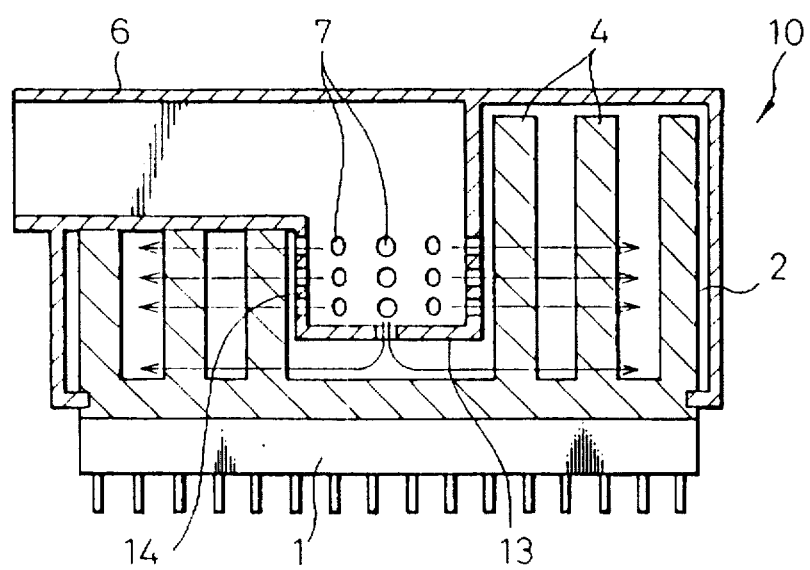
FIG. 18 is a cross-sectional view of a modification of FIG. 15.
Figure 19:
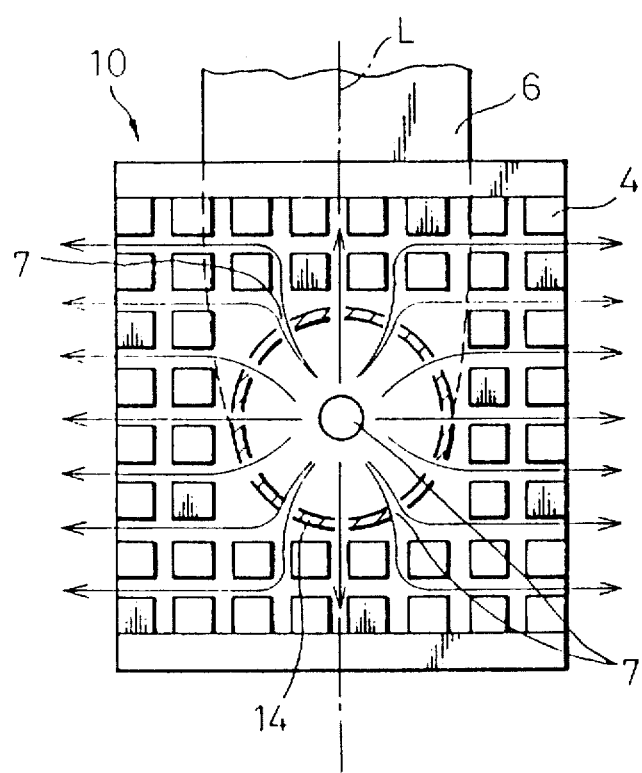
FIG. 19 is a view of a plan view of FIG. 18.

A modification of the heat radiator shown in FIG. 15 is shown in FIG. 18. FIG. 19 is a plan view of the same. The guide portion 14 in this modification is formed with a bottom. Small blowing holes 7 are made in the center of the bottom wall 13 of the guide portion 14 disposed at a suitable height position from the base surface 12 of the heat-radiating fins 4 of the heat sink 2. Accordingly, in this modification, the cooling air is ejected to the center of the heat sink 2, a high temperature area, in a state with no interference, to enable a greater improvement of the cooling efficiency (see FIG. 18 and FIG. 19).

Figure 20:
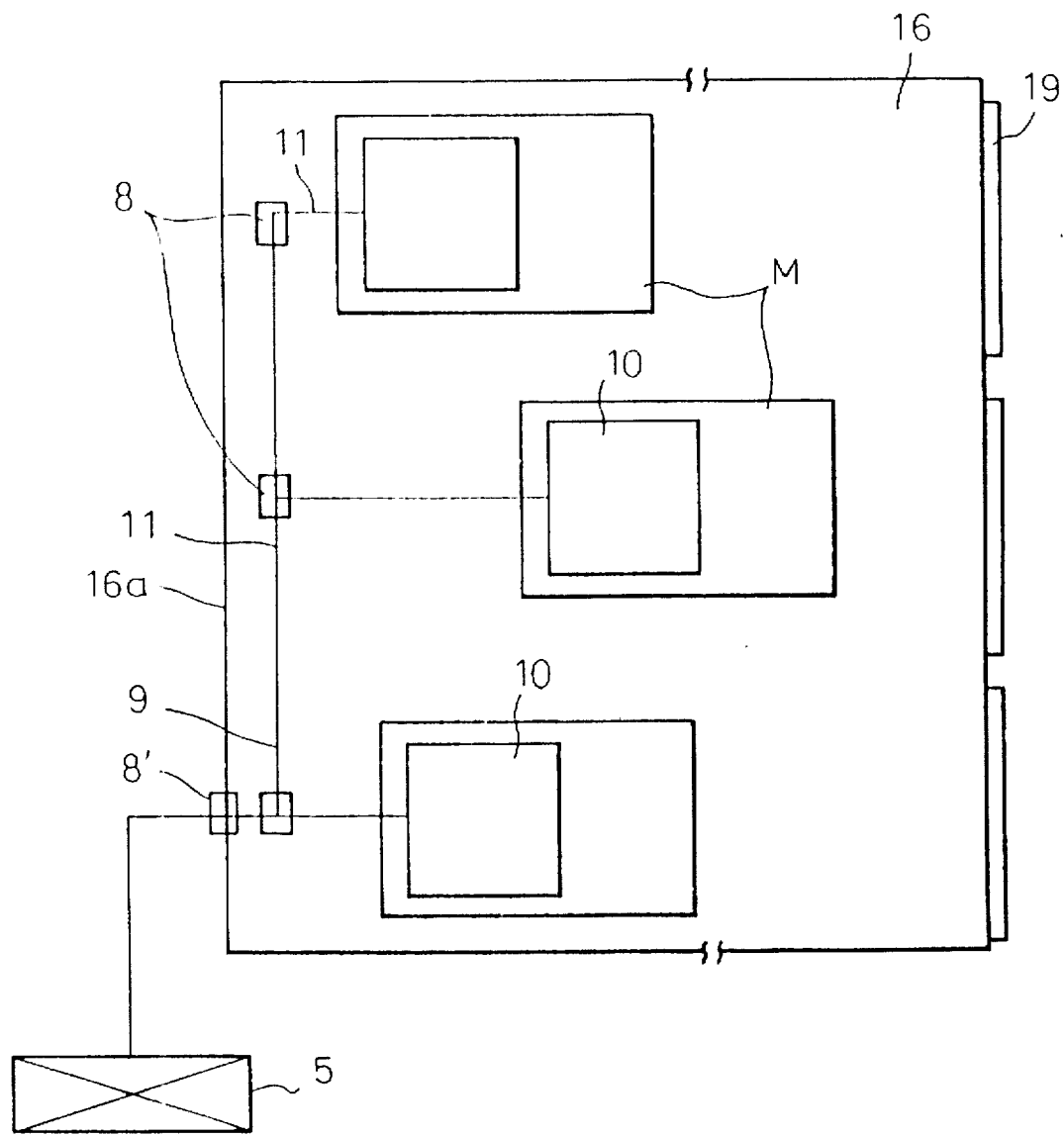
FIG. 20 is a view of the construction of a piece of electronic equipment to which a fifth embodiment of the heat-generating element cooling device according to the present invention is applied.

FIG. 20 shows the construction of a piece of electronic equipment to which a fifth embodiment of the heat-generating element cooling device according to the present invention is applied. In equipment of this construction, modules M, M . . . in which the heat-generating elements 1 are mounted are attached on the printed circuit boards 16, 16 . . . provided with front plates 16a at the side edges corresponding to the open face of the shelf 15. The heat-generating elements 1 of the modules M have heat radiators 10 attached to them. Cooling air is blown to the heat radiators 10 by connecting an air conduit passage 11 to the pipe portions 6 of the heat radiators 10. Further, the air conduit passage 11 and the blowing device 5 are connected by a coupling portion 8' provided at the front plates 16a of the printed circuit boards 16.

Figure 21:
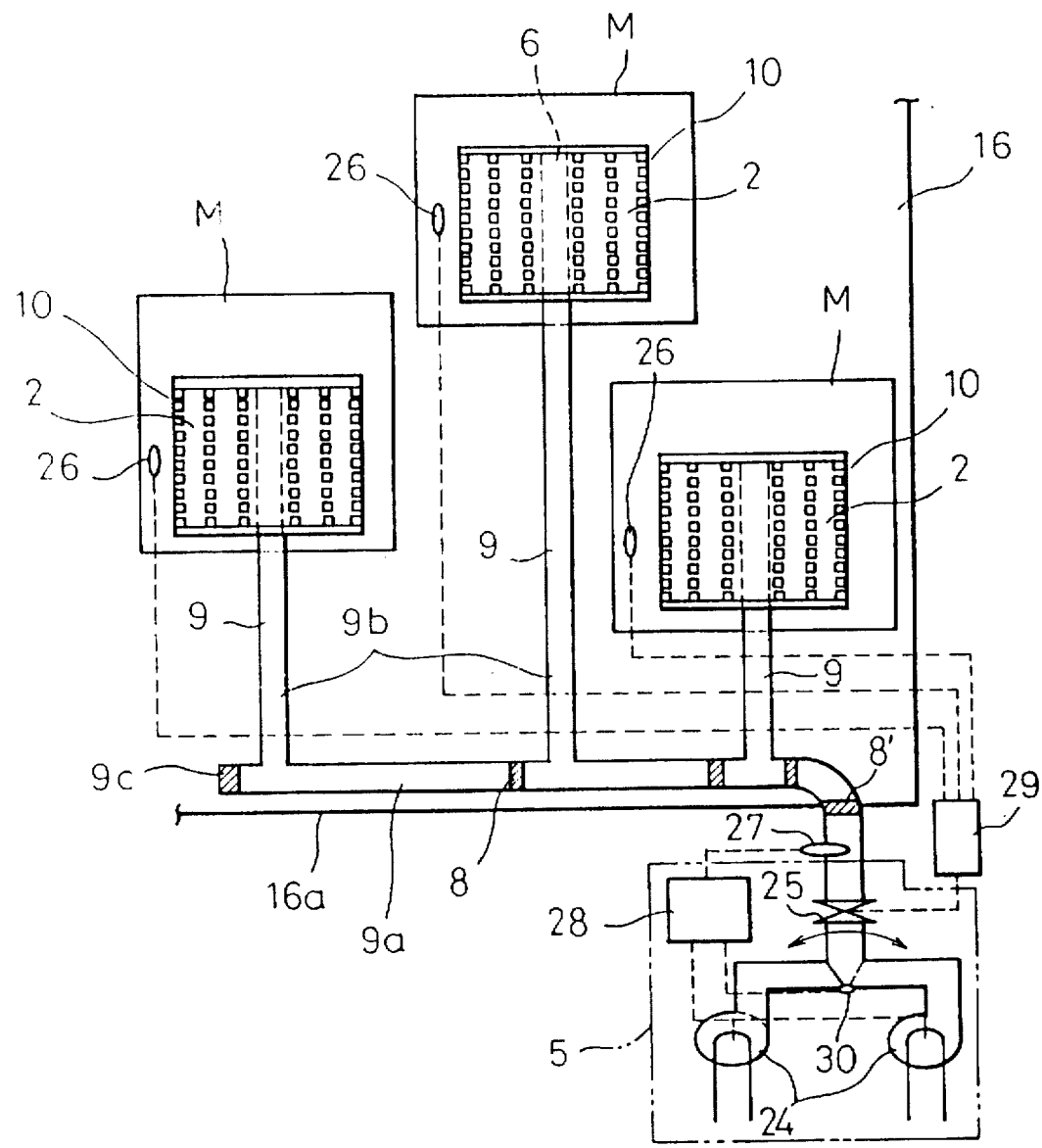
FIG. 21 is an enlarged view of important portions of FIG. 20.

The blowing device 5, as shown in FIG. 21, is provided with a blower or a pump or other blowing device 24 and a throttle valve 25. The throttle valve 25 is adjusted based on information from the temperature sensors 26, 26 . . . disposed near the heat radiators 10, enabling a supply of cooling air to the heat radiators 10 controlled in accordance with the state of heat emission.

Note that in FIG. 21, reference 29 shows a valve controller which adjusts the throttle valve 25 by comparing the information from the temperature sensors 26 and the setting. Further, two or more blowing devices 24 may be disposed so that when the detection value of a pressure sensor 27 or a flow sensor 27 disposed at the output side falls below a lower limit setting, a standby device may be operated and thereby the redundancy improved. Also, in FIG. 21, 28 is a selective controller for selecting the blowing devices 24 by comparing information from the pressure sensors etc. 27 and the settings, and 30 is a switcher operating by a signal from the selective controller 28.

Figure 22A:
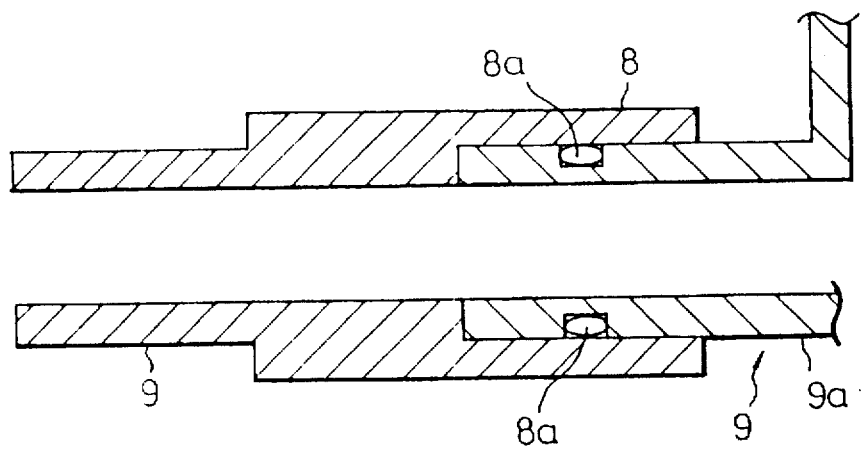
FIGS. 22(A) and 22(B) are views of the state of connection of air conduit pipes.

On the other hand, the air conduit passage 11 is formed by suitably connecting a plurality of air conduit pipes 9, 9 . . . . The air conduit pipes 9 are comprised of a main pipe portion 9a and a branched pipe portion 9b branched from the same and have a substantially L-shaped plan section. As shown in FIG. 22(A), a joint portion 8 is formed at one end of the main pipe portion 9a. The other end of the main pipe portion 9a of another air conduit pipe 9 is fit into this or is connected by screwing. The branch pipe portion 9b is connected to the pipe portion 6 of the heat radiator 10.

Figure 22B:
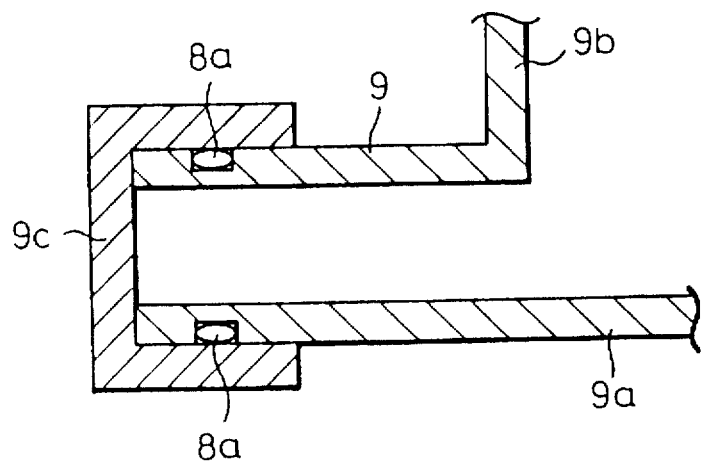

Note that in FIG. 22, 8a shows an O-ring attached to the coupling portion 8. Further, as mentioned above, the end of the air conduit passage 11 formed connecting the plurality of air conduit pipes 9, as shown in FIG. 22(B), may be closed by a cap member 9c.

Further, the above-mentioned air conduit pipes 9 may be prepared in advance in numerous types with different lengths of the main pipe portions 9a and branched pipe portions 9b and be suitably selected and used in accordance with the disposition of the high heat-generating elements 1 on the printed circuit boards 16, 16 . . . .

As clear from the above explanation of the embodiments, according to the heat-generating element cooling device of the present invention, it is possible to cool a specific element with a high cooling efficiency.

Figure 4A:
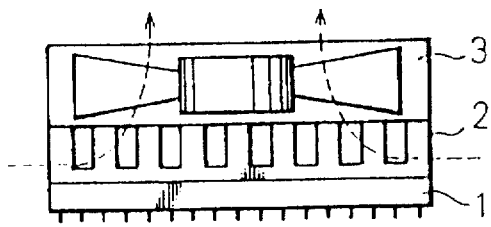
FIGS. 4(A) and 4(B) are frontal views including partial cross-sections illustrating schematically the types of mounting structures of combinations of cooling fans and heat sinks.
Figure 23A:
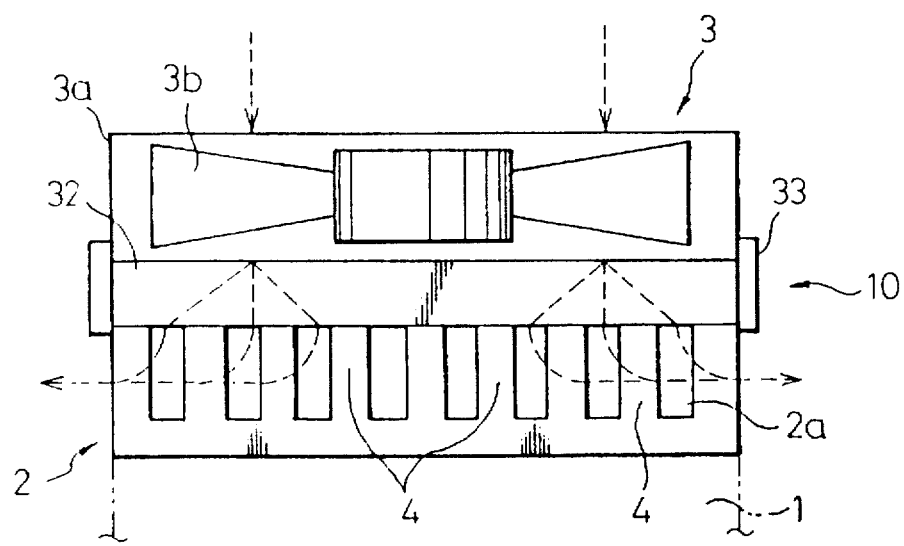
FIGS. 23(A) and 23(B) are view of a sixth embodiment of the heat-generating element cooling device according to the present invention, wherein 23(A) is a cross-sectional view and 23(B) is a plan view of the heat sink of the same.

FIG. 23 shows a sixth embodiment of the heat-generating element cooling device according to the present invention, especially an integral fan type heat-generating element cooling device. The heat-generating element cooling device 10 of the embodiment has an integral construction of a fan of the direct vertical mounting type and heat sink as shown in FIG. 4(A) and is comprised of a heat sink 2 formed by a material with a good heat conductivity such as an aluminum material and a cooling fan unit 3.

On the top surface of the heat sink 2 is provided a partition plate 31 with a cross planar shape with the intersection portion 31a positioned at the center of the heat sink 2. In each region sectioned off by the partition plate 31 are provided a plurality of pin-shaped heat-radiating fins 4, 4 . . . at equal pitches. By this, the heat radiating portion of the heat sink 2 is sectioned off radially. This partition plate 31 is provided so that the cooling air blown out from the later mentioned cooling fan unit 3 will not strike the base end of the heat-radiating fins 4, that is, the base surface 12 of the heat sink 2 to interfere with other flows and thereby reduce the cooling efficiency, but is provided at a suitable height from the base surface of the heat sink 2.

On the other hand, the cooling fan unit 3 is formed with a fan 3b accommodated in a casing 3a. For example, in the case of the push system, as shown by the arrow marks in FIG. 23(A), the surrounding air is sucked in from above and forcibly exhausted to the heat sink 2 side. This cooling fan unit 3 is affixed to the heat sink 2 through an enclosing wall 33 comprised of a cylinder. A clearance 32 of suitable dimensions is formed at the bottom edge, more specifically, between the bottom end of the fan 3b and the top end surface of the heat sink 2.

Accordingly, in this embodiment, the cooling air forcibly blown from the cooling fan unit 3 is sent through the clearance 32 surrounded by the enclosing wall 33 to the heat-radiating fins 4, 4 . . . of the heat sink 2 and cools the heat sink 2 absorbing the heat emitted by the heat-generating element 1. The cooling air passing through the clearance 32 reaches not only near the outer circumference of rotation of the fan 3b by the action of the clearance 32, but diffuses uniformly until reaching the center portion and covers the entire surface of the heat sink 2.

Figure 23B:
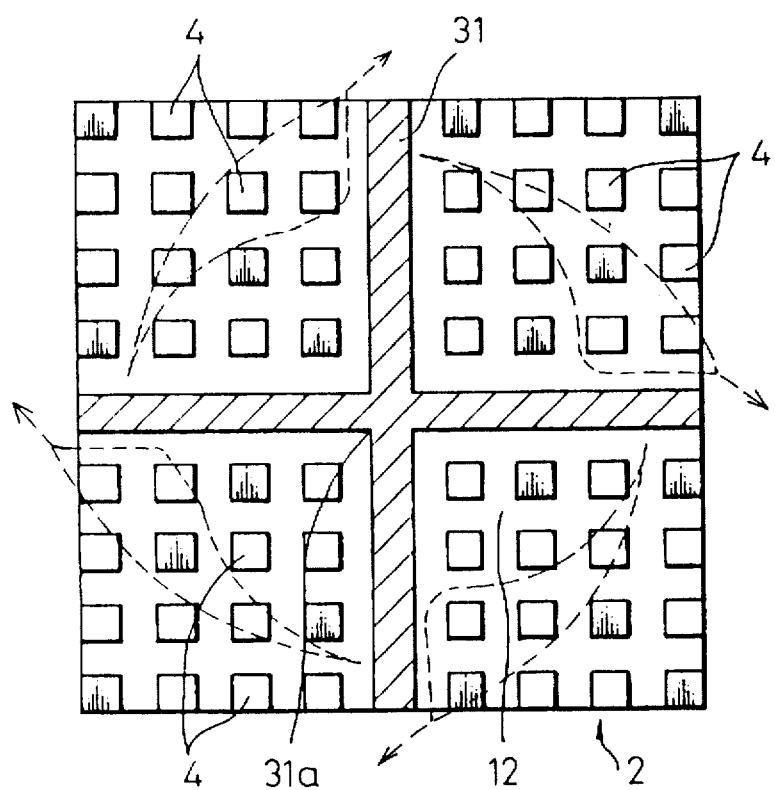

Further, the cooling air blown out from the cooling fan unit 3 strikes the base end of the heat-radiating fins, that is, the base surface 12 of the heat sink 12, then as shown by the arrow marks in FIG. 23(B), passes through the plurality of the heat-radiating fins 4,4 . . . and is discharged to the outside from the outer circumferential edge of the heat sink 2, thereby cooling heat sink 2 in the process. At this time, the partition plate 31 restricts the path of discharge of the cooling air to the outside of the heat sink 2 and prevents a reduction of the cooling efficiency by the mutual collision of the cooling air.

Note that above the case was shown of provision of the partition plate 31 at the heat sink 2 and formation of the clearance 32 enclosed by the enclosing wall 33 between the heat sink 2 and the cooling fan unit 3, but it is also possible to improve the cooling efficiency without forming the clearance 32 between the heat sink 2 and the cooling fan unit 3 and just providing the partition plate 31 at the heat sink 2.

Further, the partition plate 31 is not necessarily limited to one of a cross shape as shown in FIG. 23(B). It may be a linear or Y-shape or any other suitable shape so long as it can radially and equally section off the surface of the heat sink 2.

Further, in the above embodiment, the enclosing wall 33 is formed by a cylinder separate from the heat sink 2 and the cooling fan unit 3, but it is not limited to this. It may also be formed integrally in advance at the heat sink 2 side or the casing 3a side of the cooling fan unit 3. Also, use may be made of a band-shaped member.

As clear from the above explanation, according to the heat-generating element cooling device of the present 35 invention, it becomes possible to make effective use of the cooling air from the cooling fan unit and possible to improve the overall cooling efficiency.

Figure 24A:
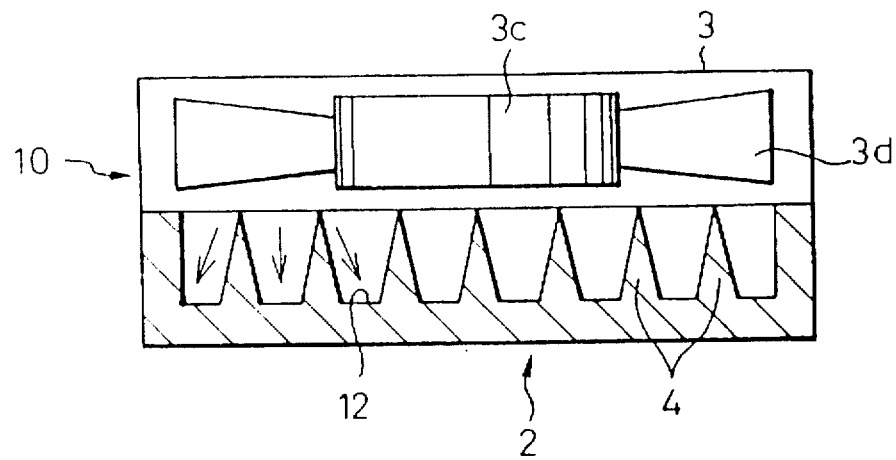
FIGS. 24(A) and 24(B) are view of a seventh embodiment of the heat-generating element cooling device according to the present invention, wherein 24(A) is a cross-sectional view and 24(B) is a plan view of the heat sink of the same.
Figure 24B:
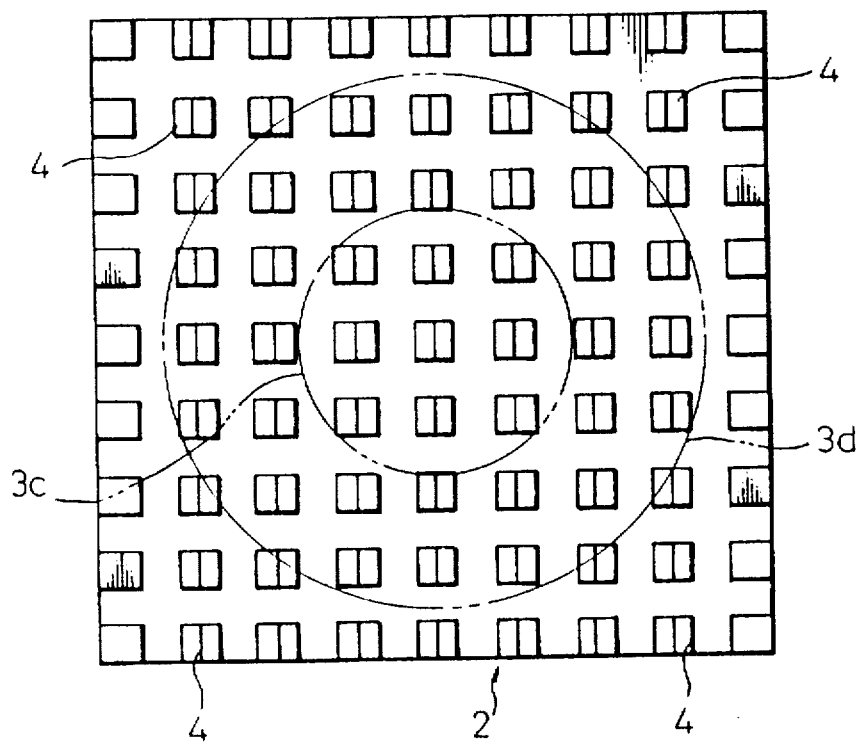

A seventh embodiment of the heat-generating element cooling device according to the present invention is shown in FIG. 24. In this embodiment, the heat-radiating fins 4 of the heat sink 2 are formed with the opposing two side surfaces inclined to form a pointed shape. Note that the cooling fan unit 3 has a motor 3c and fan blades 3d.

The present embodiment improves the cooling efficiency by facilitating the transfer of the cooling air from the cooling fan unit 3 to the base surface 12 of the heat-radiating fins. If the sectional area of the heat-radiating fins 4 is made smaller the further toward the front end, the shape does not necessarily have to be pointed, but to promote the introduction of the cooling air to the base surface 12 of the heat-radiating fins, it is preferable at least that the total area of the front end of the heat-radiating fins 4 be less than 20 percent of the overall area.

Further, in the above-mentioned embodiment, the inclined surfaces face the same direction, but formation of the inclined surfaces so as to face the center of the heat sink 2 is a preferable modification. Further, the sectional shape of the heat-radiating fins 4 may be rectangular, circular, or various other shapes.

Figure 25A:
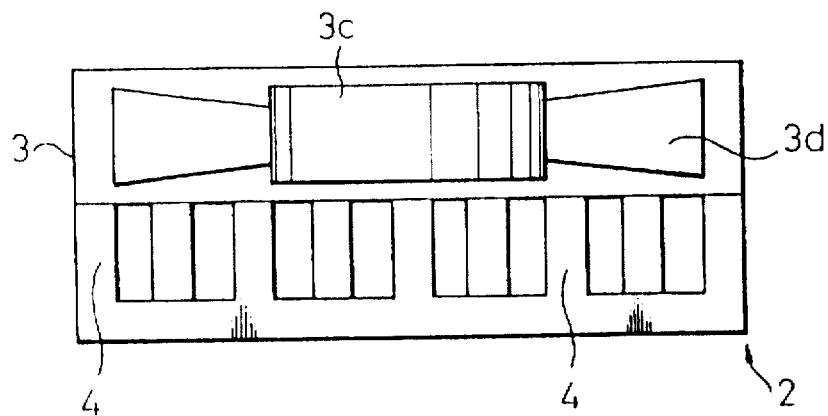
FIGS. 25(A) and 25(B) are view of a eighth embodiment of the heat-generating element cooling device according to the present invention, wherein 25(A) is a cross-sectional view and 25(B) is a plan view of the heat sink of the same.
Figure 25B:
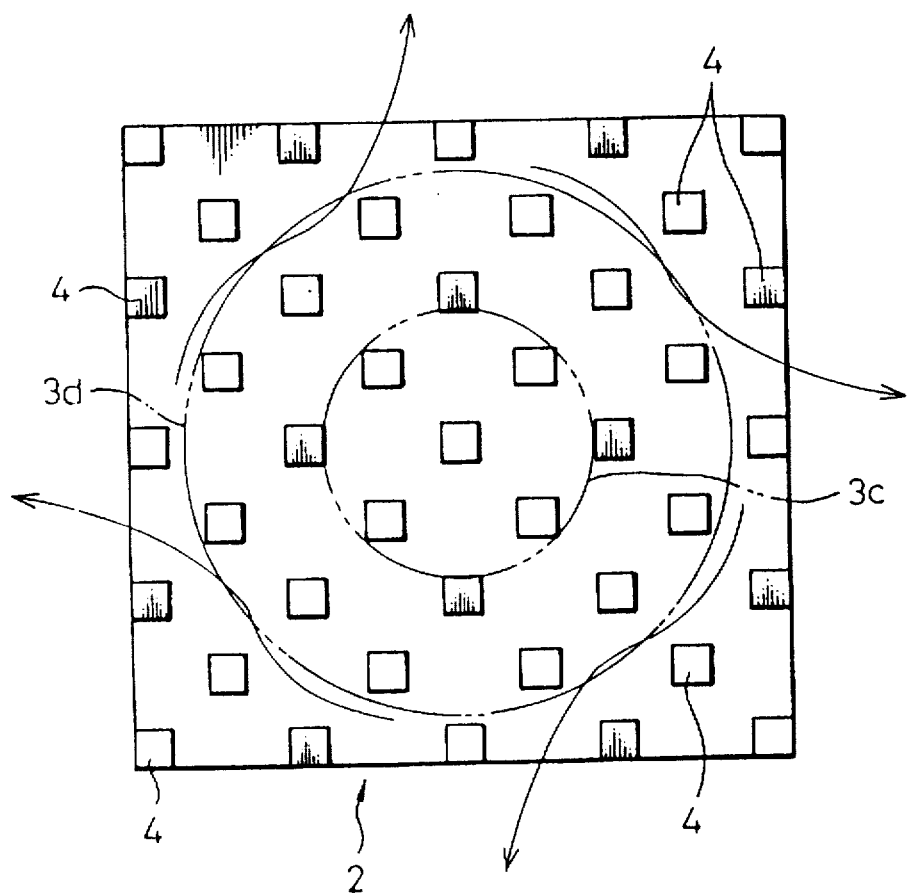

A eighth embodiment of the heat-generating element cooling device according to the present invention is shown in FIG. 25. In the embodiment explained below, the effective amount of air of the cooling fan unit 3 is made to increase by reducing as much as possible the pressure loss of the cooling air blown from the cooling fan unit 3, so in the illustrated embodiment, the heat-radiating fins 4 on the heat sink 2 are arranged in a state occupying every other intersection of a matrix-like grid, that is, in a staggered manner.

Figure 26A:
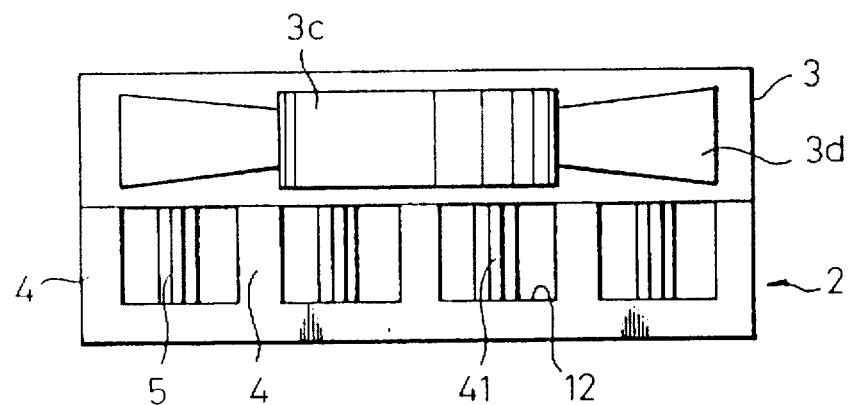
FIGS. 26(A) and 26(B) are view of an ninth embodiment of the heat-generating element cooling device according to the present invention, wherein 26(A) is a cross-sectional view and 26(B) is a plan view of the heat sink of the same.
Figure 26B:
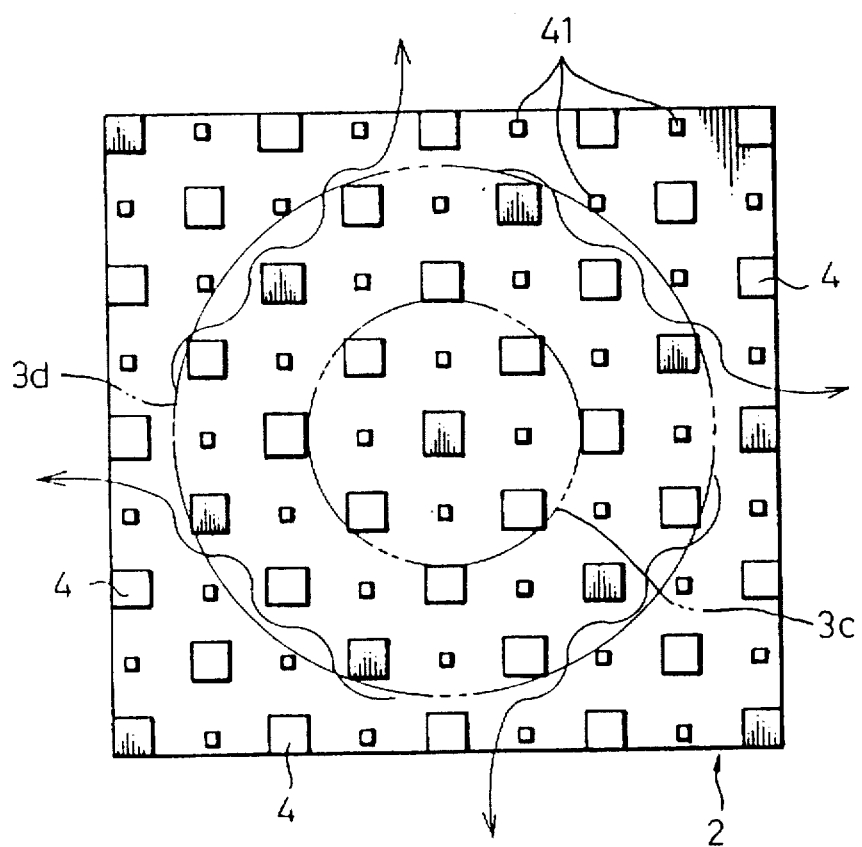

An ninth embodiment of the heat-generating element cooling device according to the present invention is shown in FIG. 26. This embodiment disposes auxiliary fins 41 with a small sectional area on the intersections of the grid not occupied by heat-radiating fins in the seventh embodiment mentioned above, so it is possible to increase the heat radiating area without increasing the pressure loss of the cooling air.

Figure 27:
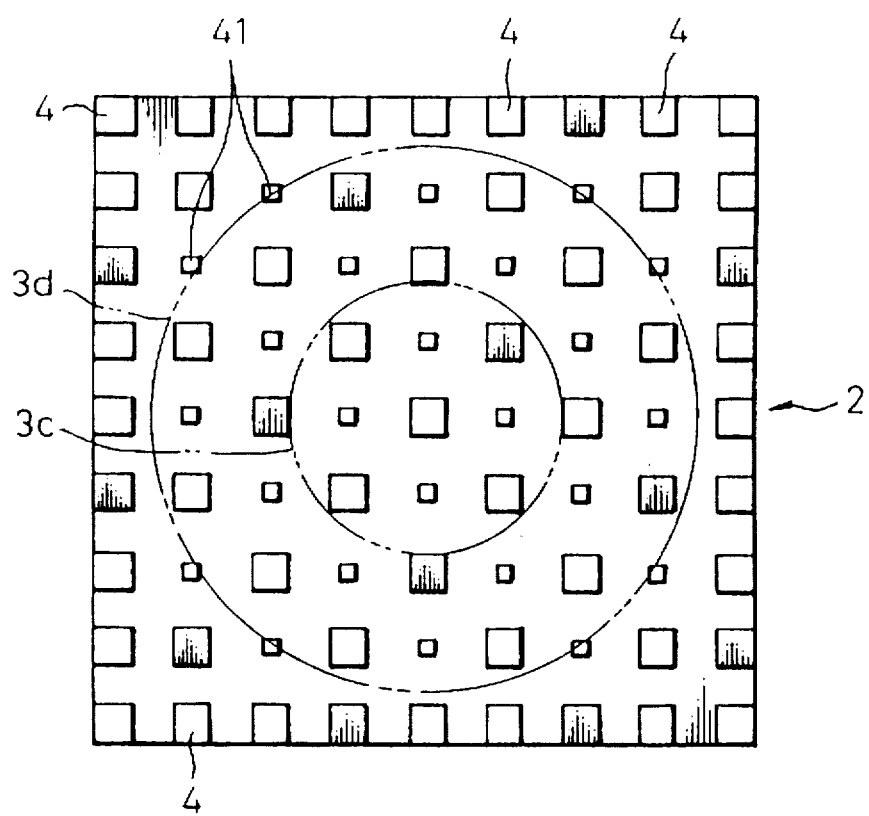
FIG. 27 is a view of a modification of FIG. 26.

Further, in this embodiment, as shown in FIG. 27, when disposing heat-radiating fins 4 in the same way as the usual heat sink 2 on the grid of the outer circumferential portion, passage of the cooling air above the heat sink 2 without contributing to cooling is prevented and therefore the cooling efficiency is improved further.

Figure 28A:
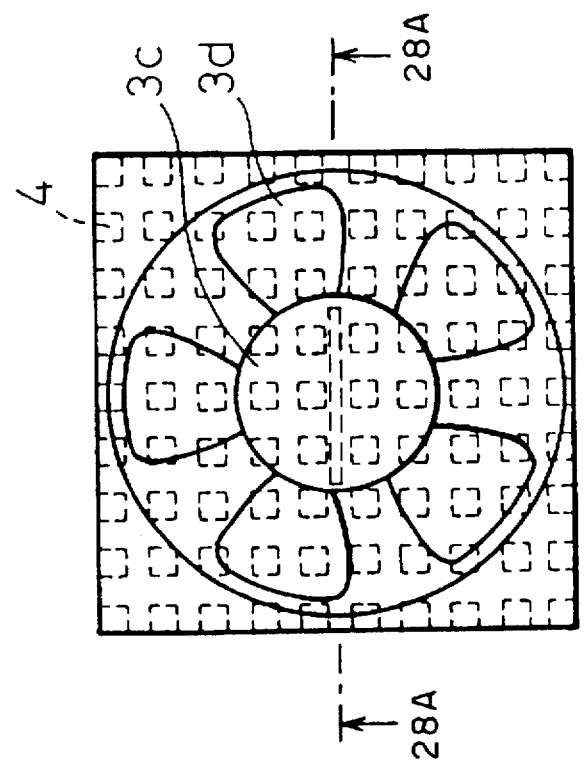
FIGS. 28(A) and 28(B) are a front cross-sectional view 28(A) and a top view 28(B) of the construction of a 10th embodiment of the heat-generating element cooling device according to the present invention.
Figure 28B:
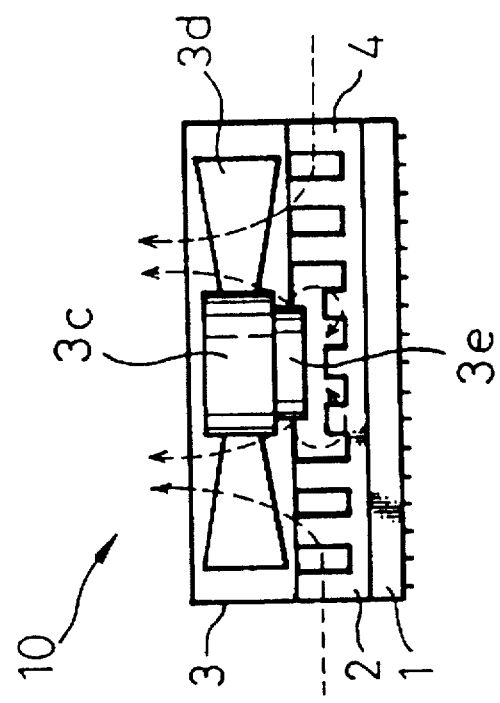
Figure 29:
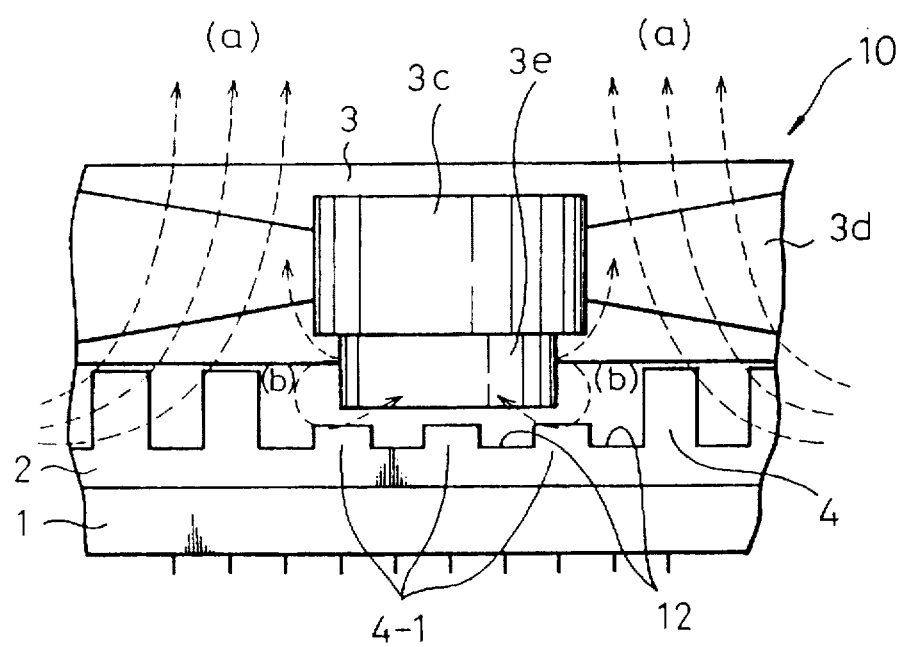
FIG. 29 is an enlarged cross-sectional view of the center portion of the front cross-sectional view of the cooling construction of FIG. 28.

FIG. 28 gives a front cross-sectional view (A) and a top view (B) of the construction of a 10th embodiment of the heat-generating element cooling device according to the present invention, while FIG. 29 is a sectional view along the section A—A of FIG. 28(B). This embodiment has a heat-generating element cooling device 10 comprised from an integral construction of the direct vertical mounting type fan and heat sink as shown in FIG. 28(A). Reference 1 shows for example an LSI package or other heat-generating element, 2 shows a heat sink formed by a material with a good heat conductivity, 4, . . . and 4-1, . . . show heat-radiating fins of the heat sink 2, 3 shows a small sized fan unit especially for the high heat-generating element, 3c shows a fan motor, 3d shows main blades, and 3e shows auxiliary blades. Note that the dotted arrow marks in the figure show the flow of the cooling air, that is, the air flow. The air flow illustrated is that of the case of the suck in type (pull system). In the case of the blow out type (push type), the air flow becomes the reverse direction.

In a construction such as the direct vertical mounting type where the fan rotational portion is in close proximity with the top of the heat sink (or the bottom), that is, the fan unit 3 and the heat-radiating fins 4, . . . face each other, the portion directly under the motor 3c becomes a cooling dead zone. Usually, the high temperature portion concentrating at the center portion is not directly cooled, so the cooling efficiency is reduced.

In particular, giving an explanation taking as an example the case of an LSI package, the circuit boards in recent high density mounting equipment such as personal computers and work stations are disposed at a high density at close intervals. In the case of a construction such as the direct vertical mounting type where the LSI package, that is, the heat-generating element 1, the heat sink 2, and the fan unit 3 are stacked over each other, the heat sink 2 cannot be formed thick. Therefore, the heat radiating effect from the center portion deteriorates and the center portion becomes high in temperature. There is the problem that the temperature distribution from the center portion of the heat-generating element 1 to the peripheral portions thereof cannot be made not to be greatly changed, that is, it is not possible to make sufficient "heat spreading". In addition, in the case of a ceramic package such as used for ordinary LSI packages, compared with an AlN (aluminum nitride) package etc., judging from the heat conduction characteristic, the spreading of heat at the generation of heat is essentially not sufficient and the spreading of the heat of the heat-generating element 1 is further inhibited.

In such a direct vertical mounting type cooling structure with insufficient heat spreading, the high temperature portion is located at the dead zone and therefore a reduction of the cooling efficiency is caused. This embodiment is for improving this point. Therefore, as shown in FIG. 28, provision is made of auxiliary blades 3e, . . . at the bottom of the fan motor 3c. FIG. 29 is an enlarged cross-sectional view of the center portion of the front sectional view of the cooling structure of the direct vertical mounting type shown in FIG. 28. Shown there are the air flows (a) and (b) in the pull system and the construction of the auxiliary blades 3e and the center portion fins 4-1.

The auxiliary blades 3e, as illustrated, are attached beneath of the fan motor 3c, but to disperse the air of the dead zone well, they may be provided suspended down or extended to the width of the heat sink 2 in the thickness direction, suitable intervals, for example, several millimeters, may be provided between the auxiliary blades 3e and base portion of the heat sink 2, and short fins 4-1, . . . may be disposed between them to maintain the heat radiating effect at the center portion of the heat-generating element 1. FIG. 30(A) to FIG. 30(G) are bottom views illustrating various shapes of auxiliary blades 3e. These blades are disposed radially from the center of rotation, but include not only (A), (B), (C), and (G) disposed with point symmetry, but also (F) not necessarily point symmetric and (D) and (E) provided only partially.

According to this embodiment, the dead zone portion is agitated by the auxiliary blades 3e and the air is discharged outside by centrifugal force, whereby as shown in FIG. 29, air flows (b) are created at the dead zone of the center portion and dispersion of heat is promoted. By this, along with the air flows (a) pulled out from the peripheral portions to the center portion by the fan main blades, the heat dispersion of the heat-generating element 1 is equalized and spreading of the heat of the heat-generating element 1 is promoted. Further, the cooling efficiency can be made higher. Also, according to the construction of this embodiment, it is possible to use a lower speed fan due to the improved cooling efficiency, so the noise of the equipment can be reduced and further a contribution may be made to a prolonged lifetime of the equipment as a whole.

Note that the cooling structure of this embodiment is particularly effective when used for the pull system, but also exhibits a significant effect even for the push system.

Figure 31A:
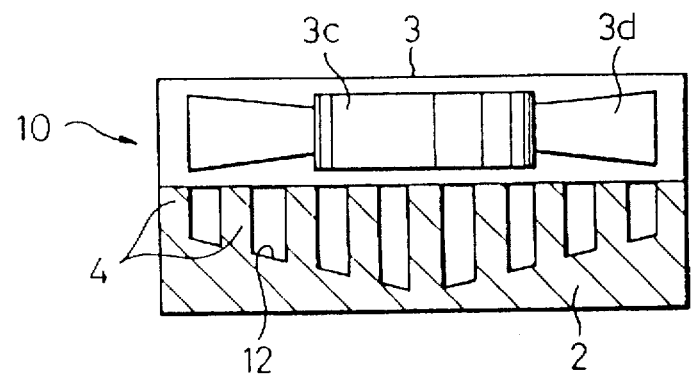
FIGS. 31(A) to 31(C) are views of a 11th embodiment of the heat-generating element cooling device according to the present invention, wherein 31(A) is a cross-sectional view, 31(B) is a side sectional view, and 31(C) is a plan view.
Figure 31B:
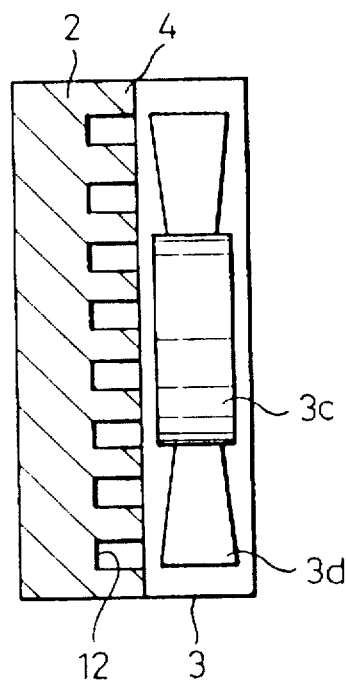
Figure 31C:
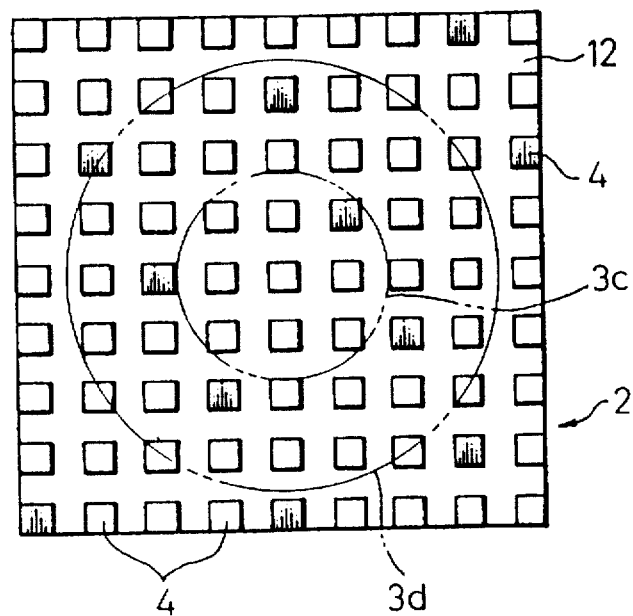

FIG. 31 shows a 11th embodiment of the heat-generating element cooling device according to the present invention, wherein (A) is a cross-sectional view, (B) is a side sectional view, and (C) is a plan view. In this embodiment, the heat-generating element cooling device 10 is comprised of a heat sink 2 formed by a material with good heat conductivity such as an aluminum material and a cooling fan unit 3 formed integrally.

The cooling fan unit 3 drives the rotation of the fan blades 3d by a motor 3c disposed at the center portion and blows cooling air downward. It is mounted above the heat sink 2 by a suitable means, not shown. On the other hand, the heat sink 2 is formed with a plurality of pin-shaped heat-radiating fins 4, 4 . . . projecting from its top surface and is joined to the heat sink surface of the heat-generating element using a heat conductive compound or adhesive.

In this embodiment, the heat-radiating fin base surface 12 of the heat sink 2 is formed by two inclined surfaces in a V-shape so that the center line of the heat sink 2 becomes the bottommost point. It is given a valley-like depression which becomes lower the further to the center line.

Note that in the illustrated embodiment, the heat-radiating fin base surface 12 is given a downward slope toward the center line along with the V-shape, but it is not limited to this. It is also possible to form it so it becomes lower along a curved surface etc. toward the center point. Further, it is not limited to a valley-like depression. It may also be formed to a conical or pyramidal depression.

Figure 32A:
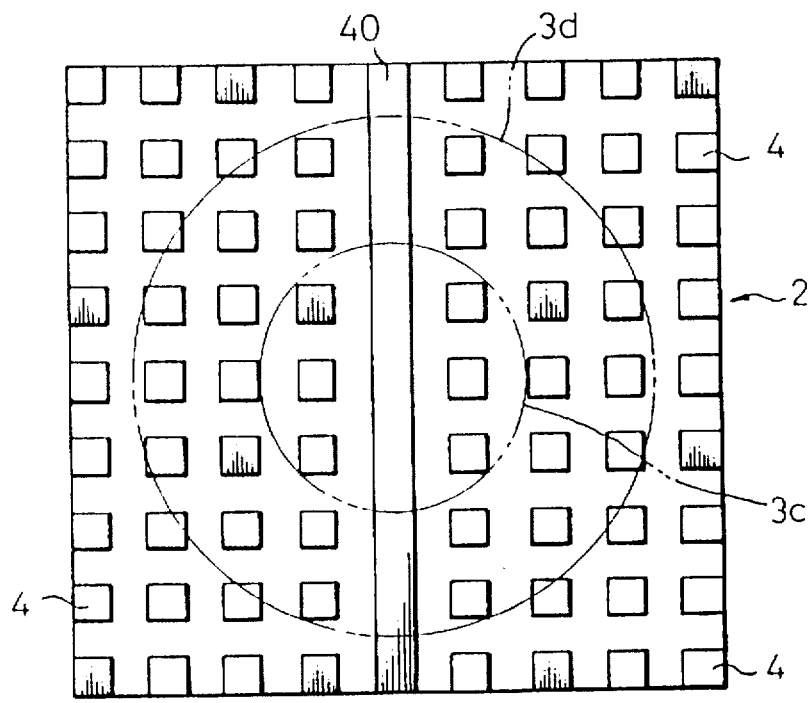
FIGS. 32(A) and 32(B) are plan views of two modifications of FIG. 31.
Figure 32B:
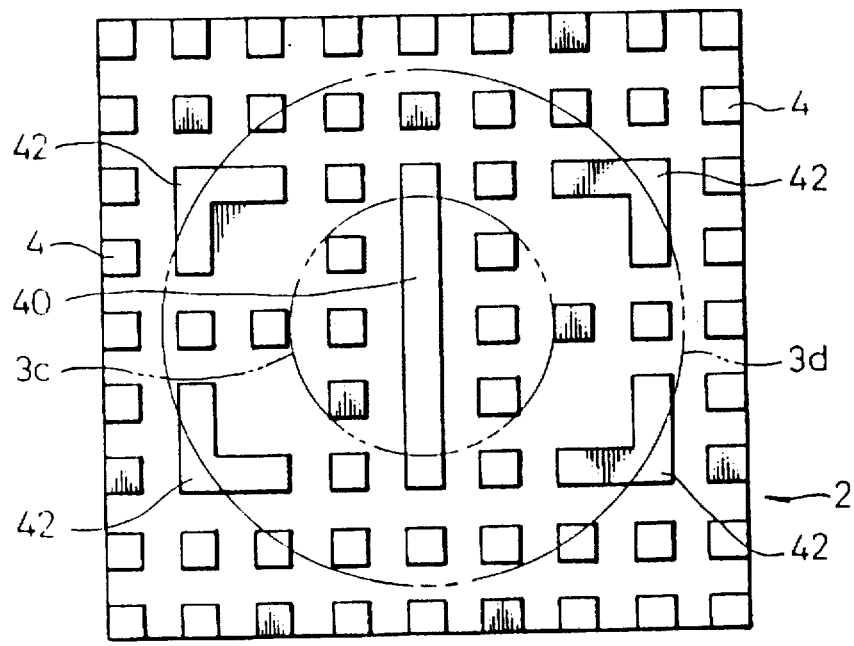

FIG. 32(A) shows a modification of the embodiment mentioned above. In this modification, a linear partition plate 40 is provided on the center line of the heat sink 2. This partition plate 40 functions both to suppress the interference of the cooling air from the two ends and at the same time as a heat-radiating fin 4. Further, as shown in FIG. 32(B), by providing an L-shaped heat-radiating fin-cum-guide plate 42 at the center portion, it is possible to collect the surrounding cooling air at the center.

FIG. 33 gives a top view, front view, and side view of the construction of an 12th embodiment of the heat-generating element cooling device according to the present invention, while FIG. 34 is a front cross-sectional view along the section A—A of FIG. 33. This embodiment also has an integral construction of a direct vertical mounting type fan and heat sink as shown in FIG. 4(A). Only the construction of the heat sink 2 having the heat-radiating fins 4 and the fan unit 3 is shown. The heat-generating element 1 is omitted. In this embodiment, further, as shown by the dotted arrow marks in FIG. 34, use is made of a push system wherein the cooling air is blow to the heat-radiating fins 4, . . . and air flows (c) are caused.

In this embodiment, to lighten the reduction in the cooling efficiency due to the dead zone in a direct vertical mounting type cooling structure similar to that mentioned above, the base surface 12 of the heat sink 2 is inclined conically or pyramidally so that the center portion becomes lower and the heat-radiating fins 4, . . . are formed so that the heat-radiating fins 4-2 at the center portion become longer than those at the peripheral portions. By this, a difference in the fluid pressure is created between the peripheral portions and the center portion and the cooling air is collected at the center portion. At the same time, as shown in FIG. 33 and FIG. 34, a heat pipe 50 is disposed for example in a spiral shape along the inclined base surface 12 and to extend over the entire surface from the center portion to the peripheral portions. Further, as the method of mounting the heat pipe 50, there are the buried mounting method where a groove is provided in advance in the base surface 12 of the heat sink 2 and the method of directly laying and soldering it on the base surface 12.

FIG. 35 gives a top view, front view, and side view of a modification of the embodiment. In this modified embodiment, the base surface 12 of the heat sink 2 is formed by two inclined surfaces 12-1, 12-1. The heat pipe 50, for example, as shown in the figure, is disposed so that the main heat pipe 51 is placed at the bottom of the V-section base surface 12-1 and the sub-heat pipes 52, . . . are connected in accordance with the inclination of the base 12-1 from there.

According to the cooling structure of this embodiment, due to the construction of the heat sink 2 having the inclined base surface 12 or 12-1, the cooling air is pulled toward the center portion of the element. Also, by lowering the resistance of the blowing of the center portion, the air speed is increased and the radiation of high temperature at the center portion of the element where heat spreading is insufficient is promoted. Also, the high temperature of the center portion is conducted by the heat pipe 50 or 51 and 52 to the relatively low temperature portions around the element to disperse the heat emitted at the center portion to the surroundings. By this, the heat spread of the heat-generating element 1 is further promoted. Also, by the rise of the temperature of the outer circumferential portions of the heat sink, the amount of heat radiated to the outside increases and therefore the cooling efficiency is improved.

Note that as a modification of the base surface 12 of the heat sink 2 formed in a conical shape or pyramidal shape in this embodiment, this may be formed in a spiral step shape and the heat pipe 50 may be disposed along the steps. The heat pipe 50 may also be disposed radially along the conically or pyramidally shaped base surface 12. Further, the cooling structure of this embodiment is particularly effective when used for the push system, but can also exhibit a significant effect for the pull system.

Figure 36:
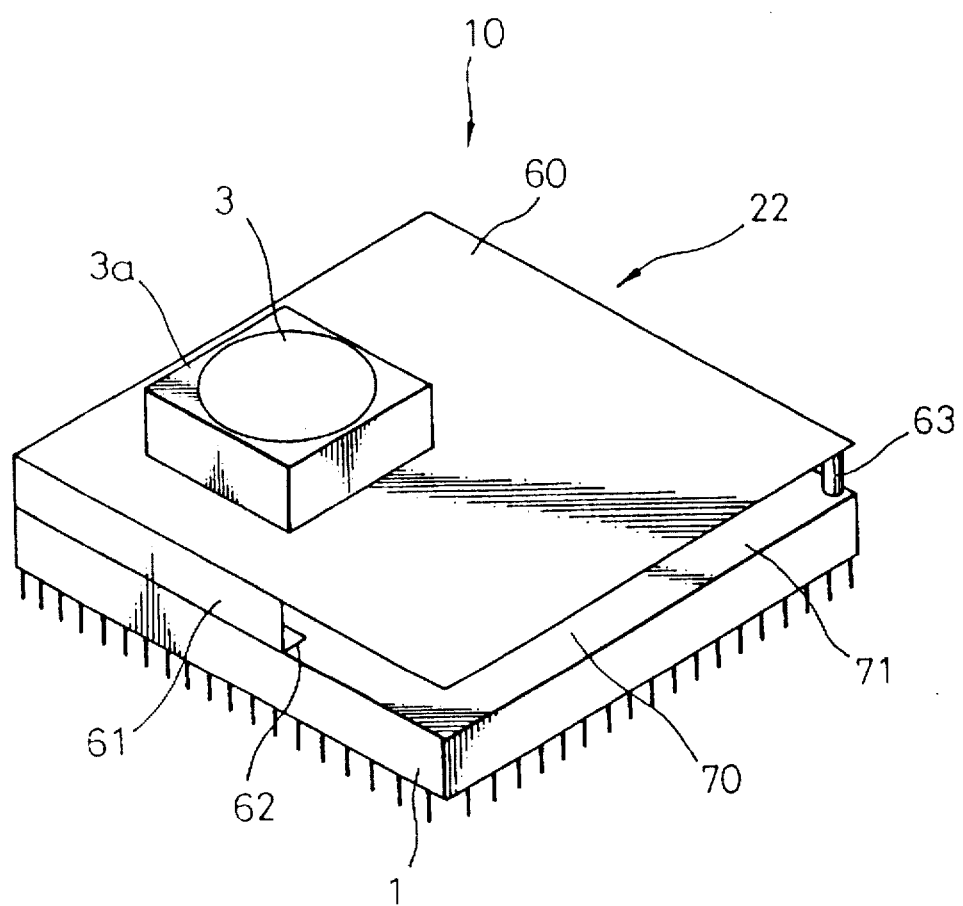
FIG. 36 is a perspective view of a 13th embodiment of the heat-generating element cooling device according to the present invention.
Figure 37A:
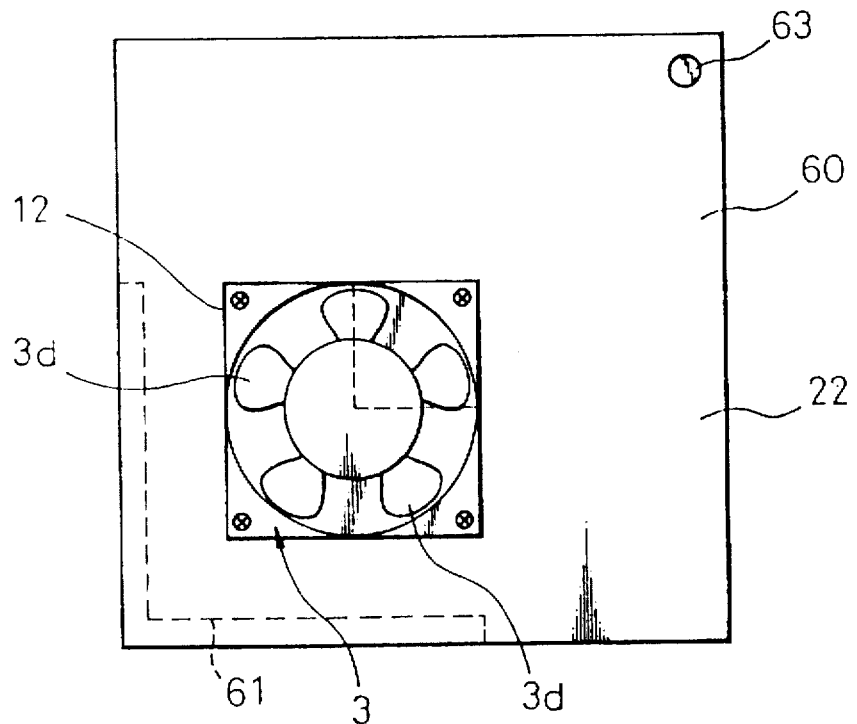
FIGS. 37(A) and 37(B) are views showing details of FIG. 36, wherein 37(A) is a plan view and 37(B) is a side view.
Figure 37B:
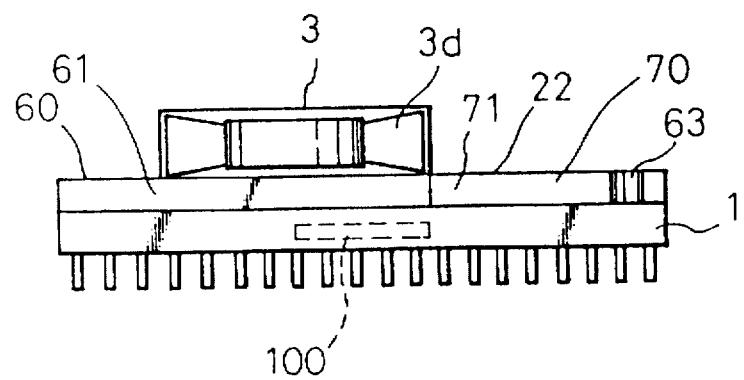

FIG. 36 and FIG. 37 show a 13th embodiment of the heat-generating element cooling device according to the present invention. In the figure, 1 shows a heat-generating element mounted on a printed circuit board, above which a cover member 22 is disposed.

In this embodiment, the cover member 22 has a cover 60 affixed to the heat-generating element 1. On its top surface is mounted a fan unit 3 so that the blowing outlet of a fan is in register with the blowing opening made at a suitable location of the cover 60. The fan unit 3 is formed with a blowing fan accommodated in a casing 3a. To enable replacement at the time of a breakdown, the unit is mounted to the cover 60 by screws etc. at the four corners of the casing 3a or on diagonals of the same.

Further, so the cooling air blown from the fan blows directly against the high heat emitting portion 100 of the heat-generating element 1 shown by the broken line in FIG. 37, the fan unit 3 is provided offset with respect to the center of the heat-generating element 1, that is, is disposed off-center, so that the blades 3d of the fan come directly above the high heat emitting portion 100.

The cover 60 supporting the fan unit is formed by injection molding by a plastic material or by bending sheet metal. At the side edges of the two sides of the corner which the fan unit 3 is placed in close proximity with due to the fan unit 3 being disposed off-center, a separating wall 61 is formed by bending etc. along approximately two-thirds of each of the side edges.

Here, the cover member 22 mounting the fan unit 3 is adhered to the top surface of the heat-generating element 1 so as to be affixed on the heat-generating element 1 by the flange 62 (see FIG. 36) formed by bending inward the bottom edge of the separating wall 61 and the auxiliary supporting portion 63 provided at a diagonal position with respect to the separating wall 61. In this construction, part of the side edge between the heat-generating element 1 and the cover 60 of the cover member 22 is closed by the separating wall 61. At the remaining part of the side edge is formed the clearance 70 serving as the exhaust opening 71.

Accordingly, in this embodiment, if the fan unit 3 is driven to blow the cooling air to the clearance 70 such as with the push system, for example, the cooling air is blown downward toward the top surface of the heat-generating element 1 to cool the heat-generating element 1, then flows outside from the exhaust opening 71. At this time, the separating wall 61 prevents the cooling air from being immediately discharged outside from the clearance 70 without contributing to the cooling. The cover 60 functions to reflect back to the heat-generating element 1 side again the cooling air reflected back after striking the heat-generating element 1. These both contribute to the improvement of the cooling efficiency.

Note that in this embodiment, the case is shown where the fan unit 3 is provided at a position offset from the center of the heat-generating element 1 so that the cooling air from the fan unit 3 will directly blow against the high heat emitting portion 100 of the heat-generating element 1, but when a sufficient amount of cooling air can be supplied from the fan unit 3, the fan unit 3 may also be disposed at the center of the heat-generating element 1. In this case, preferably the separating wall 61 is provided at the side edges so that the cooling air passes through the clearance 70 as a whole.

Figure 38A:
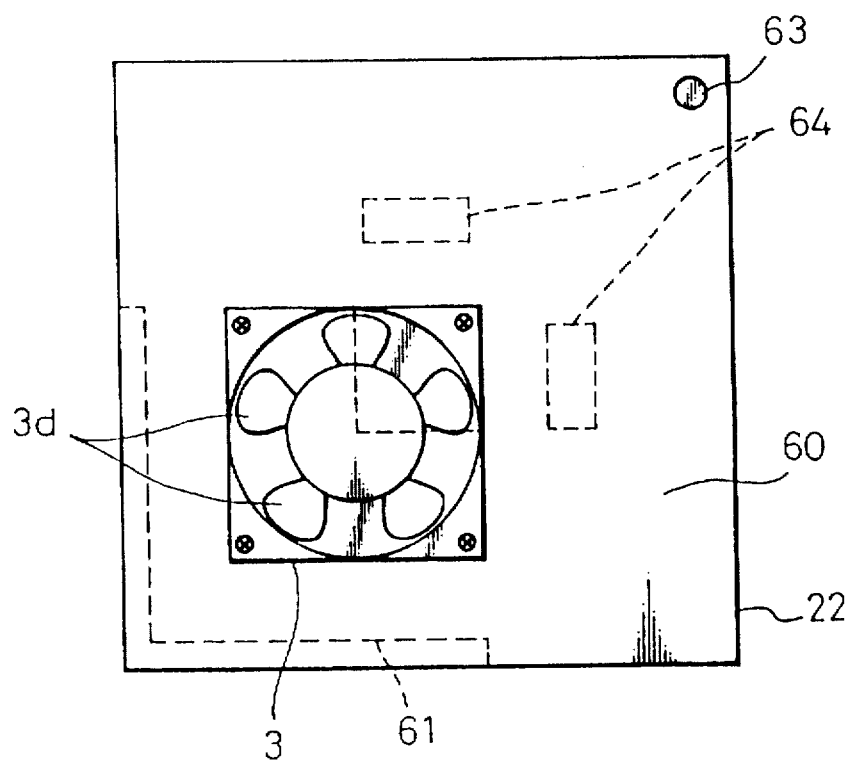
FIGS. 38(A) and 38(B) are views of a 14th embodiment of a heat-generating element cooling device according to the present invention, wherein 38(A) is a plan view and 38(B) is a side view.
Figure 38B:
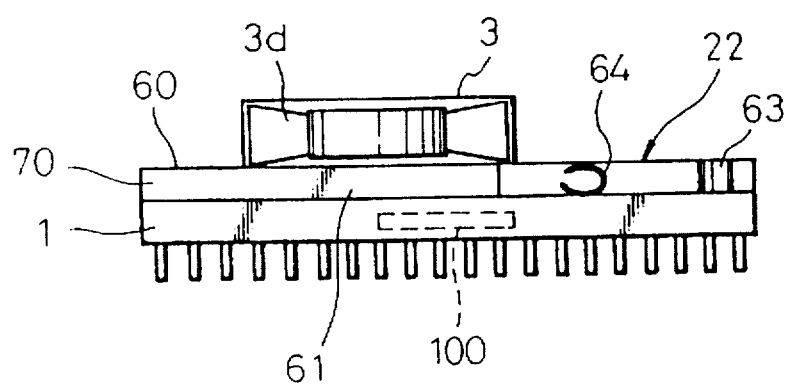

FIG. 38 shows a 14th embodiment of a heat-generating element cooling device according to the present invention. The cover member 22 according to this embodiment is formed by a material with a good heat conductivity such as sheet metal. At the back side of the cover 60 spring members 64 are affixed at suitable locations. The spring members 64 are formed of a material with a good heat conductivity and a good spring characteristic such as phosphor bronze. Their free height is made somewhat higher than the height of the clearance 70.

Accordingly, in this embodiment, in the state with the cover member 22 attached to the heat-generating element 1, the spring members 64 elastically deform and their free ends press against the top surface of the heat-generating element 1, so a heat path is formed conducting heat from the heat-generating element 1 through the spring members 64 to the cover member 22. As a result, the heat-generating element 1 is cooled by conduction by the heat path in addition to the cooling by the cooling air from the fan unit 3 and the cooling efficiency is improved more. Note that in this case, to improve the heat conduction of the center portion of the heat-generating element 1, that is, the high heat emitting portion 100, the spring members 64 are preferably provided in close proximity with the center of the heat-generating element 1.

Figure 39A:
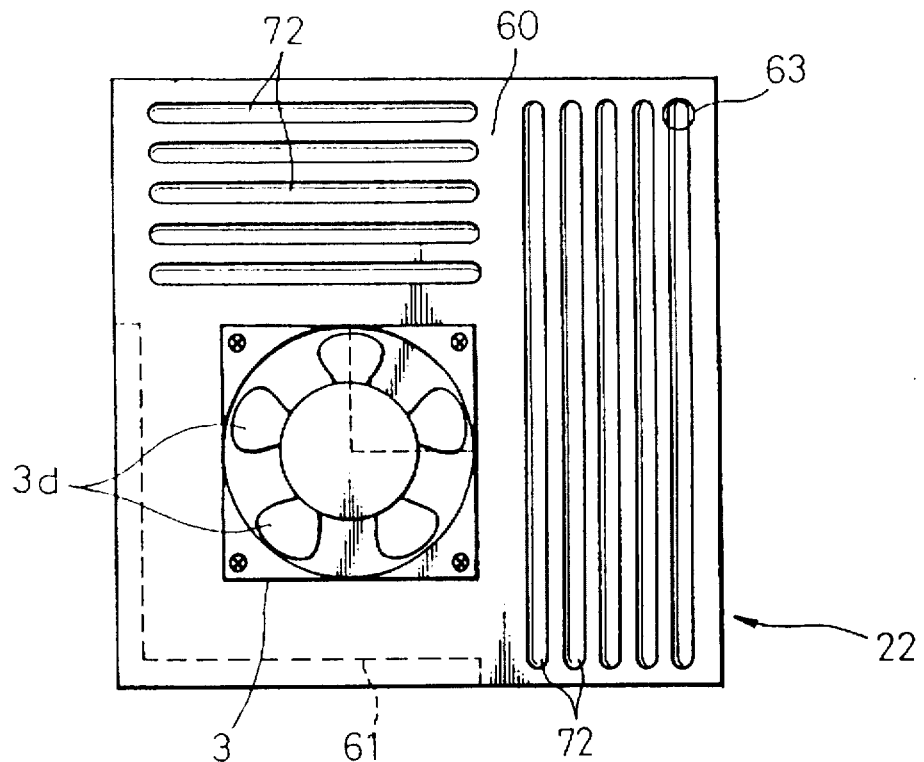
FIGS. 39(A) to 39(C) are views of a 15th embodiment of the heat-generating element cooling device according to the present invention, wherein 39(A) is a plan view, 39(B) is a side view, and 39(C) is an enlarged view of the C portion of 39(B).
Figure 39B:
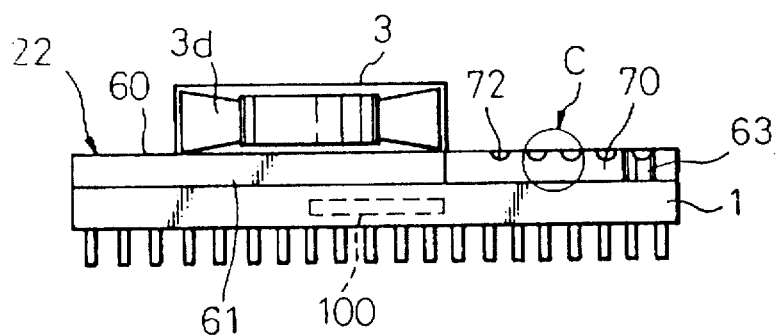

FIG. 39 shows a 15th embodiment of the heat-generating element cooling device according to the present invention.

Figure 39C:
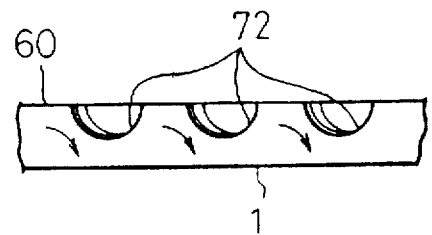

The cover 60 in this embodiment is provided with a plurality of ridges 72, 72 . . . projecting out at the clearance 70 side. These ridges 72 throttle the cooling air passing through the clearance 70 to raise the speed of the cooling air. Further, as shown in FIG. 39(C), they are provided so that the direction of the cooling air is made toward the surface portion of the heat-generating element 1, so these are disposed along the side edges of the fan unit 3.

Figure 40A:
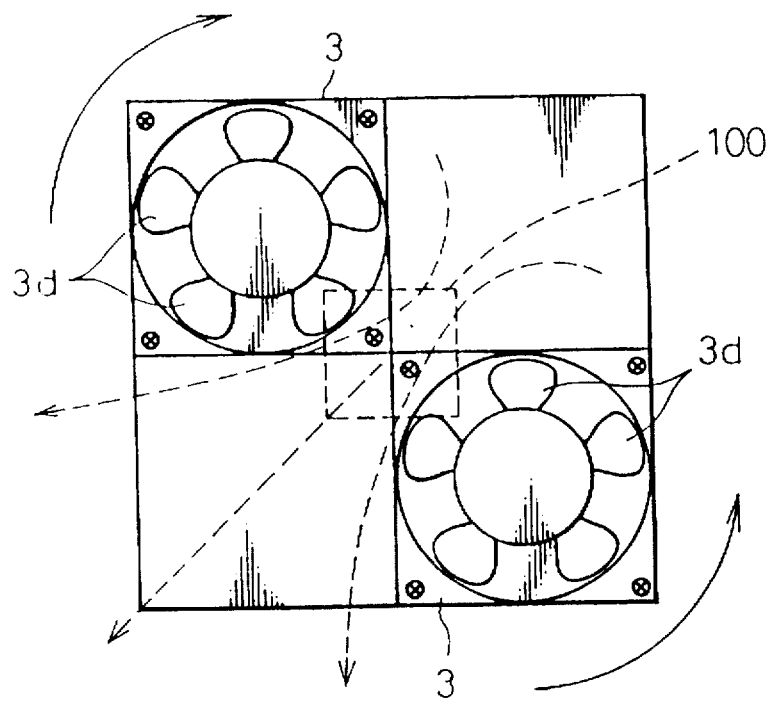
FIGS. 40(A) and 40(B) are views of a 16th embodiment of the heat-generating element cooling device according to the present invention, wherein 40(A) is a plan view and 40(B) is a side view.
Figure 40B:
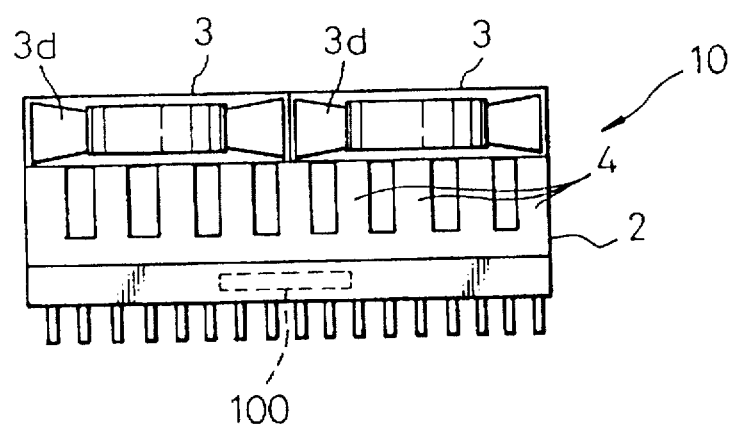

Next, a 16th embodiment of the heat-generating element cooling device according to the present invention is shown in FIG. 40. In this embodiment, the heat sink 2 is mounted on the heat-generating element 1. On the top surface of the heat sink 2 are provided a plurality of pin-shaped heat-radiating fins 4, 4 . . . . Fan units 3 are mounted above this. Two fan units 3 are mounted at diagonal positions with respect to the high heat emitting portion 100 and so that the blades 3d of the fan cover the high heat emitting portion 100. These are driven to rotate in opposite directions.

Figure 41:
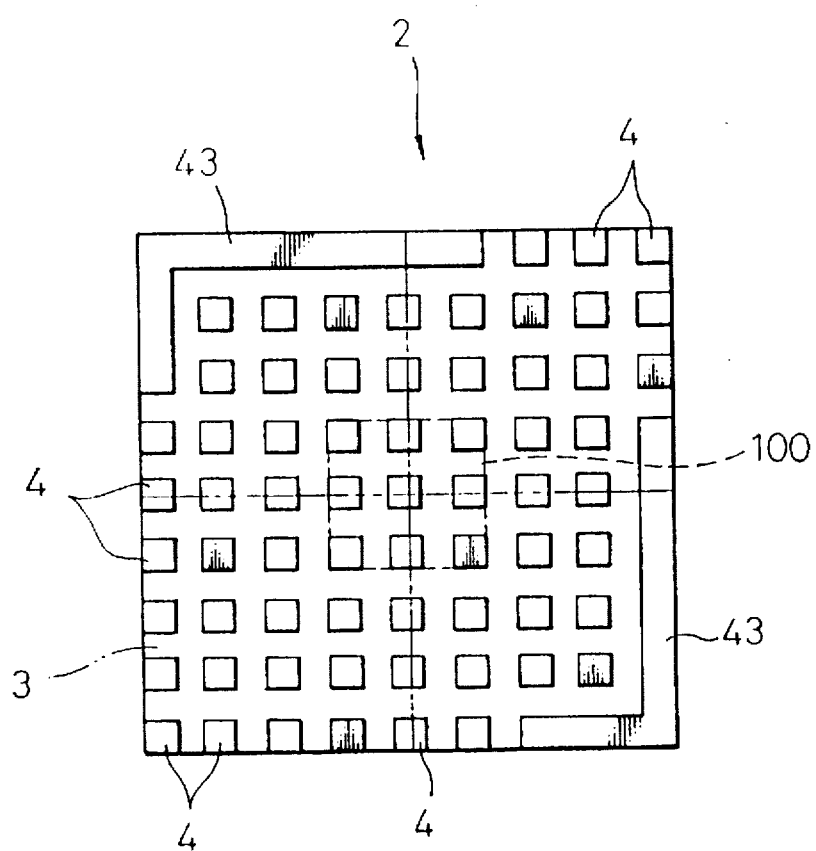
FIG. 41 is a plan view of the heat sink in the embodiment of FIG. 40.

Accordingly, in this embodiment, the cooling air blown from the two fan units 3 merge at the high heat emitting portion 100 to increase the amount of air as shown by the arrow marks in FIG. 40(A). Note that at the opposing corners of the heat sink 2, as shown in FIG. 41, L-section shaped side walls 43 corresponding to the side edges of the fan units 3 are formed so as to prevent the cooling air from being discharged to the outside of the heat sink 2 immediately without contributing to the cooling.

Figure 42A:
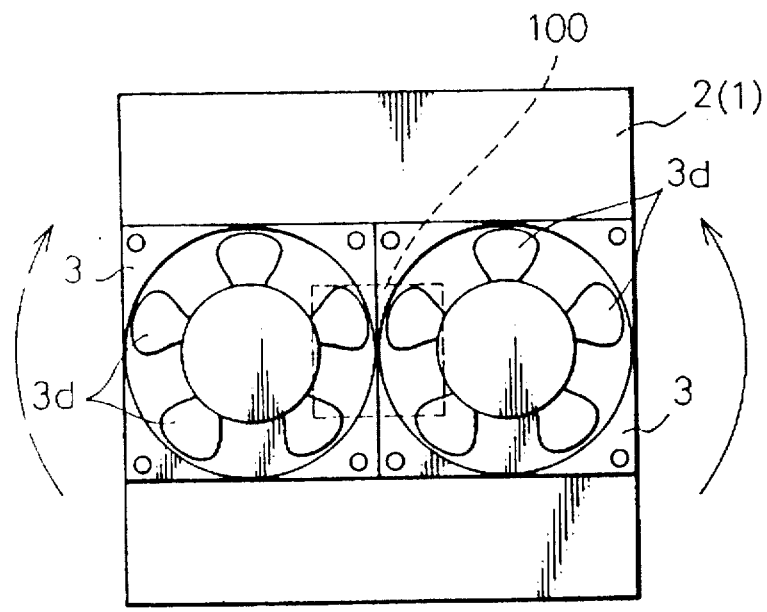
FIGS. 42(A) and 42(B) are views of a modification of FIG. 40, wherein 42(A) is a plan view and 42(B) is a plan view of the heat sink.
Figure 42B:
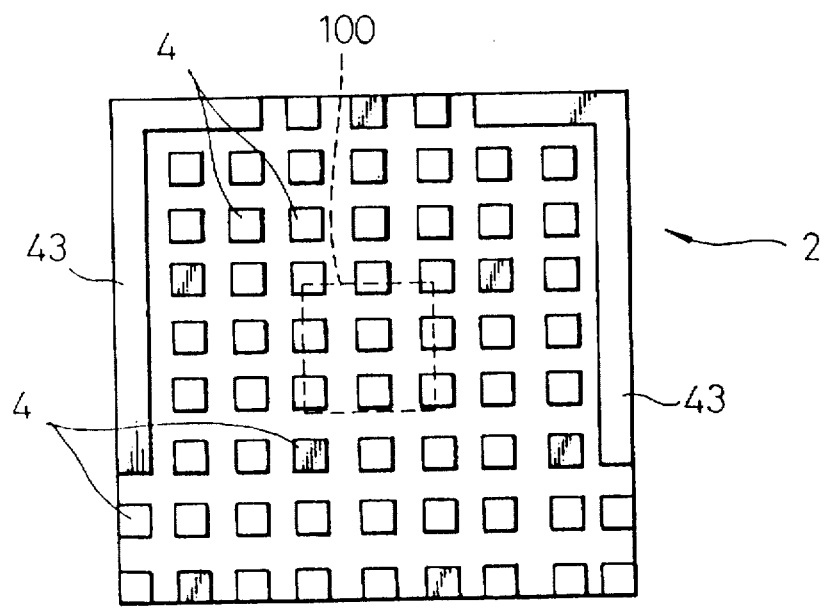
Figure 43A:
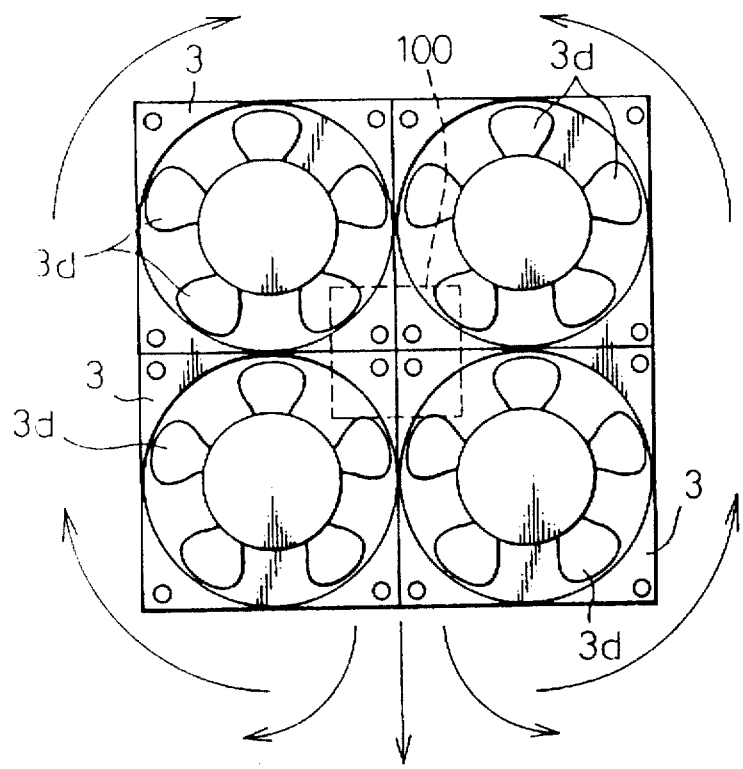
FIGS. 43(A) and 43(B) are views of another modification of FIG. 40, wherein 43(A) is a plan view and 43(B) is a plan view of the heat sink.
Figure 43B:
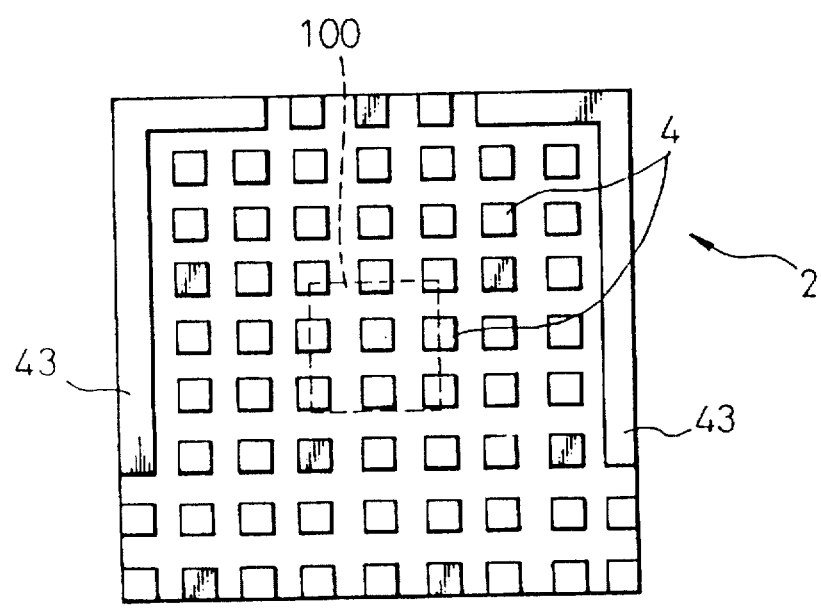

Further, FIG. 40 shows the case of disposing the fan units 3 at diagonal positions, but in addition, as shown in FIG. 42, it is possible to dispose two fan units 3, 3 aligned on the center line L of the heat-generating element 1. Further, the number of the fan units 3 is not limited to two. Three or, for example, as shown in FIG. 43, four, or even more may be provided. In any case, the fan units 34 are driven so that the cooling air collects at the center of the heat-generating element 1 as shown by the arrow marks in the figures. Also, the heat sink 2 is provided suitably with side walls 43 for preventing the cooling air from immediately being discharged outside of the heat sink 2 without contributing to the cooling.

Figure 44A:
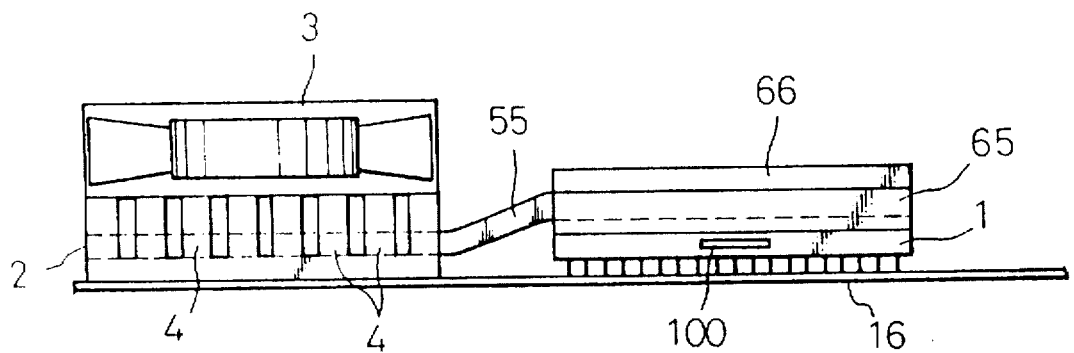
FIGS. 44(A) and 44(B) are views of a 17th embodiment of the heat-generating element cooling device according to the present invention, wherein 44(A) is a side view and 44(B) is a plan view.
Figure 44B:
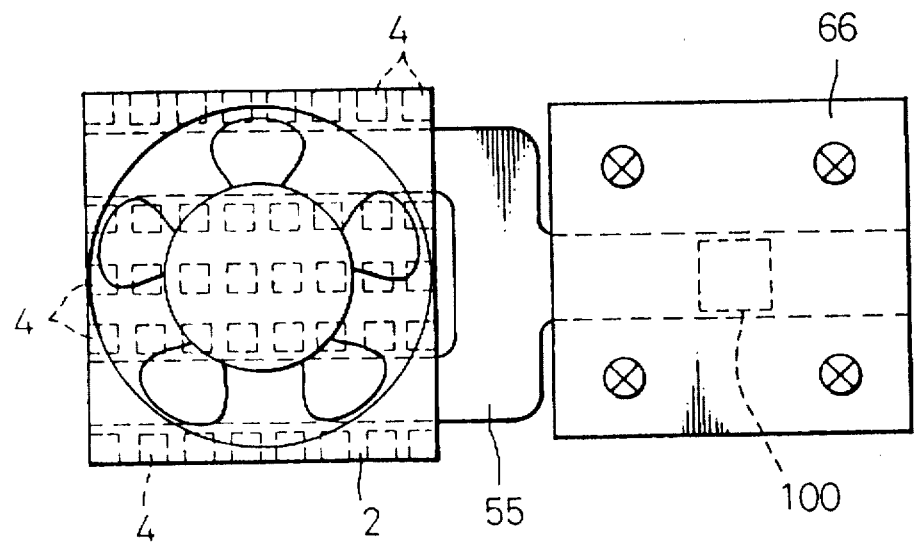
Figure 45:
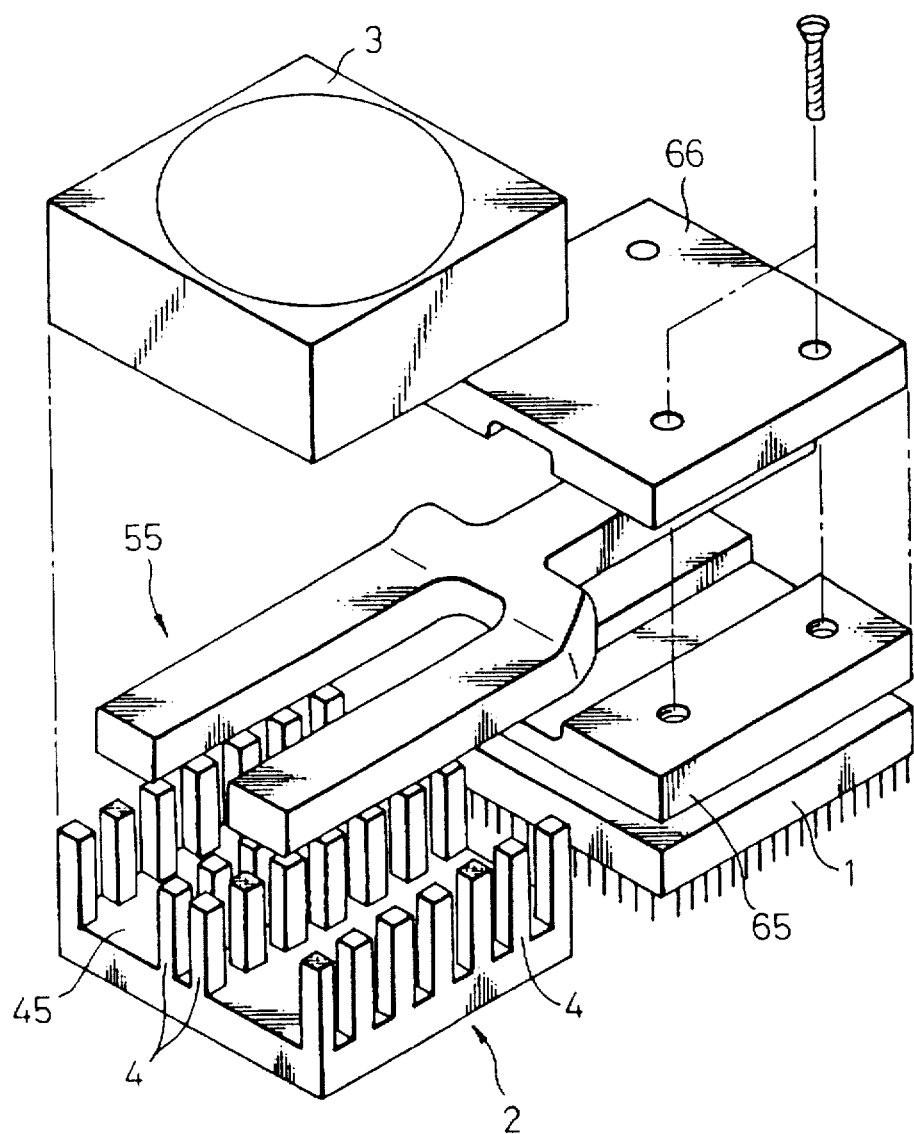
FIG. 45 is a disassembled perspective view of FIG. 44.

FIG. 44 and FIG. 45 give views of a 17th embodiment of the heat-generating element cooling device according to the present invention. This embodiment is a modification aimed at reducing the mounting height. In it, the heat sink 2 is affixed on the printed circuit board 16 adjoining the heat-generating element 1. A heat pipe 55 is laid between the heat sink 2 and the heat-generating element 1. In other words, the heat radiator portion is constructed disposed away from the heat-generating element 1.

The heat pipe 55 is formed by a copper pipe in which is sealed a working fluid such as a chlorofluorocarbon. One end is affixed to the top surface of the heat sink 2 and the other end is affixed to the heat-generating element 1. This heat pipe 55 is formed in a flat fork-shape branching at the heat sink 2 side so as to be directly struck by the cooling air from the fan unit 3 and cool above the high heat emitting portion 100 of the heat-generating element 1 at the heat-generating element 1 side. To house one end of the fork, the heat sink 2 is formed with a space 45 for fitting it where no pin-shaped cooling fins are provided. On the other hand, the heat-generating element 1 side is mounted on the top surface of the heat-generating element 1 sandwiched in between the base plate 65 affixed using for example an adhesive with a good heat conductivity and a fixing plate 66 screwed to the base plate 65.

By this construction, if the heat-generating element 1 emits heat, the working fluid inside the heat pipe 55 boils and absorbs the heat emitted by the heat-generating element 1. The bubbles caused by the boiling are cooled at the heat-radiating fin 4 side to liquify and are returned to the heat-generating element 1 side.

Figure 46A:
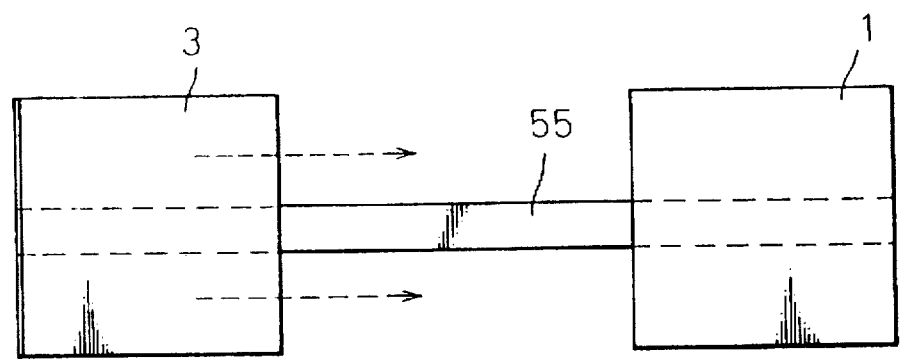
FIGS. 46(A) and 46(B) are views explaining the action of the embodiment of FIG. 44.
Figure 46B:
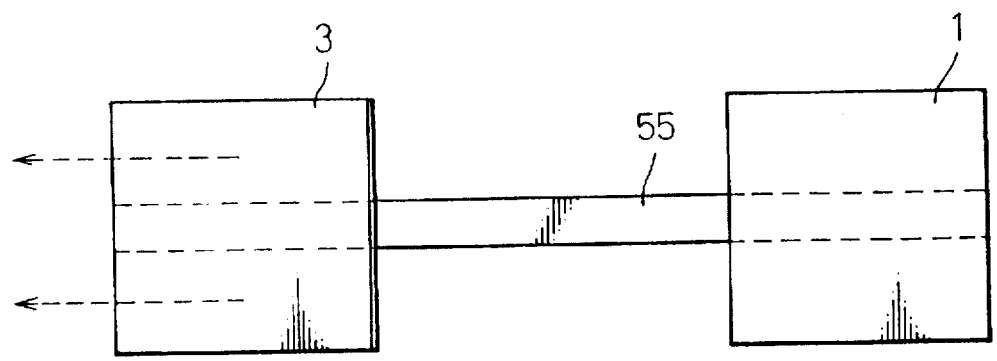

In this case, when the exhaust temperature from the heat sink 2 is low, as shown by the double line in FIG. 46(A), it is preferable to close the side edge of the side opposite to the heat-generating element 1, make the exhaust positively flow to the heat-generating element 1 side, and suppress the rise in temperature of the fixing plate 66. Conversely, when the exhaust temperature is high, as shown in FIG. 46(B), it is preferable to close the side edge of the heat-emitting element 1 side to prevent a rise in temperature of the heat-generating element 1 by the exhaust.

Further, it is possible to provide irregularities or heat-radiating fins at the top surface of the fixing plate 66 so as to assist the radiation of heat from the heat-generating element 1.

Figure 47A:
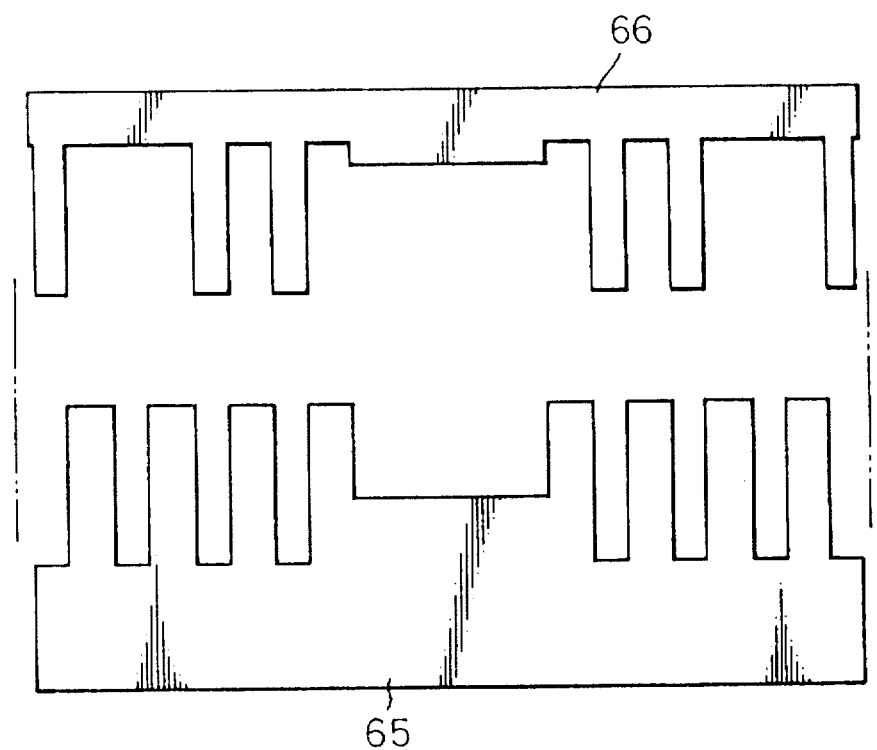
FIGS. 47(A) and 47(B) are views explaining the method of affixing the heat pipes, wherein 47(A) is a disassembled view and 47(B) is a side view of the assembled state.
Figure 47B:
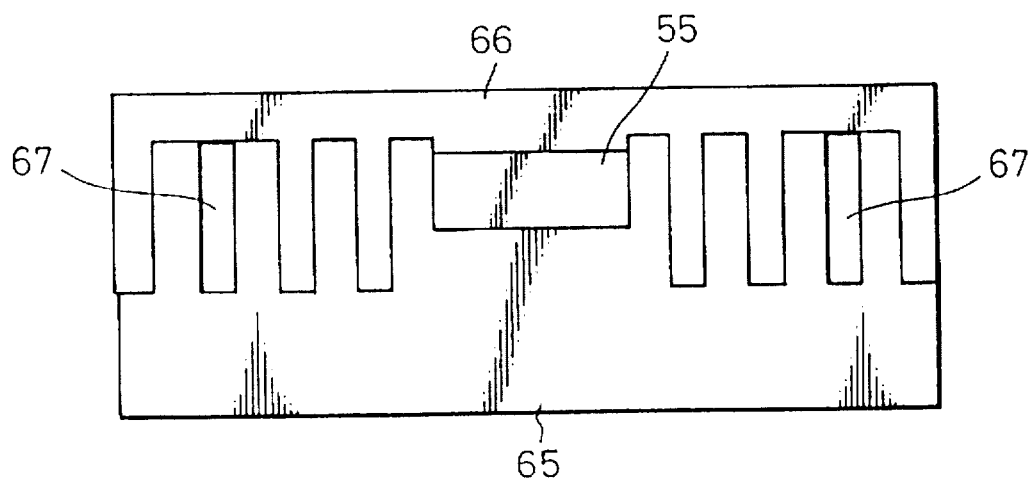
Figure 48:
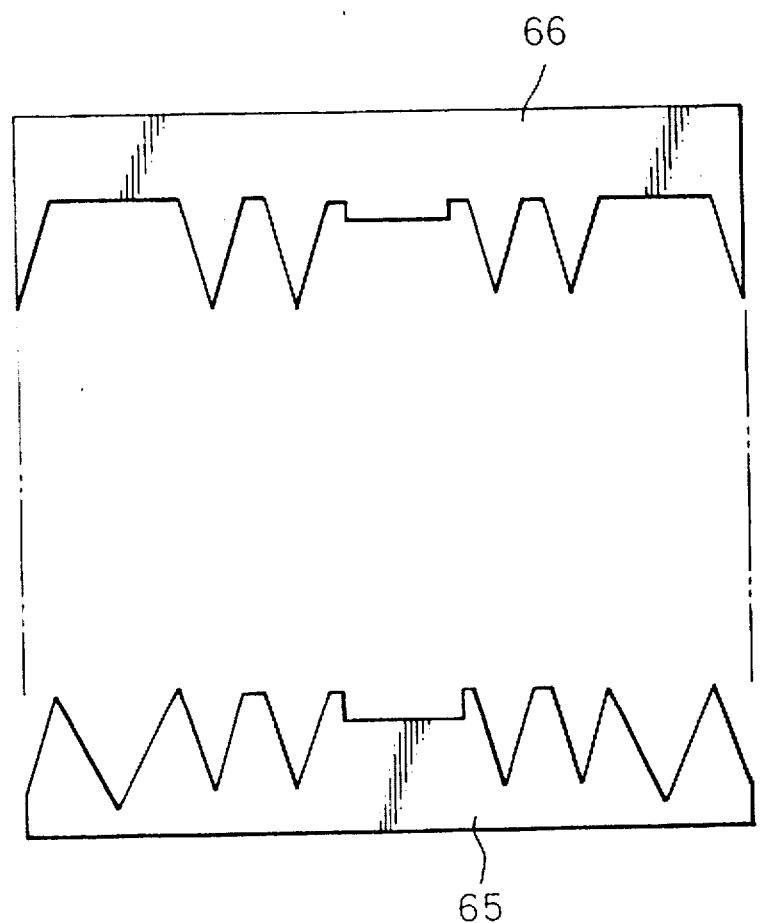
FIG. 48 is a view explaining a modification of FIG. 47.
Figure 49:
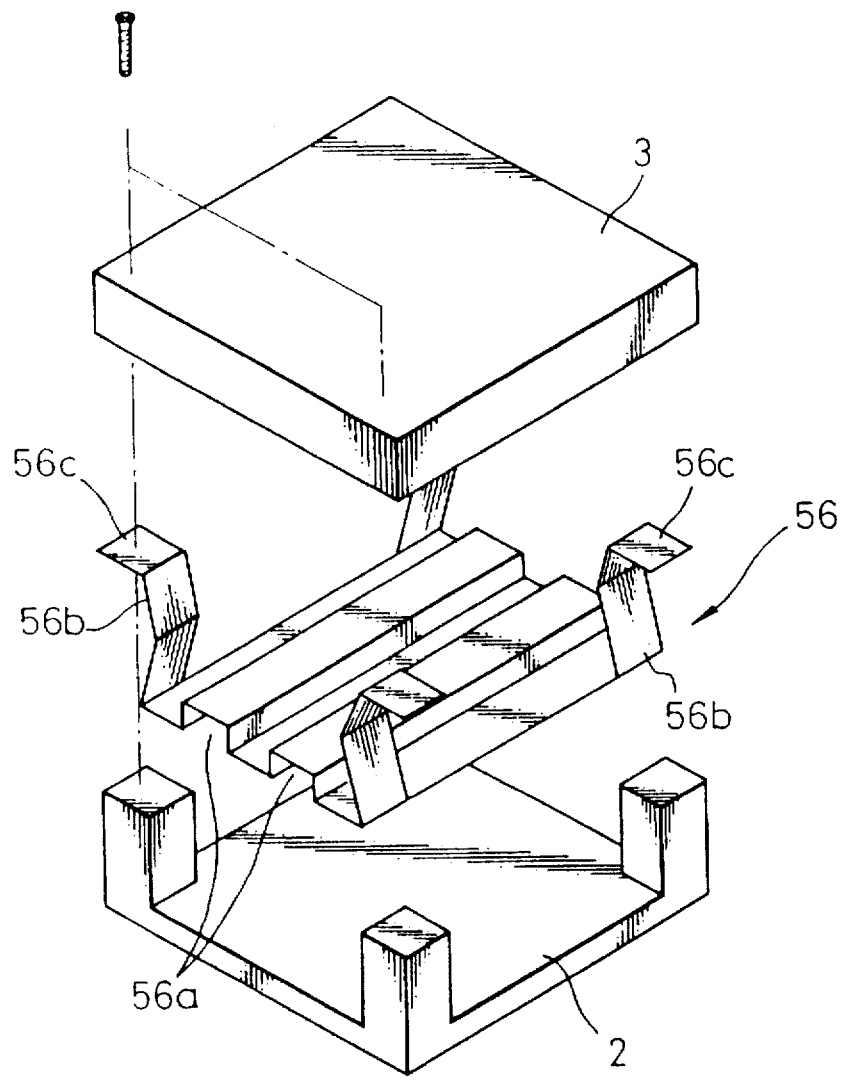
FIG. 49 is a view of an affixing fitting.

Further, to make the heat conductivity between the fixing plate 66 and the base plate 65 good, for example, as shown in FIG. 47 and FIG. 48, it is preferable to provide at the opposing faces of the fixing plate 66 and the base plate 65 irregularities of a rectangular wave or sawtooth sectional shape and to engage the same. In the case of such a construction, as shown in FIG. 47(B), it is also possible to provide a clearance 67 at the engagement portion of the irregularities and to positively introduce cooling air there from the fan unit 3. On the other hand, the method of fixing the heat pipe 55 to the heat sink 2 is not limited to the method shown in FIG. 45. For example, it is also possible to affix it through the affixing fitting 52 shown in FIG. 49.

That is, the affixing fitting 56 is formed by a material with a good heat conductivity and is provided with pipe holding grooves 56a which push the fork of the heat pipe 55 upward and affixing legs 56b formed at their top ends with bent flanges 56c.

This affixing fitting 56 is affixed to the heat sink 2 by fastening the flanges 56c together with the fan unit 3 to the heat-radiating fins 4 or specially provided support columns positioned at the four corners of the heat sink 2. In this state, the forked portion of the heat pipe 55, not shown, is sandwiched between the top surface of the heat sink 2 and the pipe holding grooves 56a. Note that in FIG. 49 an illustration of the heat-radiating fins 4 was omitted, but these are suitably provided as required.

Figure 50A:
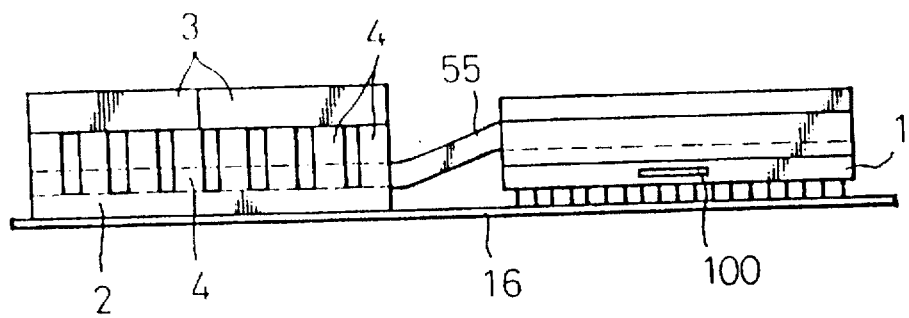
FIGS. 50(A) and 50(B) are views of a modification of FIG. 44, wherein 50(A) is a side view and 50(B) is a plan view.
Figure 50B:
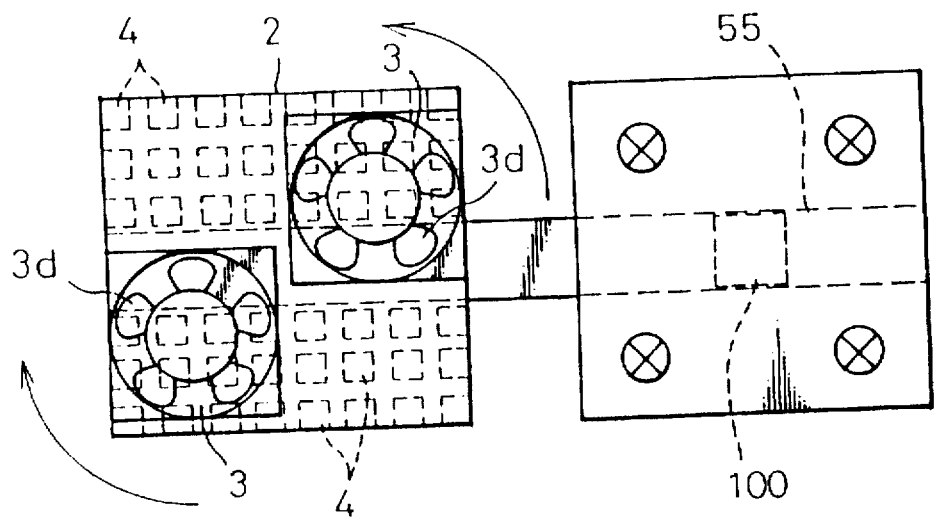

Note that in the above-mentioned embodiment, the case was shown of a single fan unit 3 placed on the heat sink 2, but it is of course also possible to provide the heat pipe at the center and provide two fan units at diagonal positions as shown in FIG. 50.

As clear from the above explanation, according to the present invention, the heat-generating element is concentratedly cooled using the fan device, so the cooling efficiency can be remarkably improved.

Figure 4B:
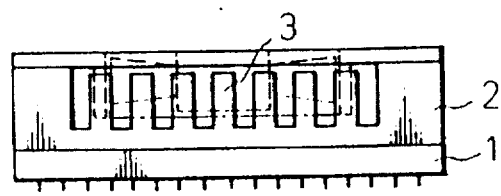
Figure 5A:
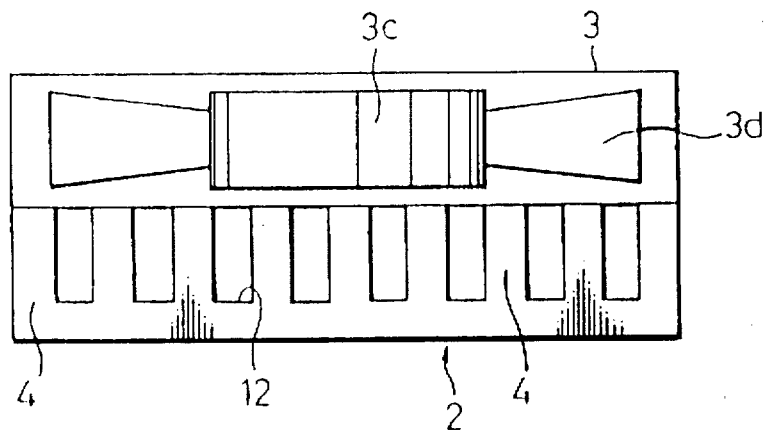
FIGS. 5(A) and 5(B) are views showing a conventional example of the type of FIG. 5(A), wherein (A) is a side view and 5(B) is a plan view of the heat sink.
Figure 5B:
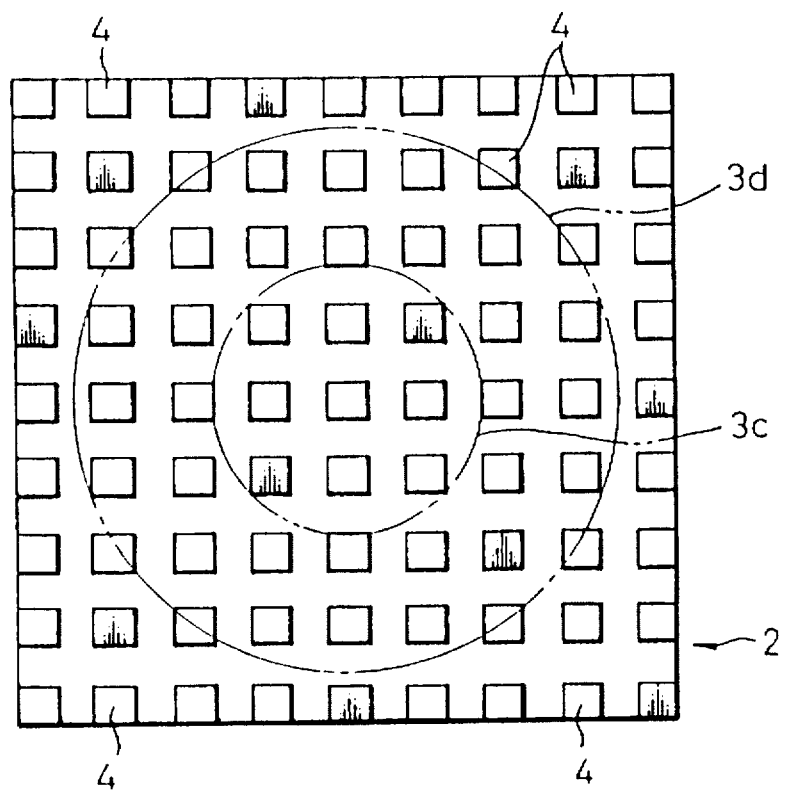
Figure 6A:
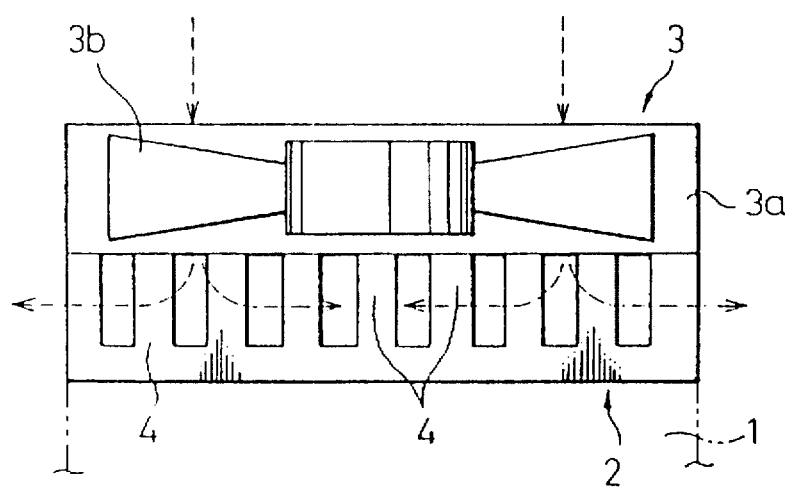
FIGS. 6(A) and 6(B) views showing a conventional example of the type of FIG. 4(B), wherein (A) is a side view and (B) is a plan view of the heat sink.
Figure 6B:
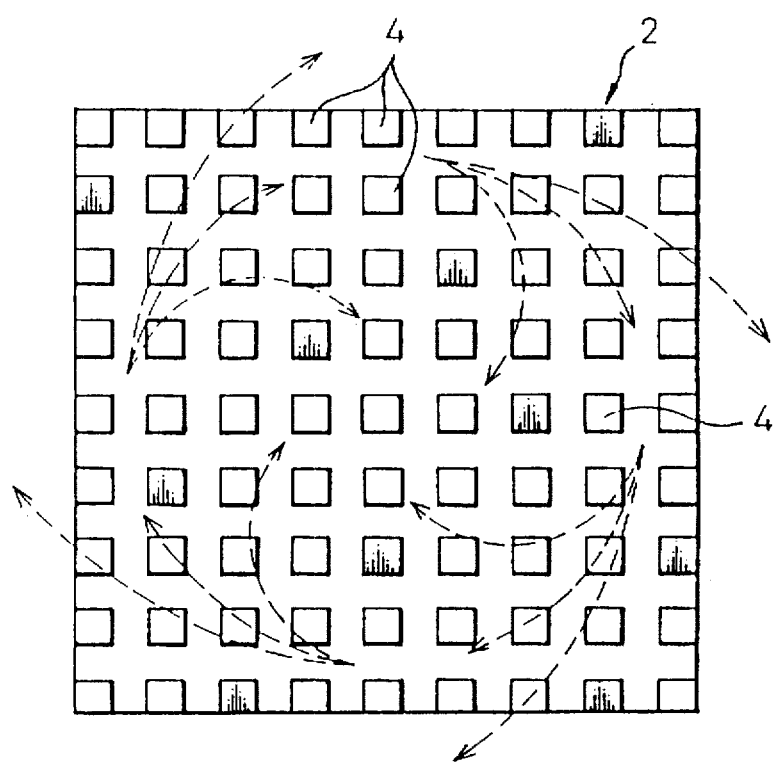

As mentioned above, in the case of an LSI package, the circuit boards in a work station and other recent high density mounting equipment are disposed at intervals of slightly over 20 mm. There are limits to how far this can be handled by a direct vertical mounting type cooling structure. For example, if the thickness of the LSI package is 5 mm, the thickness of the heat sink is 5 mm, and the thickness of the thinnest fan at present is 10 mm and if consideration is given to the projection of the IC socket, then the combined thickness of the heat sink and the cooling fan must be made about 10 mm and the overall thickness combined with the package must be about 15 mm. Therefore, consideration has been given to the buried mounting type cooling structure such as shown in FIG. 4(B).

FIG. 51 gives a top view, front view, and side view of the construction of the heat-generating element cooling device of the buried mounting type. Here, 2 shows a heat sink, 3 a fan unit, and 75 a cover. The heat-generating element 1 is omitted. FIG. 52 gives partial enlarged cross-sectional views of the center portions in the section along the section A—A in FIG. 51. As illustrated, the fan unit 3 is mounted so as to be buried in the width of the heat sink below the air intake and exhaust opening 76 formed in the cover 75 covering the heat sink 2. The heat-radiating fins 4 of the heat sink 2 are disposed around the fan unit 3. In the figure, 3c is a fan motor, 3d fan main blades, 35 a coil, 36 a magnet, 37 a fan motor bearing, and 38 circuit components and a board. Note that the cover 75 has formed at it a cylindrical member 77 connected to the air intake and exhaust opening 76. This surrounds the mounted fan unit 3 and guides the cooling air and also constitutes a throttling mechanism which throttles the cooling air by the clearance with the base surface 12 of the heat sink 2.

Figure 52A:
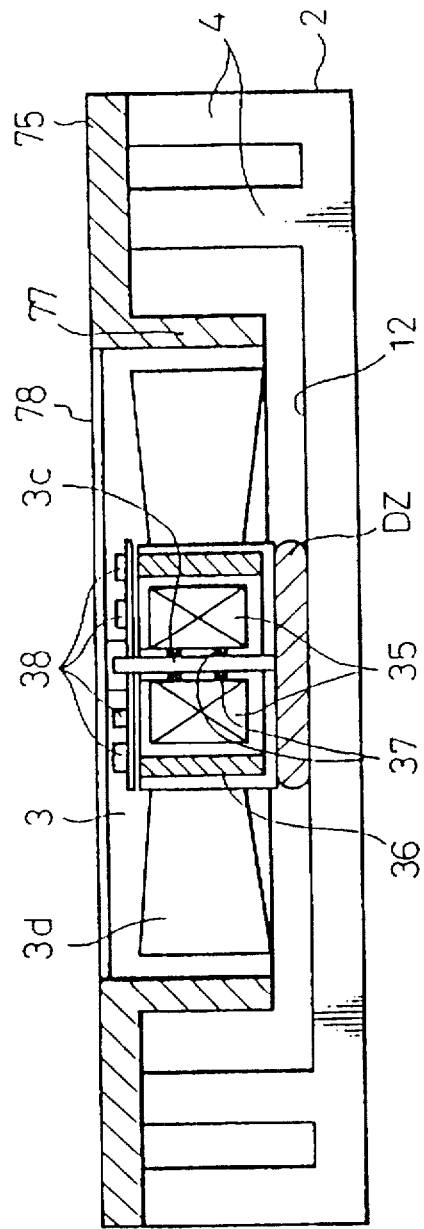
FIGS. 52(A) and 52(B) are partial enlarged cross-sectional views of the center portion in the section along the section A—A in FIG. 51.
Figure 52B:
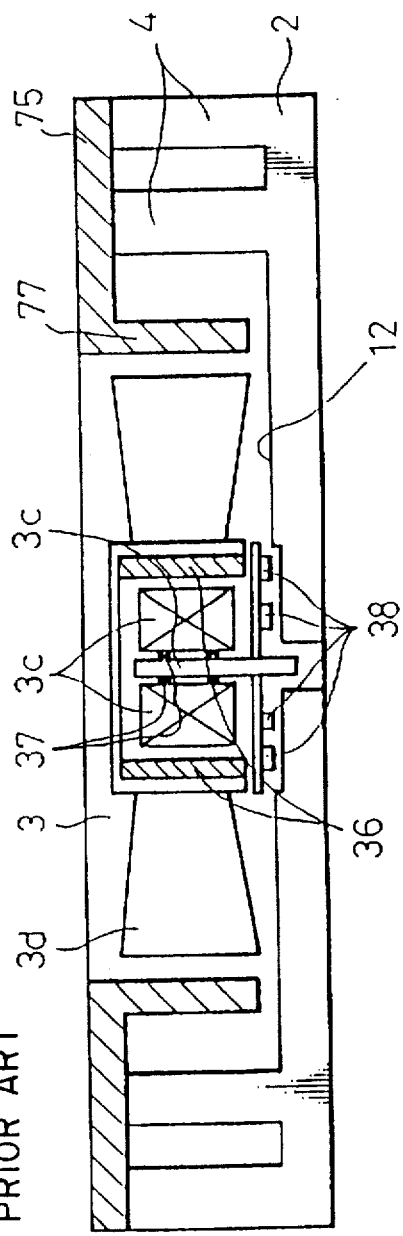

FIG. 52(A) gives a partial enlarged cross-sectional view of a buried mounting type cooling structure of the usual pull system. The cover 75 supports the fan unit 3 by supporting spokes 78, . . . . For example, as shown in FIG. 51, it is supported by supports at four corners of the heat sink 2. Below the fan motor 3c is formed the above-mentioned dead zone DZ. Further, above it, the fan motor driving circuit components and board 38 are attached to the fan motor bearing portion. FIG. 52(B) like FIG. 52(A) gives a partial enlarged cross-sectional view of a buried mounting type cooling structure. Here, the fan unit 3 is supported at the base surface 12 of the heat sink 2. Further, the circuit components and board 38 are attached below the fan motor 3c. Otherwise, the construction is similar to that of FIG. 52(A). In this way, no matter which construction is adopted, in a buried mounting type cooling structure, the fan motor driving circuit components and board 38 are mounted above or below the fan motor 3c and the thickness of the fan unit ends up being increased by that amount.

Figure 53:
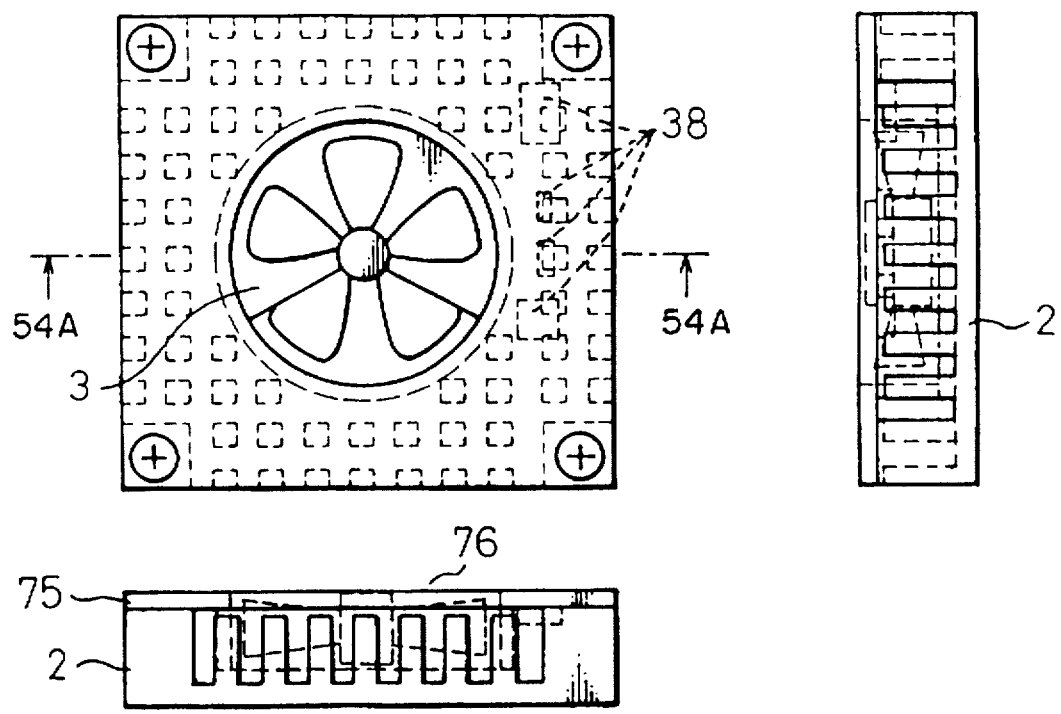
FIGS. 53 gives a top view, front view, and side view of the construction of a 18th embodiment of the heat-generating element cooling device according to the present invention.

FIG. 53 gives a top view, front view, and side view of the construction of a 18th embodiment of the heat-generating element cooling device according to the present invention, while FIG. 54 gives partial enlarged cross-sectional views of the center portion in the section along the section A—A in FIG. 53. These show two constructions: the construction (A) where the fan unit 3 is supported at the cover side and the construction (B) where it is supported at the heat sink side. As clear from these figures, in this embodiment, the fan motor driving circuit components and board 38 are mounted on the cover 75 as shown in FIG. 54(A) or are mounted on the base surface, for example, of the heat sink 2 as shown in FIG. 54(B). At this time, the Hall element 39 for driving the cooling fan is mounted separately on the cover or at a position facing the fan motor 3c on the heat sink.

According to the cooling structure of this embodiment, the fan motor 3c is made longer and smaller in diameter by the amount of space obtained by removing the circuit components and board 38 from above the fan motor 3c as shown in FIG. 54(A) showing the construction with the fan unit 3 supported on the guide 75 side or the amount of space obtained by removing the circuit components and board 38 from below the fan motor 3c as shown in FIG. 54(B) showing the construction with the fan unit 3 supported on the heat sink 2 side, so the region of the dead zone DZ shown in FIG. 52(A) can be shrunken. By this, the cooling efficiency is improved and accordingly it becomes possible to obtain an equivalent cooling capacity by a slower speed fan. The noise is lightened along with this and a contribution is made to the prolongation of the lifetime of the equipment.

FIG. 55 gives a top view, front view, and side view of the construction of a modification of the embodiment of FIG. 53 and FIG. 54. FIG. 56 gives partial enlarged cross-sectional views of the center portion along the section A—A in FIG. 55. This shows two constructions: the construction (A) where the fan unit is supported at the cover 75 side and the construction (B) where it supported at the heat sink 2 side. In this modified embodiment, the disposition of the circuit components and board 38 and the Hall element 39 is similar to the case of FIG. 53 and FIG. 54, but the thickness of the fan unit 3 is reduced by the amount of space obtained by removing the circuit components and board 38 from above the fan motor 3 as shown in FIG. 56(A) or the amount of space obtained by removing the circuit components and the board 38 from below the fan motor 3c as shown by FIG. 56(B), whereby the integral fan type heat-generating element cooling device can be made thinner in construction overall. By this, it becomes possible to use it for recent high density mounting type equipment and becomes possible to increase the range of application of the integral fan type heat-generating element cooling device.

Note that as an other modification of the present embodiment, while not shown, it is possible to mount the circuit components and the board 38 to the fan motor support spokes 78 of the cover, the casing of the fan motor 3c, or the heat-radiating fins 4 of the heat sinks Further, in the illustrated embodiment and its modifications, use was made of the pull system of cooling structure, but of course it is also possible to apply this to the case of use of the push system. Further, wiring is necessary between the circuit components and board 38 and the fan motor 3c, but if ordinary wire is used for the wiring, the air resistance will be increased, so for example the wiring may be performed by using flat, so-called flexible wiring strips and adhering them to the cover or the base surface of the heat sink.

FIG. 57 and FIG. 58 give top views and front views of the constructions of an overall device (A) and cover (B) for two examples of the heat-generating element cooling device having a cooling structure of an integrated buried mounting type cooling fan and heat sink of the heat-generating element such as shown in FIG. 4(B). In the figures, 3 shows a cooling fan unit, 2 a heat sink having a plurality of heat-radiating fins 4, . . . , 75 a cover having an air intake opening 76, and 78 fastening screws.

In the example of FIG. 57, a fan unit 3 is mounted in a buried manner in the center portion of the heat sink 2 attached to the top surface of an LSI package or other heat-generating element by for example an adhesive or affixing fitting. The fan unit 3 is accommodated in the air intake opening 76 provided at the center portion of the cover 75 and inside the cylindrical projection portion 77 connected to the same. This cylindrical projection portion 77 has a predetermined clearance with the base surface 12 of the heat sink 2 and forms a throttling mechanism. The air sucked from the air intake opening 76 by the fan unit 3 passes through the throttling mechanism and, as shown by the dotted arrow marks in FIG. 57(A), forms the air flow for cooling. The cover 75 is affixed by fastening screws 78, for example, at the four corners to the supporting blocks 79, . . . formed at the four corners of the heat sink 2.

In the example of FIG. 58, the construction is similar to that of the example of FIG. 57, but the fan unit 3 and the air intake opening 76 of the cover 75 facing it are offset from the center portion of the heat sink 2 in the direction of one corner, that is, are disposed off-centered. In a thin type cooling device for high density mounting, the heat sink 2 becomes thinner and so the heat emitted at the center portion of the heat-generating element cannot be sufficiently conducted to the surroundings, so the temperature distribution becomes one of a high temperature at the center portion and a low one at the peripheral portions, that is, an uneven heat spread results. The present construction is adopted so as to raise the cooling efficiency of the high temperature portion at the center and to avoid a reduction of the lifetime of the bearings of the fan motor due to the high temperature. Note that in this embodiment, the supporting block 79' at the corner which the fan unit 3 is in close proximity with is formed with a wide width and the air flow is directed toward the center portion.

According to the integral fan type heat-generating element cooling device of the above construction, since the fan unit 3 is buried, the intake air is discharged to the outside before sufficiently contributing to the cooling, so there is the problem that the cooling efficiency is low.

FIG. 59 gives a top view and front view of the construction of an 19th embodiment overall (A) and a cover (B) of the heat-generating element cooling device according to the present invention. Further, FIG. 60 gives structural views of the construction of just the heat sink in the embodiment of FIG. 59. This embodiment has a similar construction with the cooling structure of the conventional device shown in FIG. 57 with the fan unit 3 disposed at the center portion of the heat sink 2. Equivalent members in FIG. 59 and FIG. 60 are given the same references.

Figure 61:
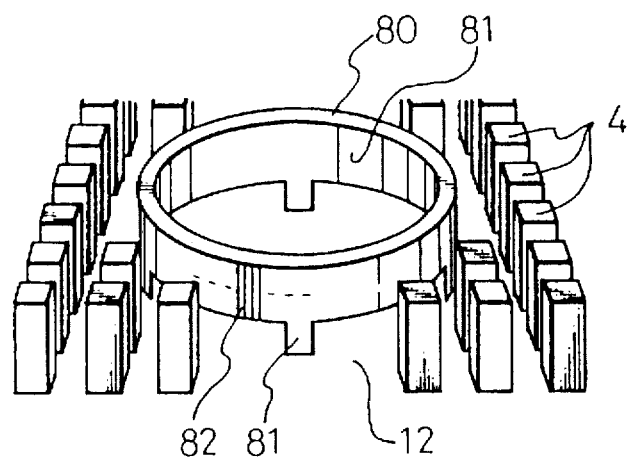
FIG. 61 is an enlarged perspective view of the construction of the throttling mechanism portion.

In this embodiment, however, the cover 75 is not provided with the cylindrical projecting portion 77 forming a throttling mechanism as shown in FIG. 57, but has a cylindrical member 80 supported by supporting legs 81, . . . provided on the base surface 12 of the heat sink 2 disposed as the throttling mechanism. FIG. 61 is an enlarged perspective view of the construction of the throttling mechanism portion on the heat sink 2. As clear from FIG. 60 and FIG. 61, a clearance is formed between the cylindrical member 80 and the base surface 12 of the heat sink 2 and the cooling air passes through this clearance.

The cylindrical member 80 and the supporting legs 81, . . . are formed by a material with a good heat conductivity and increase the surface area for radiating heat from the heat sink 2. Accordingly, these can be formed of the same material as the heat sink 2. Further, they can be formed integrally. If the cylindrical member 80 and the supporting legs 81, . . . are formed integrally in this way, then it is possible to dispose the heat-radiating fins 4, . . . in close proximity in the surroundings and raise the density of disposition. Further, as shown in FIG. 61, the outer surface of the cylindrical member 80 including the inside and outside circumferences is provided, for example, with fine grooves 82, ridges, or other irregularities. Further, the surface area for heat radiation may be increased.

This embodiment being constituted in this way, it is possible to make use of the throttling mechanism which had been attached to the cover in the conventional device so as to effectively radiate heat from the heat sink 2. Further, by having air flow at a high speed among the plurality of supporting legs supporting the throttling mechanism, the cooling efficiency can be further raised, which is helpful in improving the cooling efficiency of the cooling device as a whole. Also, the space which had been required for fitting the throttling mechanism attached to the cover into the heat sink in the conventional device mentioned earlier becomes unnecessary and so that many more heat-radiating fins can be added and therefore it is possible to contribute to the improvement of the cooling efficiency of the cooling device as a whole.

Next, as mentioned earlier, the heat sink 2 is attached on the LSI package or other heat-generating element by an adhesive or affixing fitting. If the entire surface s adhered with an adhesive, however, heat stress will occur due to the difference in the coefficient of heat expansion of the element and the heat sink 2 and there will be the danger of cracks occurring in the element. Further, if the entire surface is adhered by an adhesive sheet etc., since there is no fluidity compared with an adhesive, clearance will be caused by the difference in planarity and there will be the problem of easy peeling. In addition, if affixed by a fitting etc., sockets become necessary or the board must be processed, so there is the problem of numerous limitations in mounting.

Figure 62:
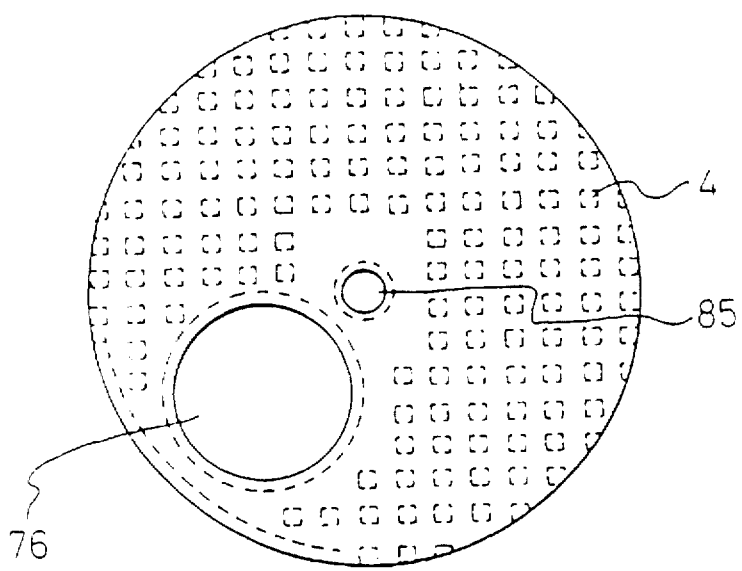
FIGS. 62 and 62(A) are a top view and front view of the construction of a 20th embodiment of the heat-generating element cooling device according to the present invention.
Figure 62A:
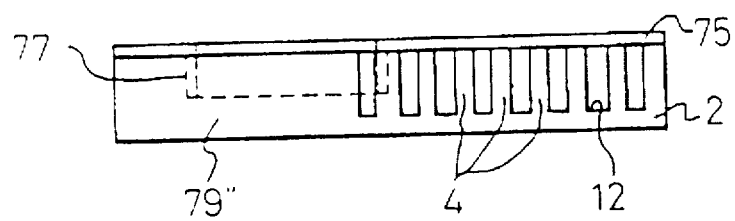

FIG. 62 gives a top view and front view of the construction of a 20th embodiment of the heat-generating element cooling device according to the present invention. This embodiment illustrates the case where the heat-generating element and the heat sink are circular, but has a similar construction as the cooling structure of an off-centered type cooling device wherein the fan unit 3 shown in FIG. 58 is disposed offset from the center portion of the heat sink 2. The same references are given to equivalent members or else the references are omitted. Note that the illustration of the fan unit 3 is omitted, but its back portion, that is, the edge of the heat sink 2 at the side where no heat-radiating fins are disposed is provided with the side wall 79" so as to prevent the escape of the cooling air. Further, the cover 75 is attached to the heat sink 2 by adhesion or another method. The attachment blocks 79 and fastening screws 78 are eliminated.

In this embodiment, near the center of the heat sink 2 is formed a female screw portion 85 in which is screwed the male screw affixed to the heat-generating element from the bottom surface. The female screw portion 85 rises from the base surface 12 of the heat sink 2 and extends into the space occupied by the heat-radiating fins 4. . . . . In this way, the female screw portion 85 is exposed to the cooling air in the inside of the heat sink 2 and functions to assist the heat radiation. Therefore, the female screw portion 85 is formed with a shape with a larger surface area so as to enable the heat radiating effect to be raised. Further, as shown in FIG. 62, the heat-radiating fins 4 around the female screw portion 85 are made intermittent to reduce the pressure loss at the time of passage of the cooling air and therefore ensure the amount of the cooling air.

Figure 63:
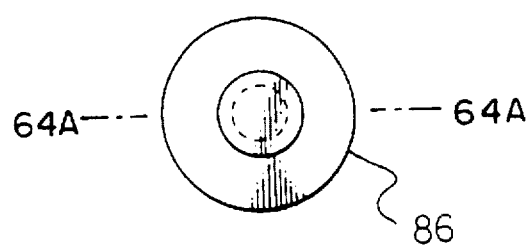
FIGS. 63 and 63(A) are a top view and front view of the construction of an example of a male screw member.
Figure 63A:
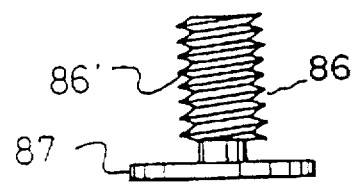

FIG. 63 gives a top view and front view of the construction of an example of a male screw member 86 disposed on the top surface of the heat-generating element. The male screw member 86 is formed by a material with a good heat conductivity. For example, it has a screw portion 86' which screws into a female screw portion 85 provided in the heat sink 2 of FIG. 62 and a flange portion 87 affixed by adhesion or another method to the top surface of the heat-generating element. By this male screw and female screw, it is possible to tightly join the heat-generating element and the heat sink 2 with the cooling fan mounted on it. Using this tightening force, it is possible to reduce the contact heat resistance between the same. Note that the male screw member 86 may also be formed integrally with the top surface of the heat-generating element.

Figure 64A:
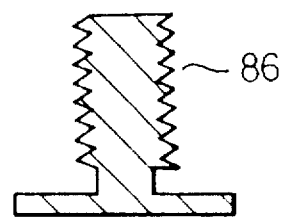
FIGS. 64(A) to 64(C) are cross-sectional views of the section A—A of FIG. 63 for showing various examples of the construction of male screw members.
Figure 64B:
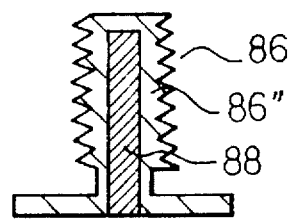
Figure 64C:
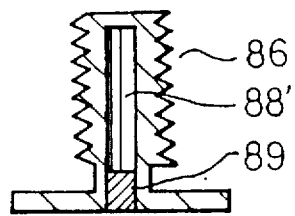

FIG. 64 gives cross-sectional views in the section A—A of FIG. 63 for showing various examples of the construction of male screw members. The male screw member 86 efficiently conducts heat emitted from the heat-generating element to the female screw portion 85. This heat is radiated in the cooling space of the heat sink 2. Therefore, the cooling of the heat-generating element is assisted. Accordingly, the construction is also good in heat conductivity. That is, the male screw member 86 may not only be formed by a single material with a good heat conductivity such as shown in FIG. 64(A), but as shown in FIG. 64(B), it may be constructed having a peripheral portion 86" formed by brass and a center portion 88 formed by pure copper. Further, as shown in FIG. 64(C), it is possible to provide a cavity 88' inside and make a vacuum state and fill a working fluid 89 serving as the heat pipe medium in the same. By this, it becomes possible to use the principle of the heat pipe to increase the amount of heat transfer.

Since this embodiment is constructed in this way, it is possible to avoid the cracking and peeling phenomena caused by the thermal stress caused at the joint between the heat-generating element and the cooling device in the conventional apparatus and further it is possible to assist the heat radiation of the heat-generating element as mentioned above and as a result raise the cooling efficiency. Further, it is possible to affix the integral fan type cooling device of the present invention by screws and thereby enable easy detachment of the cooling fan when broken and enable a higher reliability.

Figure 65:
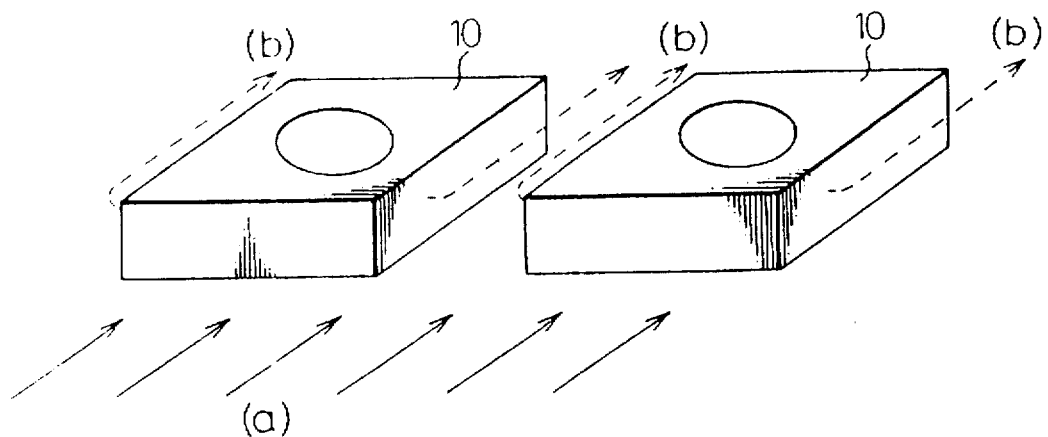
FIG. 65 is a perspective view of the mounting state in the case of mounting a plurality of conventional integrated fan type heat-generating element cooling devices of the type of FIG. 4(B) in parallel.
Figure 66:
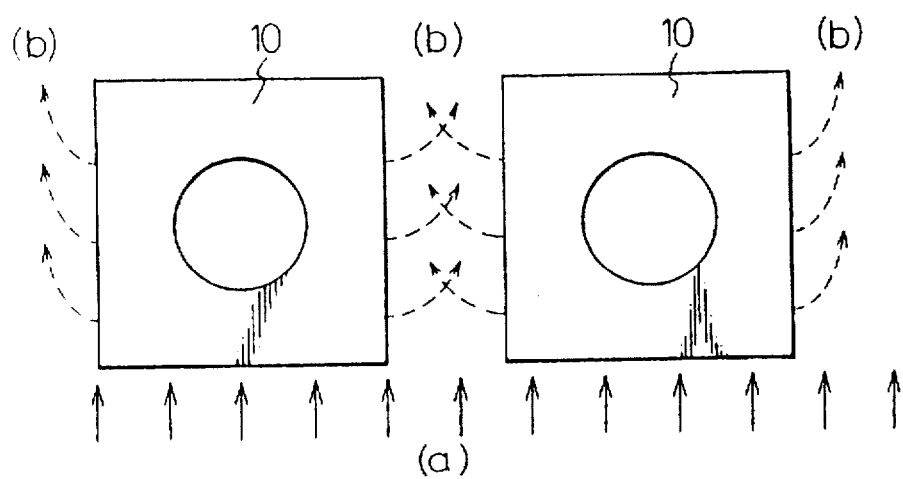
FIG. 66 is a top view of FIG. 65.

Next, FIG. 65 is a perspective view of the mounting state in the case of mounting a plurality of such integral fan type heat-generating element cooling devices in parallel, and FIG. 66 is a top view of the same. In the figure, 10, . . . are cooling devices, (a) is the cooling air flow of the equipment, and (b) is the air flow of the cooling devices. In such a mounting state, in particular when using the cooling device of the structure shown in FIG. 57, the air is exhausted in at least two directions, so as shown in FIG. 66, the exhaust collides among the parallel arranged cooling devices 10, 10 and there is the problem that the overall cooling efficiency falls. In addition, if use is made of a high speed fan unit to compensate for the fall in the cooling efficiency mentioned above, the noise becomes relatively greater and the noise level of the equipment as a whole is pushed up.

FIG. 67 gives a top view, front view, and side view of the construction of a 21st embodiment of a heat-generating element cooling device according to the present invention. The embodiment has a similar construction as the cooling structure with the fan unit 3 disposed at the center portion of the heat sink 2 as shown in FIG. 57(A). Equivalent members are given the same references or references are omitted. In the embodiment, further, the cover 75 extends outward at one side edge directly above the heat sink 2 (or the heat-generating element below it), forming an extension portion 75'. The front edge of this hangs downward. A bent portion, that is, the shielding plate 90, is formed so as to be substantially parallel with the side surface of the heat sink 2. Since this construction is adopted, as shown by the dotted arrows in FIG. 67, the air flow supplied from the fan unit 3 strikes the shielding plate 90 and is reflected downward. While not shown, the air flow ends up striking the bottom surface of the heat-generating element at the bottom of the heat sink 2.

Figure 68:
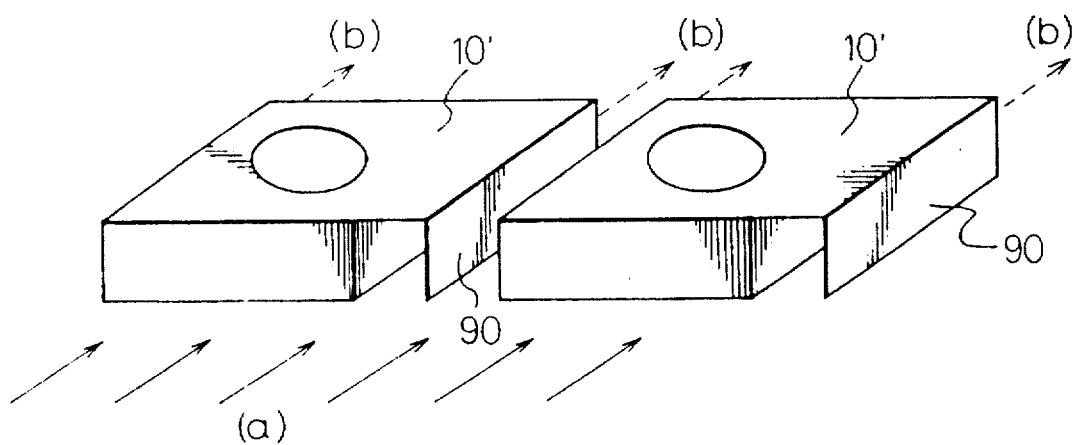
FIG. 68 is a perspective view of the mounting state in the case of mounting a plurality of the embodiments of FIG. 67 in parallel.
Figure 69:
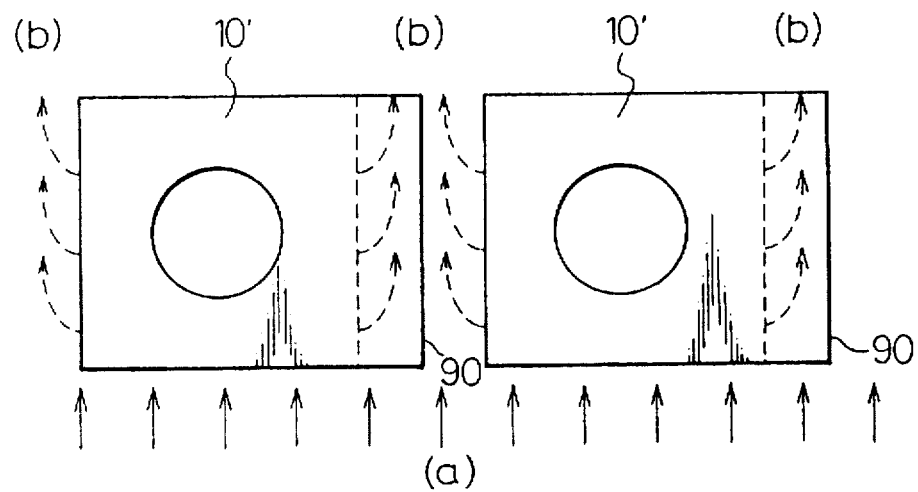
FIG. 69 is a top view of FIG. 68.

FIG. 68 is a perspective view of the mounting state in the case of mounting a plurality of the heat-generating element cooling devices according to this embodiment, and FIG. 69 is a top view of the same. In the figure, 10', . . . is a cooling device according to the embodiment, (a) is a cooling air flow for the equipment, and (b) is an air flow for the different cooling devices. The cooling devices 10' are provided so that the shielding plates 90 are parallel with the cooling air flow (a) of the equipment. As clear from FIG. 69, the shielding plates 90 are interposed between the parallel arranged cooling devices 10', . . . and therefore it is possible to avoid the interference of the air flows (b), . . . among the different cooling devices in FIG. 65 and FIG. 66. Therefore, according to this embodiment, it is possible to attain the double effect of enabling prevention of a reduction of the cooling efficiency caused by the collision of the exhausts among the cooling devices when a plurality of them are provided and enabling improvement of the cooling efficiency by introducing the exhaust to the bottom surface of the heat-generating element.

Note that as mentioned above, by providing the shielding plate 90 so as to be parallel with the cooling air flow (a) for the equipment, it is possible to make the cooling air flow (a) for the equipment, pass in the heat sink even when the cooling fan of the cooling device stops. Further, while not illustrated, it is possible to form at least the bending portion of the shielding plate 90, that is, at least the connection portion of the extension portion 75' and the shielding plate 90 by a shape memory alloy or another shape memory material and to store a shape such as the same flat surface as the extension portion 75', that is, a substantially flat plate, for high temperatures. By doing this, for example, when the cooling fan of one cooling device stops, it is possible to open the shielding plate 90 when the heat-generating element where this is mounted becomes high in temperature so as to suck in the air flow (b) of the adjoining cooling device.

Figure 1:
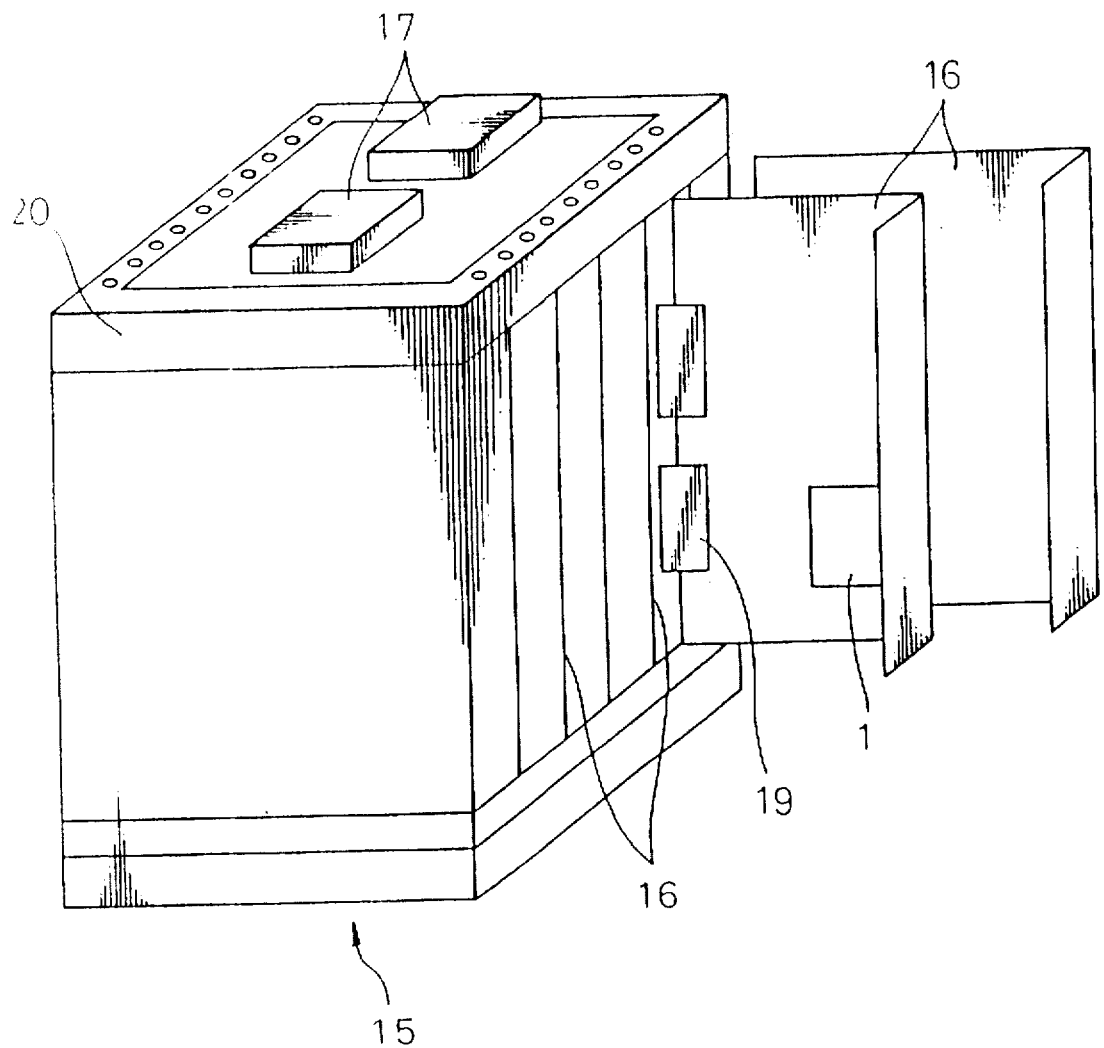
FIG. 1 is a view of a conventional example of the case of cooling a printed circuit board.
Figure 2:
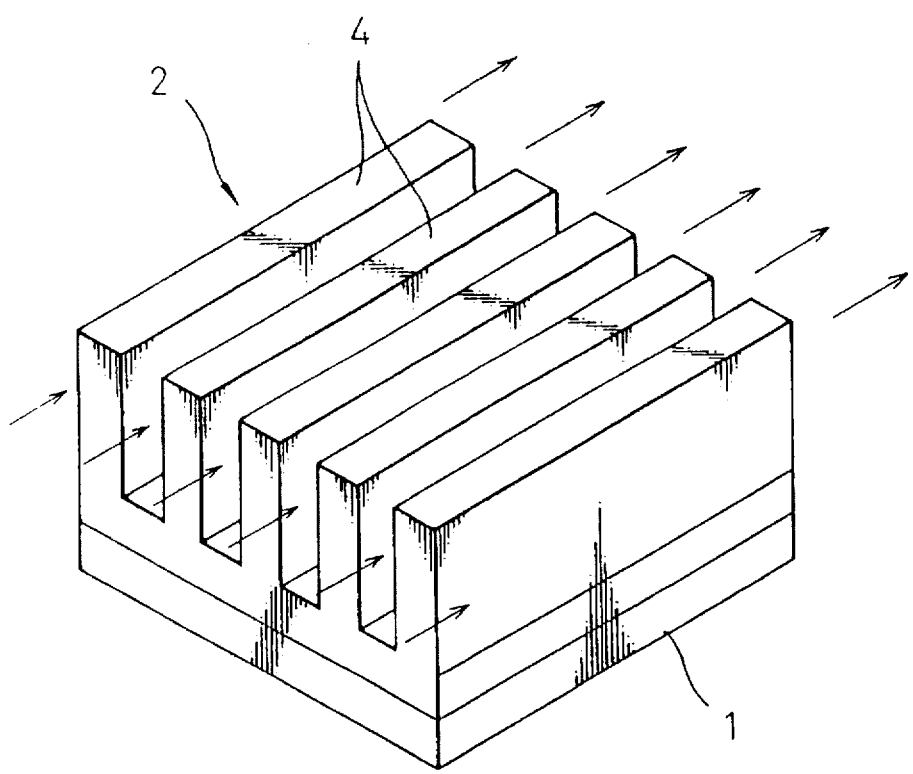
FIG. 2 is a view of the problems in the conventional cooling construction.
Figure 3:
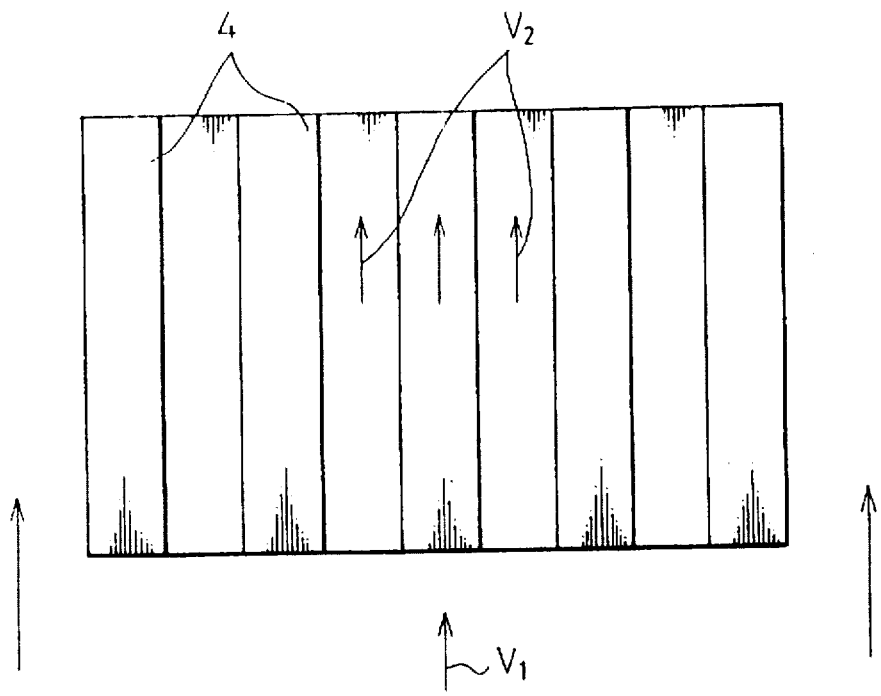
FIG. 3 is a view explaining the action of the conventional heat sink.

Next, in the case of an LSI package mounted in a piece of recent high density mounting equipment as mentioned earlier, for example, higher density mounting is becoming necessary as in the case of shelves with fixed pitches as shown in FIG. 1, height restrictions such as with notebook personal computers, etc. There are cases where mounting in the equipment is not possible depending on a cooling structure of the direct vertical mounting type or a cooling structure of the buried mounting type. An even thinner cooling structure is sought.

Figure 70A:
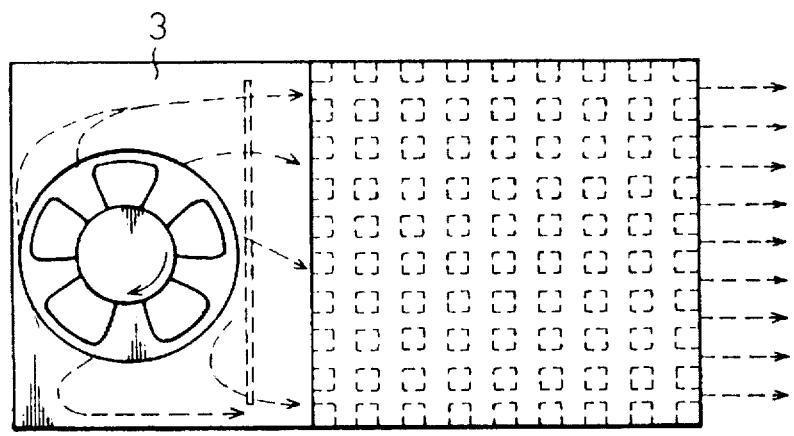
FIGS. 70(A) and 70(B) are a top view (A) and a front cross-sectional view (B) of the construction of a 22nd embodiment of the heat-generating element cooling device according to the present invention.
Figure 70B:
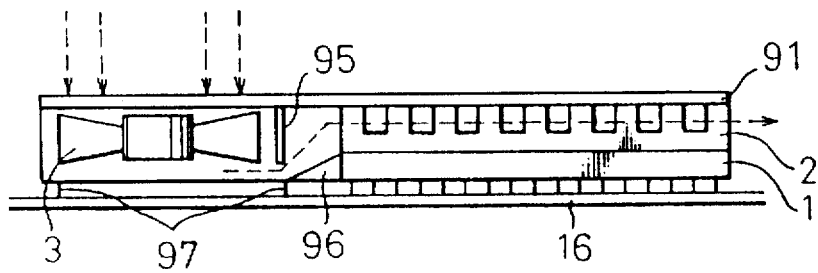
Figure 71:
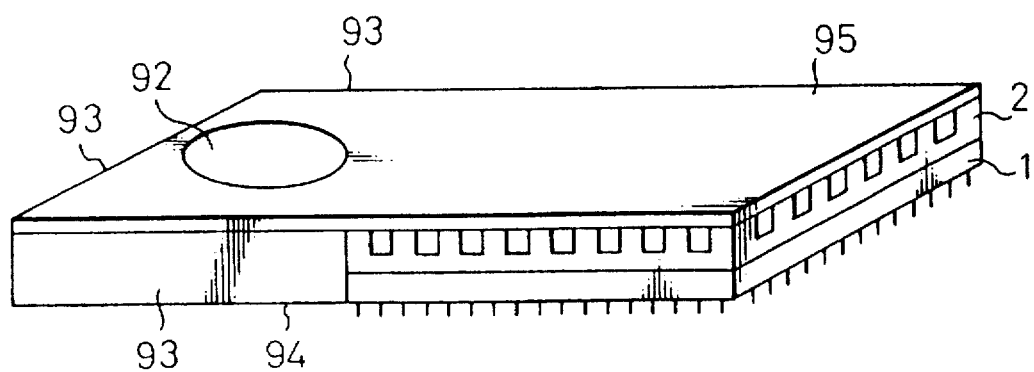
FIG. 71 is a perspective view of the construction of the embodiment of FIG. 70.

FIG. 70 gives a top view (A) and a front cross-sectional view (B) of the construction of a 22nd embodiment of the heat-generating element cooling device according to the present invention, devised to meet such requirements, and FIG. 71 is a perspective view of the same. This embodiment provides an integral fan type heat-generating element cooling device of the side mounting type wherein the fan unit 3 is disposed at the side of an assembly of the heat-generating element 1 and the heat sink 2 and these are connected by a cover 91 prepared by a material with a good heat conductivity.

In the embodiment, the cover 91 of the material with the good heat conductivity has a portion formed integrally with the heat sink 2 or affixed to it by screws etc. and covering the heat sink 2 and has an extension portion extending from the same and joined with the fan unit 3 by screws or fitting and having an air intake and exhaust opening 92 attached facing the fan unit 3. The three outside surface portions of the extension portion are closed by the side plates 93, . . . . Further, the bottom of the fan unit 3 is closed by the bottom plate 94. Note that 95 is a spoiler plate, 96 a guide, 16 a board to which the LSI package or other heat-generating element 1 is attached, and 97 a power supply pin to the fan unit 3. The fan unit 3 may be affixed to the board 16 by a plurality of pins including this power supply pin 97.

Since the embodiment is constituted in the above way, the cooling air is supplied by the push system. In the air flow shown by the dotted arrows in FIG. 70, air is sucked in from the air intake opening 92 of the top surface of the cover 91, is guided by a suitable spoiler plate 95 or guide 96 such as illustrated, is sent to the heat sink 2, and is exhausted from the end portion on the side opposite to the fan unit 3.

Figure 72:
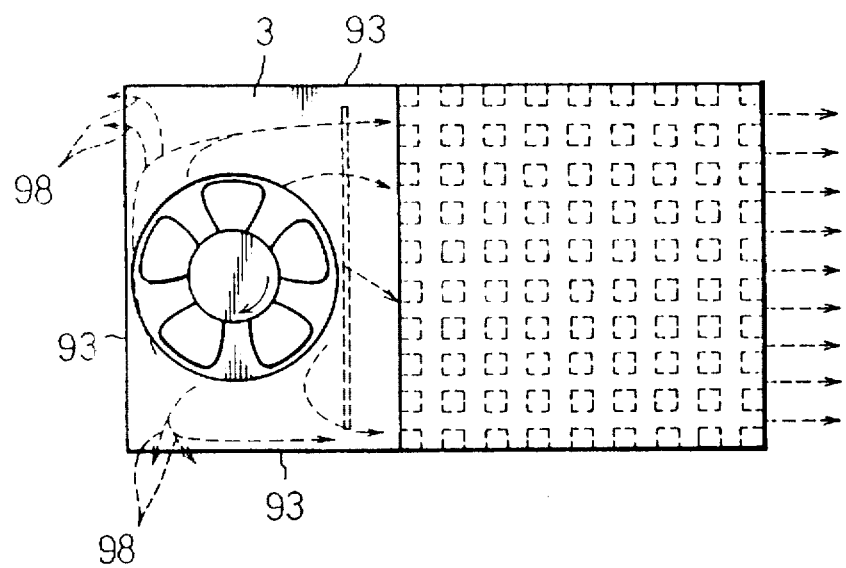
FIG. 72 is a top view of the construction of a first modified embodiment of the embodiment shown in FIG. 70.
Figure 73:
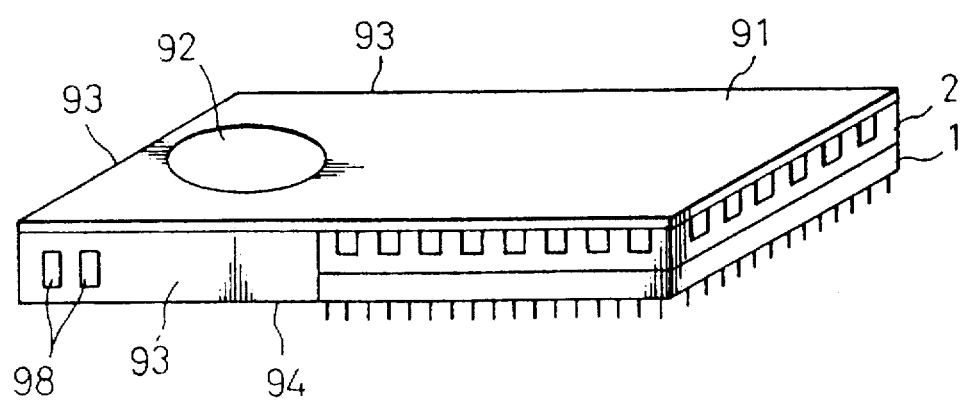
FIG. 73 is a perspective view of the construction of the first modified embodiment of FIG. 72.

FIG. 72 is a top view of the construction of a first modified embodiment of the embodiment, and FIG. 73 is a perspective view of the same. This first modified embodiment has a similar construction as the integral fan type heat-generating element cooling device of the side mounting type shown in FIG. 70 and FIG. 71. Constituent elements which are equivalent are given the same references. Further, in the modified embodiment, one or more side plates 93 of the fan unit portion are provided with openings 98, . . . as illustrated for example. The openings 98, . . . are provided at the back side of the fan unit 3, that is, the side furthest from the heat sink 2. By allowing part of the air to escape, a rise in the air pressure at the back of the closed fan unit 3 is avoided, pressure loss of the fan is reduced, and the load is lightened, resulting in making it possible for a sufficient amount of air to be secured.

Figure 74:
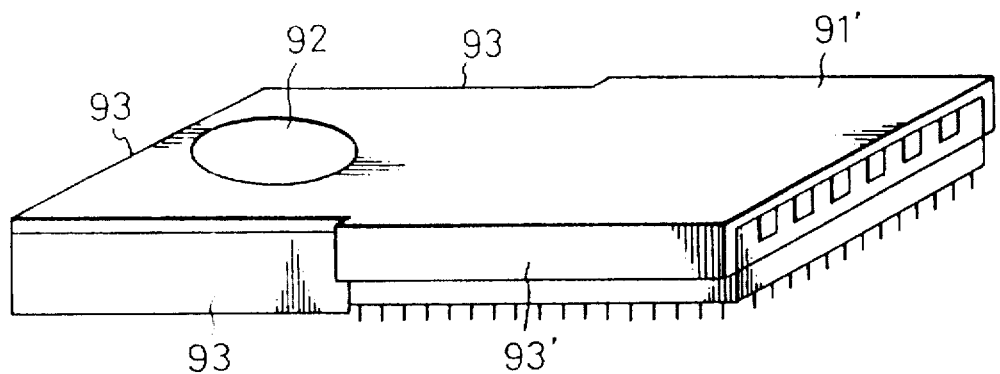
FIG. 74 is a perspective view of the construction of a second modified embodiment of the embodiment shown in FIG. 70.

Also, in this embodiment, the cover 91 may be made to cover only the top surface of the heat sink 2. Further, it may be made to close also the side surface of the heat sink 2 except for the side portion of the air intake and exhaust opening. FIG. 74 is a perspective view of the construction of a second modified embodiment of the embodiment. The two side plates 93', 93' of the cover 91' are used to close the two side surfaces of the heat sink except for the end portion on the opposite side of the fan unit 3.

Figure 75A:
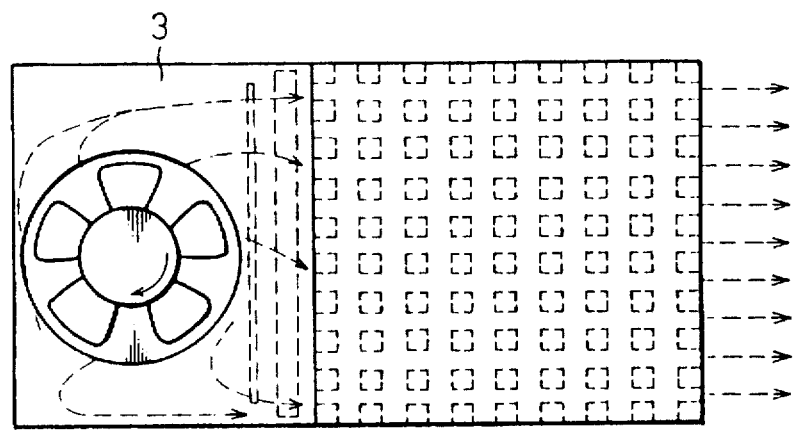
FIGS. 75(A) and 75(B) are a top view (A) and a front cross-sectional view (B) of the construction of a third modified embodiment of the embodiment shown in FIG. 70.
Figure 75B:
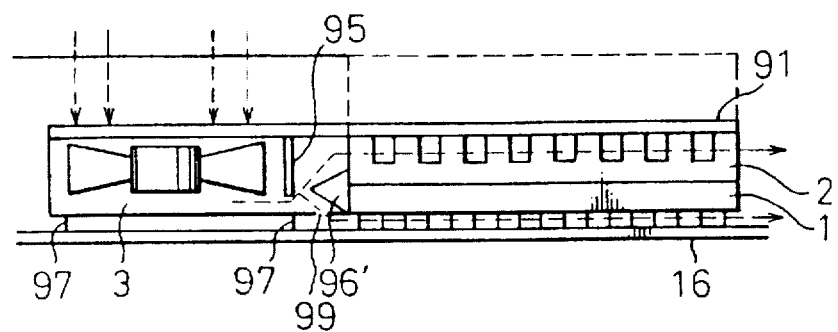

Further, in the case of the embodiment shown in FIG. 70, as the LSI package of the heat-generating element 1, use is made of a cavity up type with a semiconductor chip attached to the top surface of the element, but in the case of a cavity down type of element where the semiconductor chip is attached to the bottom surface of the element, if the cooling air is made to flow to the pin side with the short conduction path from the chip, it is possible to raise the cooling efficiency over the case of making the cooling air flow to only the heat sink 2 side provided at the cap of the element 1. FIG. 75 gives a top view (A) and a front sectional view (B) of the construction of a third modified embodiment of the embodiment. In the third modified embodiment, provision is made of a wedge-section shaped guide 96' so as to enable the air flow to be branched to the top and bottom and provision is made of air holes 99 at the bottom plate 94 of the fan unit portion. By this, an air flow is formed as shown by the dotted arrows in the figure, and cooling air is sent to the pin side of the heat-generating element 1, so the cooling efficiency is raised.

Figure 76A:
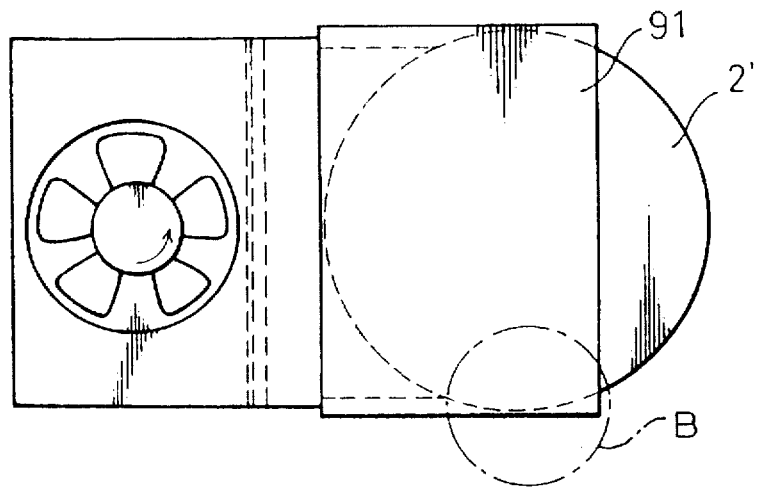
FIGS. 76(A) and 76(B) are a top view (A) and a front cross-sectional view (B) of the construction of a fourth modified embodiment of the embodiment shown in FIG. 70.
Figure 76B:
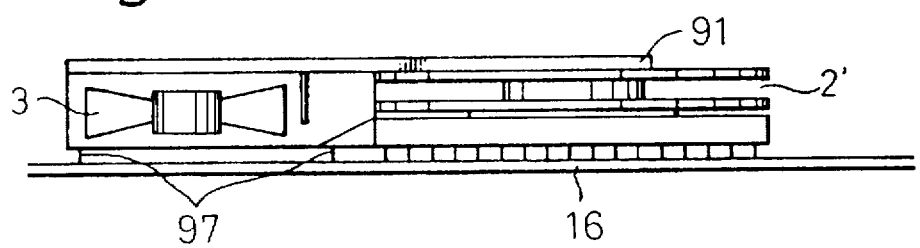
Figure 77:
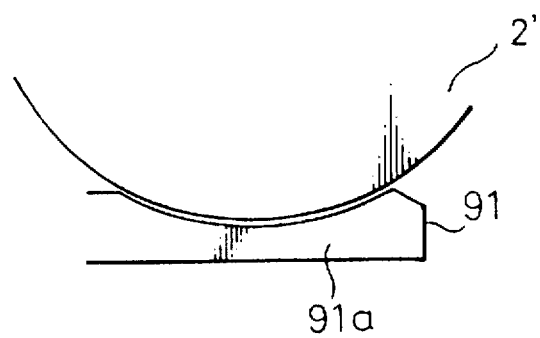
FIG. 77 is a partially enlarged view of the B portion of FIG. 76.

FIG. 76 gives a top view (A) and a front sectional view (B) of the construction of a fourth modified embodiment of the embodiment. Here, as the heat sink, instead of the rectangular one such as shown in FIG. 70 to FIG. 75, use is made of a disk shaped heat sink 2' having stacked type heat-radiating fins. The cover 91 is affixed by fitting to the two sides of the disk-shaped heat sink 2'. For example, as shown in FIG. 77 showing the portion B of FIG. 76 enlarged, by providing a plurality of downward facing hooks 91a at the two side portions of the edges of the cover 91 and pushing in the cover 91 from above to engage with the edges of the heat sink 2', it becomes possible to releasably attach the same. This makes it easy to detach the cover 91 and perform maintenance and inspection of the fan unit 3.

Figure 78A:
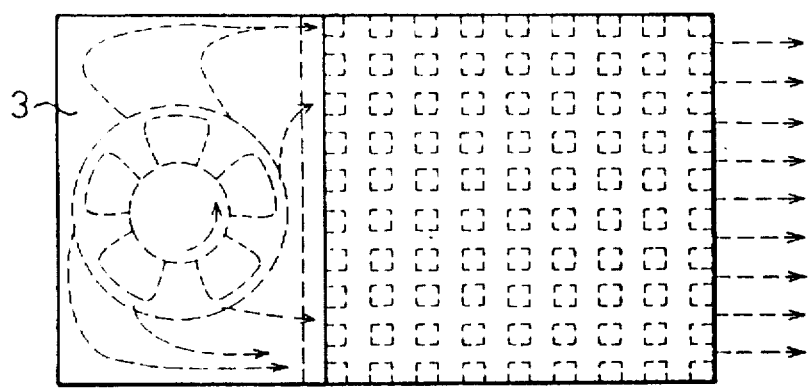
FIGS. 78(A) and 78(B) are a top view (A) and a front cross-sectional view (B) of the construction of a fifth modified embodiment of the embodiment shown in FIG. 70.
Figure 78B:
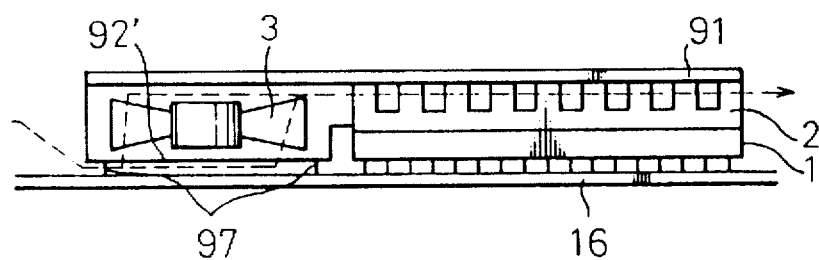
Figure 79:
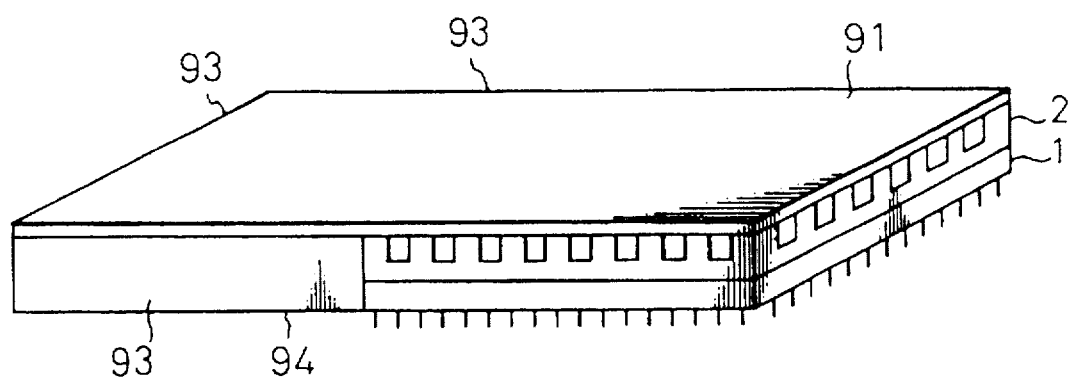
FIG. 79 is a perspective view of the modified embodiment of FIG. 78.

FIG. 78 gives a top view (A) and a front cross-sectional view (B) of the construction of a fifth modified embodiment of the embodiment and FIG. 79 is a perspective view of the same. In this modified embodiment, instead of sucking in the air from the air intake opening of the top surface of the cover shown in FIG. 70 to FIG. 77, provision is made of an air intake and exhaust opening 92' at the bottom plate 94 of the fan unit portion so as to guide air from the clearance between the fan unit and the board 16 and suck it in from the air intake and exhaust opening 92'. In this case, the air is taken in from below the fan, so the spoiler plate (95) becomes unnecessary. In this way, an air flow is caused as shown by the dotted arrow marks in FIG. 78. In this case, the pressure loss in the air intake opening becomes higher compared with that shown in FIG. 70 to FIG. 77, but the flow in the fan unit 3 becomes smoother.

In the embodiment shown in FIG. 70 to FIG. 79, the rotational shaft of the cooling fan in the fan unit 3 may be provided inclined so as to efficiently form the air flow heading from the air intake and exhaust opening through the cooling fan to the heat-radiating fins of the heat sink 2. That is, when the air intake and exhaust opening shown in FIG. 70 to FIG. 77 is provided in the top surface of the fan unit 3, the rotational shaft of the cooling fan is inclined leftward toward the plane of the drawing. Further, when the air intake and exhaust opening shown in FIG. 78 and FIG. 79 is provided in the bottom surface of the fan unit 3, the rotational shaft of the cooling fan is inclined rightward toward the surface of the drawing. By this, it is possible to efficiently form an air flow from the air intake and exhaust opening to the heat-radiating fins of the heat sink 2.

Figure 80:
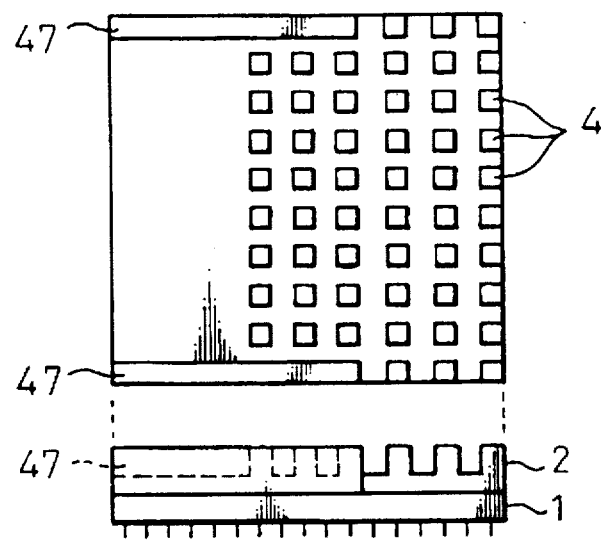
FIG. 80 to FIG. 82 give top views and front views of examples of the arrangement and shape of heat-radiating fins of the heat sink in the embodiment shown in FIG. 70.
Figure 81:
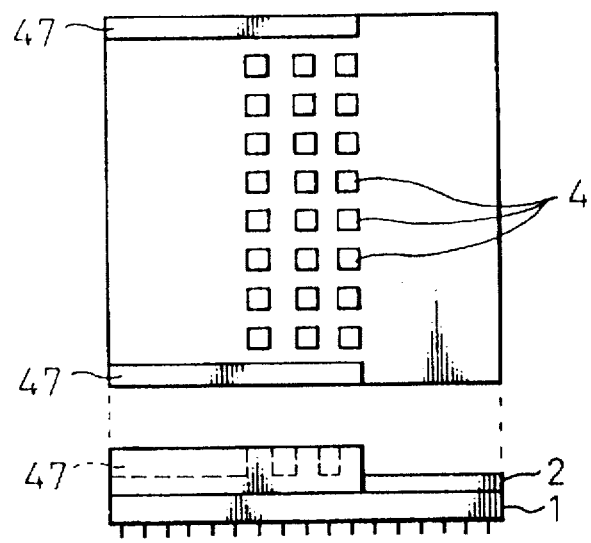
Figure 82:
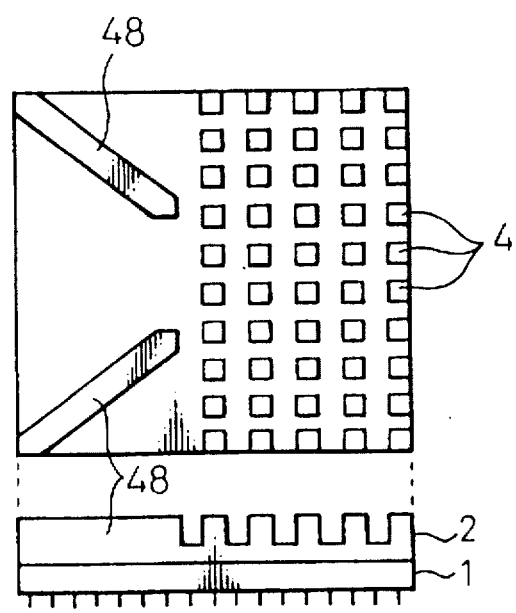

FIG. 80 to FIG. 82 give top views and front views of examples of the arrangement and shape of heat-radiating fins 4, ... of the heat sink 2 used in the present embodiment. As illustrated here, the area in which the heat-radiating fins 4 are disposed is just the portion directly above the heat generating portion of the element 1, not the entire region of the heat sink 2, so it is possible to reduce the pressure loss by the heat sink and secure the necessary air speed. Also, it is possible to provide guide walls 47, 47 at the two sides of the heat sink 2 (FIG. 80 and FIG. 81), provide guide walls 48, 48 guiding to the heat generating portion of the element 1 (FIG. 82), or preventing the cooling air from passing through portions where the heat-radiating fins are not disposed and from being exhausted to the sides and guiding the cooling air effectively to the heat-radiating fins 4, ... disposed locally so as to improve the cooling efficiency.

In the explanation of the embodiment given above, use was made of pin-type or stacked type heat-radiating fins of the heat sink, but the side mounted type cooling construction such as in this embodiment is not limited to these. Use may effectively be made of various shapes including for example the plate shape. Further, as the cooling system, a push system is adopted where the air ejected from the fan is blown against the heat sink, but use may also be made of the pull system where the air passing over the heat sink is sucked in.

INDUSTRIAL APPLICABILITY

As explained above, according to the heat radiator of the present invention, it is possible to make effective use of the cooling air of a cooling fan with limited power, so it is possible to raise the cooling efficiency. On top of this, there is no need for using a high powered cooling fan, so it is possible to prevent the generation of noise.

Further, according to the integral fan type heat-generating element cooling device according to the present invention, the advantages of the direct vertical mounting type where the fan unit is mounted above the heat sink, the buried mounting type where the fan unit is buried in the center portion of the heat sink, and the side mounting type where the fan unit is disposed at the side of the assembly of the heat-generating element and the heat sink are made effective use of to improve the cooling efficiency and make the construction thinner. For example, it therefore becomes possible to meet the recent demands for high density mounting equipment such as personal computers, work stations, etc.

We claim:

1. A heat-generating element cooling device comprising a heat sink disposed on a top surface of a heat-generating element and having a body, a base, a top surface and a plurality of heat-radiating fins disposed on a surface of said base except at least at a fan mounting portion, a cover having an air intake and exhaust opening facing the fan mounting portion of said heat sink and attached so as to cover the top surface of said heat sink, a cooling fan unit having fan blades and being mounted so as to be positioned beneath the air intake and exhaust opening of said cover and embedded within the body of said heat sink, and circuit components for driving the fan unit separate from the fan unit and attached to at least one of an inner surface of said cover and an inner surface of said heat sink thereby reducing the thickness of the fan unit to ensure an air gap between the fan blades and the base and to improve cooling efficiency.

2. A heat-generating element cooling device as set forth in claim 1, wherein flat wiring strips are attached to at least one of the inner surface of the cover and the inner surface of the heat sink for electrically connecting the circuit components for driving the fan unit thereby further reducing the air gap between the cover and the heat sink.

* * * * *

UNITED STATES PATENT AND TRADEMARK OFFICE
CERTIFICATE OF CORRECTION

PATENT NO. : 5,760,333
DATED : June 2, 1998
INVENTOR(S) : Kitahara et al.

It is certified that error appears in the above-identified patent and that said Letters Patent is hereby corrected as shown below:

Foreign Application Priority Data

| | | |
|---|---|---|
| April 28, 1993 | [JP] | 5-103248 |
| July 8, 1993 | [JP] | 5-169127 |
| July 8, 1993 | [JP] | 5-169154 |
| August 6, 1993 | [PCT] | JP93/01111 |

Signed and Sealed this

Twenty-third Day of April, 2002

JAMES E. ROGAN
Director of the United States Patent and Trademark Office

Attest:

Attesting Officer